United States Patent
Nakagawa et al.

(10) Patent No.: US 10,686,080 B2
(45) Date of Patent: *Jun. 16, 2020

(54) SEMICONDUCTOR DEVICE, DISPLAY SYSTEM, AND ELECTRONIC DEVICE

(71) Applicant: Semiconductor Energy Laboratory Co., Ltd., Atsugi-shi, Kanagawa-ken (JP)

(72) Inventors: Takashi Nakagawa, Sagamihara (JP); Yoshiyuki Kurokawa, Sagamihara (JP); Munehiro Kozuma, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/375,135

(22) Filed: Apr. 4, 2019

(65) Prior Publication Data

US 2019/0229216 A1    Jul. 25, 2019

Related U.S. Application Data

(63) Continuation of application No. 15/697,896, filed on Sep. 7, 2017, now Pat. No. 10,263,119.

(30) Foreign Application Priority Data

Sep. 23, 2016  (JP) .................................. 2016-185876
Nov. 17, 2016  (JP) .................................. 2016-223708

(51) Int. Cl.
*H01L 29/786*     (2006.01)
*H01L 27/12*      (2006.01)
(Continued)

(52) U.S. Cl.
CPC ...... *H01L 29/7869* (2013.01); *H01L 27/1207* (2013.01); *H01L 27/1225* (2013.01);
(Continued)

(58) Field of Classification Search
CPC . H01L 29/7869; H01L 27/1207; H01L 27/28; H01L 29/16; H01L 29/24; H03K 19/0013; H03K 19/17708; H03K 19/17744
(Continued)

(56) References Cited

U.S. PATENT DOCUMENTS 7,266,020 B1 * 9/2007 Trimberger ........... G06F 11/187
                                            365/189.02
7,859,292 B1 * 12/2010 Shuler, Jr. .......... H03K 19/0033
                                            326/11
(Continued)

*Primary Examiner* — Dylan C White
(74) *Attorney, Agent, or Firm* — Robinson Intellectual Property Law Office; Eric J. Robinson

(57) ABSTRACT

A novel semiconductor device is provided. The semiconductor device includes a programmable logic device including a programmable logic element, a control circuit, and a detection circuit. The programmable logic device includes a plurality of contexts. The control circuit is configured to control selection of the contexts. The detection circuit is configured to output a signal corresponding to the amount of radiation. The control circuit is configured to switch between a first mode and a second mode in accordance with the signal corresponding to the amount of radiation. The first mode is a mode in which the programmable logic device performs processing by a multi-context method, and the second mode is a mode in which the programmable logic device performs processing using a majority signal of signals output from the logic element multiplexed by the plurality of contexts.

10 Claims, 37 Drawing Sheets

(51) Int. Cl.

| | |
|---|---|
| *H01L 27/28* | (2006.01) |
| *H01L 29/16* | (2006.01) |
| *H01L 29/24* | (2006.01) |
| *H03K 19/00* | (2006.01) |
| *H03K 19/17704* | (2020.01) |
| *H03K 19/17736* | (2020.01) |

(52) U.S. Cl.
CPC .............. *H01L 27/28* (2013.01); *H01L 29/16* (2013.01); *H01L 29/24* (2013.01); *H01L 29/78648* (2013.01); *H03K 19/0013* (2013.01); *H03K 19/17708* (2013.01); *H03K 19/17744* (2013.01)

(58) Field of Classification Search
USPC .......................................................... 326/44
See application file for complete search history.

(56) References Cited

U.S. PATENT DOCUMENTS

| | | |
|---|---|---|
| 10,263,119 B2 * | 4/2019 | Nakagawa ............... H01L 27/28 |
| 2011/0131346 A1 | 6/2011 | Noeldner et al. |
| 2013/0162293 A1 | 6/2013 | Lilja |
| 2014/0159771 A1 | 6/2014 | Ikeda et al. |
| 2014/0368235 A1 * | 12/2014 | Aoki ................ H03K 19/01858 326/38 |
| 2015/0228324 A1 | 8/2015 | Aoki et al. |
| 2016/0164564 A1 | 6/2016 | Xiao et al. |
| 2016/0232956 A1 | 8/2016 | Ishizu et al. |
| 2017/0288670 A1 | 10/2017 | Kozuma et al. |

* cited by examiner

SEMICONDUCTOR DEVICE, DISPLAY SYSTEM, AND ELECTRONIC DEVICE

BACKGROUND OF THE INVENTION

1. Field of the Invention

One embodiment of the present invention relates to a semiconductor device, a display system, and an electronic device.

Note that one embodiment of the present invention is not limited to the above technical field. Examples of the technical field of one embodiment of the present invention disclosed in this specification and the like include a semiconductor device, a display device, a light-emitting device, a power storage device, a memory device, a display system, an electronic device, a lighting device, an input device, an input/output device, a driving method thereof, and a manufacturing method thereof.

The "semiconductor device" in this specification and the like means all devices that can operate by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device may include a semiconductor device.

2. Description of the Related Art

As a device whose circuit configuration can be arbitrarily changed by a user, a programmable logic device (PLD) is widely known. PLDs are classified by circuit scale into a simple programmable logic device (SPLD), a complex programmable logic device (CPLD), a field programmable gate array (FPGA), and the like.

Patent Document 1 discloses an FPGA in which a configuration memory includes a transistor that includes an oxide semiconductor.

REFERENCE

Patent Document

[Patent Document 1] United States Patent Application Publication No. 2014/0159771

SUMMARY OF THE INVENTION

An object of one embodiment of the present invention is to provide a novel semiconductor device. Another object of one embodiment of the present invention is to provide a highly reliable semiconductor device. Another object of one embodiment of the present invention is to provide a semiconductor device capable of high-speed operation. Another object of one embodiment of the present invention is to provide a semiconductor device with low power consumption. Another object of one embodiment of the present invention is to provide a semiconductor device with a small area.

Note that one embodiment of the present invention does not necessarily achieve all the objects listed above and only needs to achieve at least one of the objects. The description of the above objects does not preclude the existence of other objects. Other objects will be apparent from and can be derived from the description of the specification, the drawings, the claims, and the like.

A semiconductor device of one embodiment of the present invention includes a programmable logic device including a programmable logic element, a control circuit, and a detection circuit. The programmable logic device includes a plurality of contexts. The detection circuit includes a memory device and an inspection circuit. The memory device includes a memory cell configured to store multi-level data. The control circuit is configured to control selection of the contexts. The detection circuit is configured to output a signal corresponding to the amount of radiation. The control circuit is configured to switch between a first mode and a second mode in accordance with the signal corresponding to the amount of radiation. The first mode is a mode in which the programmable logic device performs processing by a multi-context method, and the second mode is a mode in which the programmable logic device performs processing using a majority signal of signals output from the logic element multiplexed by the plurality of contexts. The inspection circuit is configured to generate the signal corresponding to the amount of radiation in accordance with whether there is a variation in the multi-level data stored in the memory cell.

In the semiconductor device of one embodiment of the present invention, each of the plurality of contexts may form the same circuit, so that the multiplexing is achieved.

In the semiconductor device of one embodiment of the present invention, the logic element may include a memory circuit, the memory device may include a memory cell. The memory circuit and the memory cell may each include a transistor and a capacitor. One of a source and a drain of the transistor may be electrically connected to the capacitor. The transistor may include a metal oxide in a channel formation region.

A display system of one embodiment of the present invention includes a control portion including the above-described semiconductor device and a display portion including a first display unit and a second display unit. The control portion is configured to generate an image signal by using the semiconductor device. The display portion is configured to display an image by using the image signal. The first display unit is configured to performs display by using a reflective liquid crystal element. The second display unit is configured to performs display by using a light-emitting element.

An electronic device of one embodiment of the present invention includes the above-described display system and a processor. The processor is configured to transmit a control signal to the control portion.

One embodiment of the present invention can provide a novel semiconductor device. One embodiment of the present invention can provide a highly reliable semiconductor device. One embodiment of the present invention can provide a semiconductor device capable of high-speed operation. One embodiment of the present invention can provide a semiconductor device with low power consumption. One embodiment of the present invention can provide a semiconductor device with a small area.

Note that the description of these effects does not preclude the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

In the accompanying drawings:

FIGS. 24A and 24B1 to 24B4 each illustrate a structure example of a display device;

DETAILED DESCRIPTION OF THE INVENTION

Figure 1:
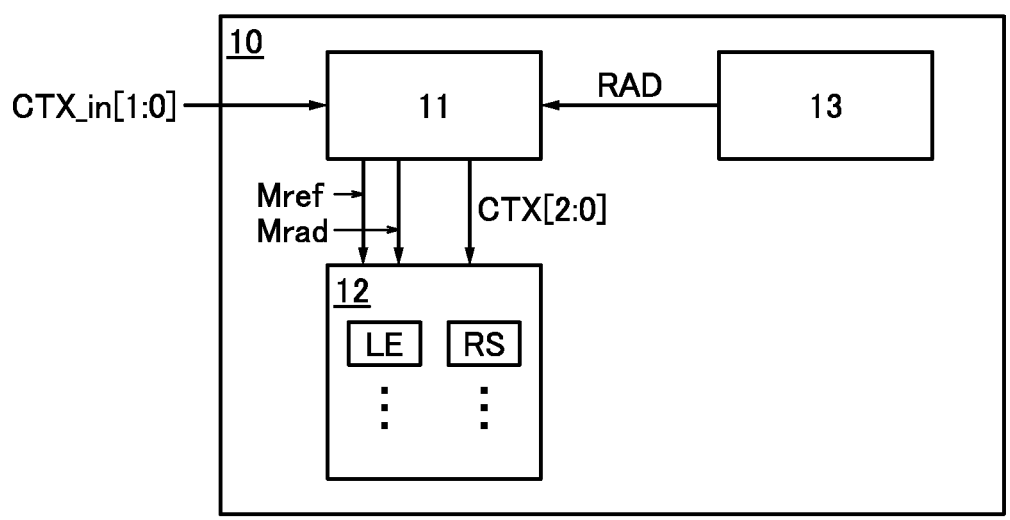
FIG. 1 illustrates a structure example of a semiconductor device.

Embodiments of the present invention will be described below in detail with reference to the accompanying drawings. Note that the present invention is not limited to the following description of the embodiments and it is easily understood by those skilled in the art that the mode and details can be variously changed without departing from the scope and spirit of the present invention. Therefore, the present invention should not be interpreted as being limited to the description of the embodiments below.

One embodiment of the present invention includes, in its category, devices such as a semiconductor device, a memory device, a display device, an imaging device, and a radio frequency (RF) tag. Furthermore, the display device includes, in its category, a liquid crystal display device, a light-emitting device having pixels each provided with a light-emitting element typified by an organic light-emitting element, electronic paper, a digital micromirror device (DMD), a plasma display panel (PDP), a field emission display (FED), and the like.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a channel formation region of a transistor is called an oxide semiconductor in some cases. That is to say, a metal oxide that has at least one of an amplifying function, a rectifying function, and a switching function can be called a metal oxide semiconductor, or OS for short. In the following description, a transistor including a metal oxide in a channel formation region is also referred to as an OS transistor.

In this specification and the like, a metal oxide including nitrogen is also called a metal oxide in some cases. Moreover, a metal oxide including nitrogen may be called a metal oxynitride. The details of a metal oxide are described later.

Furthermore, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that components denoted by the same reference numerals in different drawings represent the same components, unless otherwise specified.

Even when independent components are electrically connected to each other in a drawing, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a semiconductor device of one embodiment of the present invention will be described.

Structure Example 1 of Semiconductor Device

FIG. 1 illustrates a structure example of a semiconductor device 10. The semiconductor device 10 includes a control circuit 11, a programmable logic device (PLD) 12, and a detection circuit 13.

The PLD 12 is a circuit capable of changing its circuit configuration with signals input from the control circuit 11. As the PLD 12, an SPLD, a CPLD, a GAL, an FPGA, or the like can be freely used.

The PLD 12 includes programmable logic elements (LEs) and a programmable switch (RS) provided between the LEs. By changing data stored in memory circuits in the LEs, the functions of the LEs can be changed. Furthermore, by changing data stored in a memory circuit in the RS, the connection between the LEs can be changed.

In this specification and the like, data that controls the function of an LE or data that controls the connection between LEs is referred to as configuration data, and a memory circuit that stores configuration data is referred to as a configuration memory. Moreover, updating configuration data stored in a configuration memory is referred to as reconfiguration.

In the configuration memory, an OS transistor is preferably used. Because a metal oxide has a larger energy gap and a lower minority carrier density than a semiconductor such as silicon, a current flowing between a source and a drain of an OS transistor when the OS transistor is in an off state (such a current is also referred to as an off-state current) can be extremely low. Accordingly, when an OS transistor is used, charges can be held in the configuration memory for a long period as compared with the case where a transistor including silicon in its channel formation region (hereinafter, also referred to as a Si transistor) is used. This enables retention of the circuit configuration in the PLD 12 even in a period when the supply of electric power to the PLD 12 is stopped. The details of the configuration memory including an OS transistor will be described later.

Moreover, the PLD 12 can employ a multi-context method in which the PLD 12 switches among a plurality of contexts in processing. The multi-context method is a method for changing the circuit configuration of the PLD 12 by preparing a plurality of sets of configuration data corresponding to predetermined circuit configurations in advance and switching the set of configuration data stored in the PLD 12. Thus, the PLD 12 is capable of quick reconfiguration and can improve the operation speed of the semiconductor device. As an example, a case where the PLD 12 includes three contexts (context [0], context [1], and context [2]) is described below; however, the number of contexts is not particularly limited.

The control circuit 11 is configured to select a context to be processed in the PLD 12. In response to the input of signals CTX_in[1:0] which designate the context to the control circuit 11, the control circuit 11 generates signals CTX[2:0] which control selection/non-selection of the contexts on the basis of the signals CTX_in[1:0] and outputs the signals CTX[2:0] to the PLD 12. The selection states of the contexts [0], [1], and [2] are determined by the signals CTX[0], CTX[1], and CTX[2], respectively, and processing is performed by the selected context.

Here, a soft error might occur in the PLD 12 owing to radiation. The soft error is a phenomenon in which a malfunction such as inversion of data stored in a configuration memory is caused by electron-hole pair generation when the PLD 12 is irradiated with a rays emitted from a material of the semiconductor device 10 or the like, secondary cosmic ray neutrons generated by nuclear reaction of primary cosmic rays entering the Earth's atmosphere from outer space with nuclei of atoms existing in the atmosphere, or the like. When a soft error occurs in the PLD 12, the circuit configuration of the PLD 12 is changed unintentionally, lowering the processing accuracy of the PLD 12.

The PLD 12 in one embodiment of the present invention is configured to operate in both a first mode using a multi-context method and a second mode having a higher resistance to radiation than the first mode. In the following description, the first mode is referred to as a context mode, and the second mode is referred to as a radiation-resistant mode. The semiconductor device 10 can switch between the context mode and the radiation-resistant mode in accordance with the amount of received radiation. Thus, even in an environment where a soft error can be caused, the PLD 12 can perform processing with high accuracy, so that the reliability of the semiconductor device 10 can be increased.

Specifically, the semiconductor device 10 includes the detection circuit 13. The detection circuit 13 is configured to detect the amount of radiation that the detection circuit 13 has received and to output a signal RAD which corresponds to the detected amount of radiation. As an example, a case where the detection circuit 13 outputs the low-level signal RAD when the value corresponding to the amount of received radiation is smaller than or equal to a reference value and outputs the high-level signal RAD when the value is greater than the reference value, is described below. This reference value can be set using not only the amount of received radiation (μSv/h) but also the number of soft errors caused in an inspection memory circuit provided in the detection circuit 13, for example.

Figure 2A:
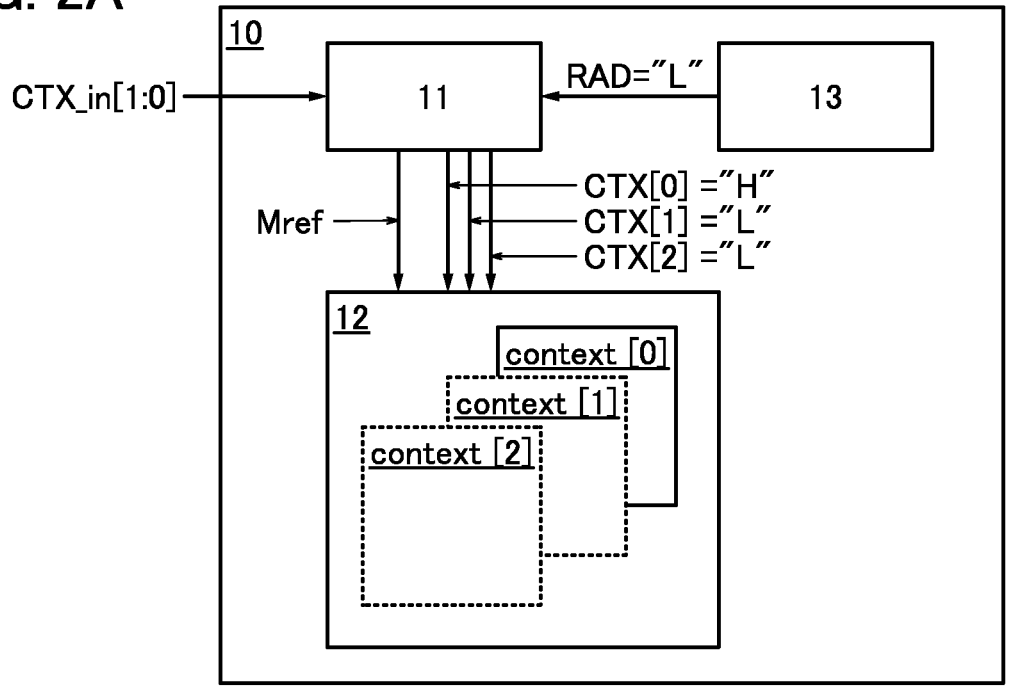
FIGS. 2A and 2B illustrate operation examples of a semiconductor device.
Figure 2B:
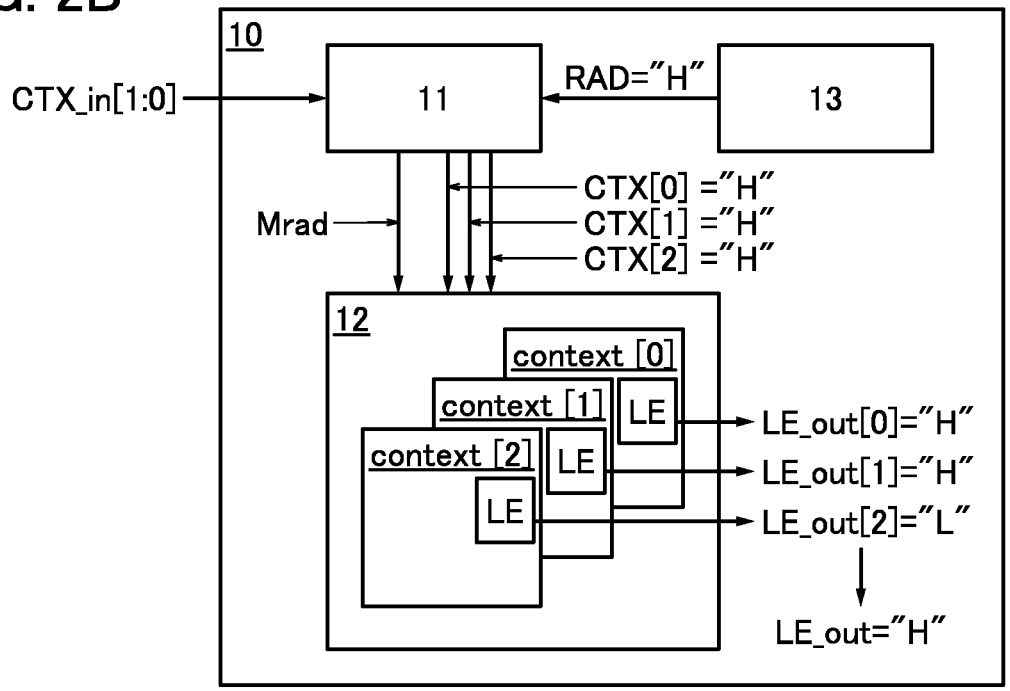

The control circuit 11 selects the context in accordance with the signal RAD input from the detection circuit 13. FIGS. 2A and 2B illustrate operation examples of the semiconductor device 10 at the time of context selection. FIG. 2A corresponds to the context mode, and FIG. 2B corresponds to the radiation-resistant mode.

First, when the value corresponding to the amount of radiation that the detection circuit 13 has received is smaller than or equal to the reference value, the low-level signal RAD is input to the control circuit 11 as illustrated in FIG. 2A. At this time, the control circuit 11 generates the signals CTX[2:0] on the basis of the signals CTX_in[1:0] and outputs the signals CTX[2:0] to the PLD 12. As an example, a case where the signals CTX_in[1:0] are signals designating the context [0] and the control circuit 11 generates the high-level signal CTX[0] and the low-level signals CTX[1] and [2] is illustrated in FIG. 2A. When the signals CTX[2:0] are input to the PLD 12, the context [0] is brought into a selected state and the contexts [1] and [2] are brought into a non-selected state; accordingly, the PLD 12 performs processing with the context [0]. Note that in FIG. 2A, the contexts shown by a broken line represent the contexts in a non-selected state, and the context shown by a solid line represents the context in the selected state. Furthermore, the context used for processing can be switched by changing the signals CTX_in[1:0].

In this manner, when the value corresponding to the amount of radiation is smaller than or equal to the reference value, the PLD 12 operates by a multi-context method. Furthermore, when the PLD 12 operates in the context mode, a signal Mref is output from the control circuit 11 to the PLD 12.

In contrast, when the value corresponding to the amount of radiation that the detection circuit 13 has received is greater than the reference value, the high-level signal RAD is input to the control circuit 11 as illustrated in FIG. 2B. At this time, the control circuit 11 outputs the high-level signals CTX[0], CTX[1], and CTX[2] to the PLD 12 regardless of the signals CTX_in[1:0]. Thus, the contexts [0], [1], and [2] are brought into a selected state.

Moreover, the identical configuration data are stored in the contexts [0], [1], and [2]. Accordingly, even when any of the contexts [0], [1], and [2] is selected, the circuit configuration of the LE included in the PLD 12 is the same, which is referred to as "multiplexing of the LE." Signals LE_out[0], LE_out[1], and LE_out[2] in FIG. 2B are output signals from the LE when the contexts [0], [1], and [2] are selected, respectively.

In the case where a soft error does not occur in the PLD 12, the signals LE_out[0], LE_out[1], and LE_out[2] coincide with each other. In contrast, in the case where a soft error occurs in any of the contexts [0], [1], and [2], the circuit configuration of the LE might be changed unintentionally, and a wrong signal might be output from the LE. An example of such a state is illustrated in FIG. 2B, where although the contexts [0], [1], and [2] are formed so that the high-level signal is output from the LE, the signal LE_out[2] is inverted to the low level signal by the occurrence of a soft error in the context [2].

The LE is configured to output a majority signal of the signals LE_out[0], LE_out[1], and LE_out[2]. In FIG. 2B, owing to the occurrence of the soft error in the context [2], the signals LE_out[0] and LE_out[1] are at the high level and the signal LE_out[2] is at the low level. At this time, the LE employs the high-level signal from the signals LE_out[0], LE_out[1], and LE_out[2] by a majority rule and outputs the high-level signal as an output signal LE_out. In other words, the LE has a function of a majority circuit. Thus, processing can be performed with a majority signal of the signals output from the multiplex circuit, so that an influence of a soft error can be suppressed.

In this manner, when the value corresponding to the amount of radiation is greater than the reference value, the PLD 12 operates in a mode of using the plurality of contexts to form a multiplex circuit and determining the output signal by a majority rule. Furthermore, when the PLD 12 operates in the radiation-resistant mode, a signal Mrad is output from the control circuit 11 to the PLD 12.

Note that although the case where the number of contexts is three and decision by majority is made has been described here, the number of contexts used for the decision by majority can be arbitrarily set as long as it is an odd number of three or more.

In the above-described manner, the PLD 12 can perform high-speed processing by a multi-context method when the amount of radiation is small and perform processing in a mode less influenced by a soft error when the amount of radiation is large. Thus, high operation speed and high reliability of the semiconductor device 10 can be achieved.

Moreover, the PLD 12 can form a multiplex circuit by using multiple contexts. This eliminates the necessity of providing a plurality of circuits having the identical structure in the semiconductor device 10, reducing the area of the semiconductor device 10.

<Structure Example of Detection Circuit>

Figure 3:
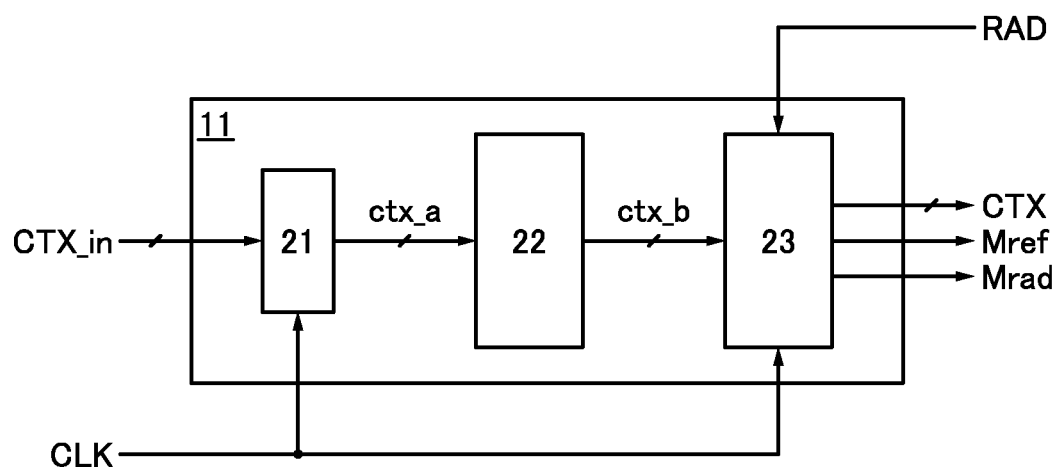
FIG. 3 illustrates a structure example of a control circuit.

Next, a specific structure example of the control circuit 11 will be described. FIG. 3 illustrates a structure example of the control circuit 11. The control circuit 11 includes a detection circuit 21, a signal generation circuit 22 connected to the detection circuit 21, and a selection circuit 23 connected to the signal generation circuit 22.

The detection circuit 21 is configured to detect a change in the signal CTX_in. Specifically, the detection circuit 21 is configured to detect a logic change in the signal CTX_in and output a detection result to the signal generation circuit 22 in synchronization with a clock signal CLK. The signal output from the detection circuit 21 is referred to as a signal ctx_a.

The signal generation circuit 22 is configured to generate signals ctx_b for controlling the selection/non-selection of the contexts on the basis of the signal ctx_a. The same number of signals ctx_b as the number of contexts included in the PLD 12 are generated. The signals ctx_b generated by the signal generation circuit 22 are output to the selection circuit 23.

The selection circuit 23 is configured to select a signal CTX which is output to the PLD 12. Specifically, in order to operate the PLD 12 in the context mode, the selection circuit 23 is configured to output the signals ctx_b as the signal CTX. Furthermore, in order to operate the PLD 12 in the radiation-resistant mode, the selection circuit 23 is configured to output signals for bringing the contexts into a selected state as the signal CTX regardless of the values of the signals ctx_b. Note that the selection of the context mode or the radiation-resistant mode is performed on the basis of the signal RAD input from the detection circuit 13. The selection circuit 23 is configured to output the signal Mref when the PLD 12 operates in the context mode. The selection circuit 23 is configured to output the signal Mrad when the PLD 12 operates in the radiation-resistant mode.

Thus, the control circuit 11 can generate the signals for controlling the selection states of the contexts on the basis of the signal CTX_in and output the signal CTX which matches the operation mode of the PLD 12 on the basis of the signal RAD.

Figure 4:
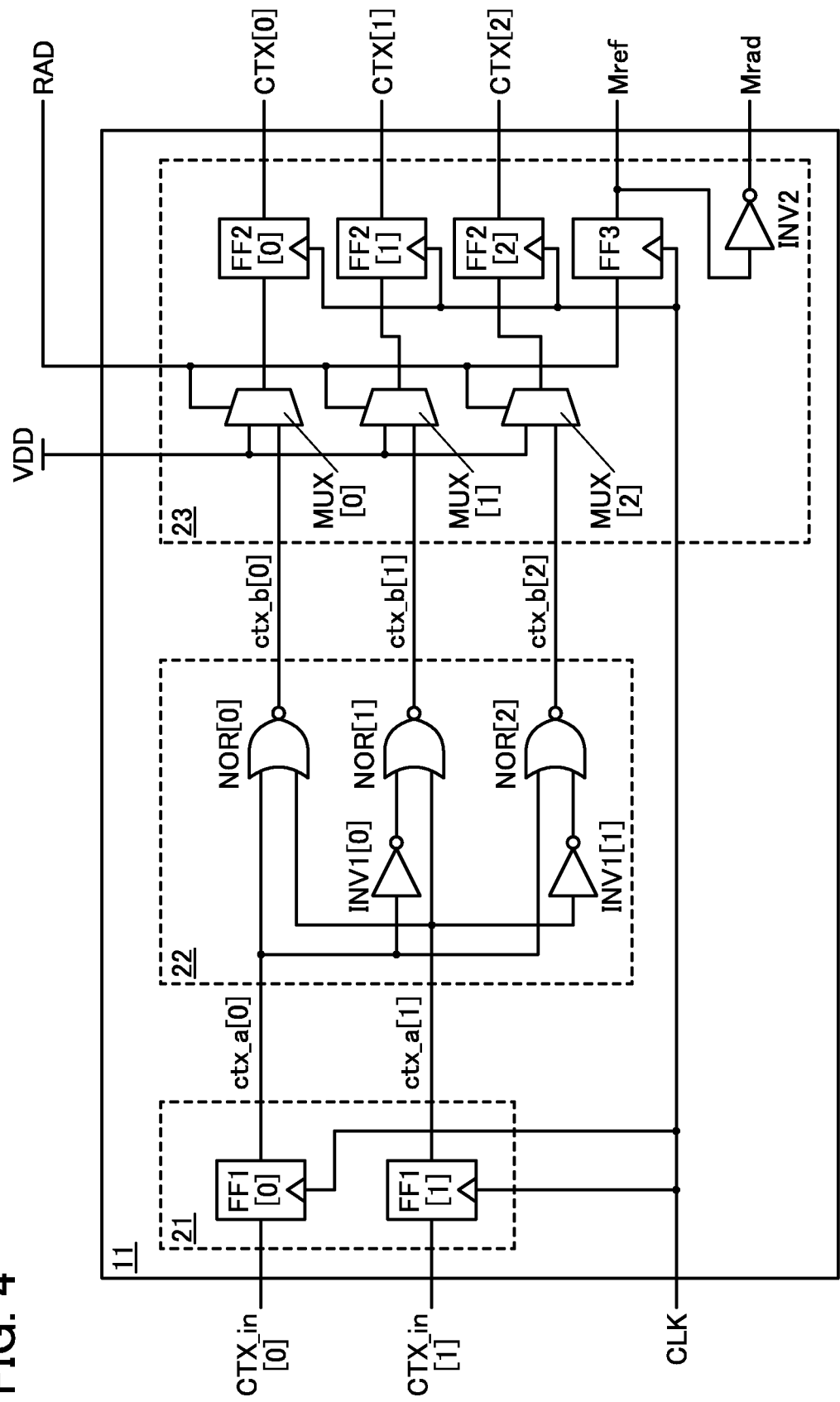
FIG. 4 illustrates a structure example of a control circuit.

Next, a more specific structure example of the control circuit 11 will be described. FIG. 4 illustrates an example of a circuit configuration of the detection circuit 21, the signal generation circuit 22, and the selection circuit 23. Here, as an example, a case where the signals CTX[2:0] are generated on the basis of the signals CTX_in[1:0] and the signal RAD will be described.

The detection circuit 21 includes flip-flops FF1. The signal CTX_in is input to input terminals of the flip-flops FF1, and the signal ctx_a is output from output terminals of the flip-flops FF1. Note that the signal ctx_a is output in synchronization with the clock signal CLK.

In the detection circuit 21, the same number of flip-flops FF1 as the number of bits of the signal CTX_in are provided. In FIG. 4, the flip-flops FF1[0] and FF1[1] are provided in the detection circuit 21 because the signals CTX_in[0] and CTX_in[1] are input to the detection circuit 21.

The signal generation circuit 22 includes inverters INV1 and NORs. When the signals ctx_a[0] and ctx_a[1] are input to the signal generation circuit 22, NOR[0], NOR[1], and NOR[2] output the signals ctx_b[0], ctx_b[1], and ctx_b[2], respectively. The signals ctx_b[0], ctx_b[1], and ctx_b[2] are signals for controlling the selection states of the contexts [0], [1], and [2], respectively.

Although two inverters INV1[0] and INV1[1] and three NORs (NOR[0], NOR[1], and NOR[2]) are provided in FIG. 4 in order to generate the signals ctx_b[0], ctx_b[1], and ctx_b[2] on the basis of the signals ctx_a[0] and ctx_a[1], the number of inverters INV1 and NORs is set appropriately in accordance with the number of signals ctx_a and signals ctx_b.

The selection circuit 23 includes multiplexers MUX functioning as selection circuits, flip-flops FF2, a flip-flop FF3, and an inverter INV2. The same number of multiplexers MUX and flip-flops FF2 as the number of signals ctx_b input to the selection circuit 23 are provided.

The signal ctx_b and a high power supply potential VDD are input to input terminals of each of the multiplexers MUX. In addition, the signal RAD is input to the multiplexers MUX, and signals output from the multiplexers MUX are selected by the signal RAD. Specifically, in the case where the signal RAD is at low level, the signals ctx_b are output from the multiplexers MUX, and in the case where the signal RAD is at high level, the high power supply potential VDD is output from the multiplexers MUX.

Output signals from the multiplexers MUX are input to input terminals of the flip-flops FF2. The flip-flops FF2 have a function of outputting the signals input from the multiplexers MUX from their output terminals with a predetermined timing. The signals output from the flip-flops FF2 are the signals CTX. Note that the signals CTX are output in synchronization with the clock signal CLK.

When the signal RAD is at low level, the signals ctx_b[0], ctx_b[1], and ctx_b[2] corresponding to the signals CTX_in are output as the signals CTX[0], CTX[1], and CTX[2]. When the signal RAD is at high level, high-level signals are output as the signals CTX[0], CTX[1], and CTX[2] regardless of the value of the signals CTX_in. Thus, switch between the context mode and the radiation-resistant mode can be performed on the basis of the signal RAD.

Furthermore, the signal RAD is input to an input terminal of the flip-flop FF3. The flip-flop FF3 is configured to output the signal RAD with a predetermined timing. The signal output from the flip-flop FF3 is the signal Mref, and the signal obtained by inverting the signal output from the flip-flops FF3 by the inverter INV2 is the signal Mrad.

As described above, the control circuit 11 can generate the signals CTX[2:0] on the basis of the signals CTX_in[1:0] and the signal RAD.

<Structure Example of PLD>

Figure 5:
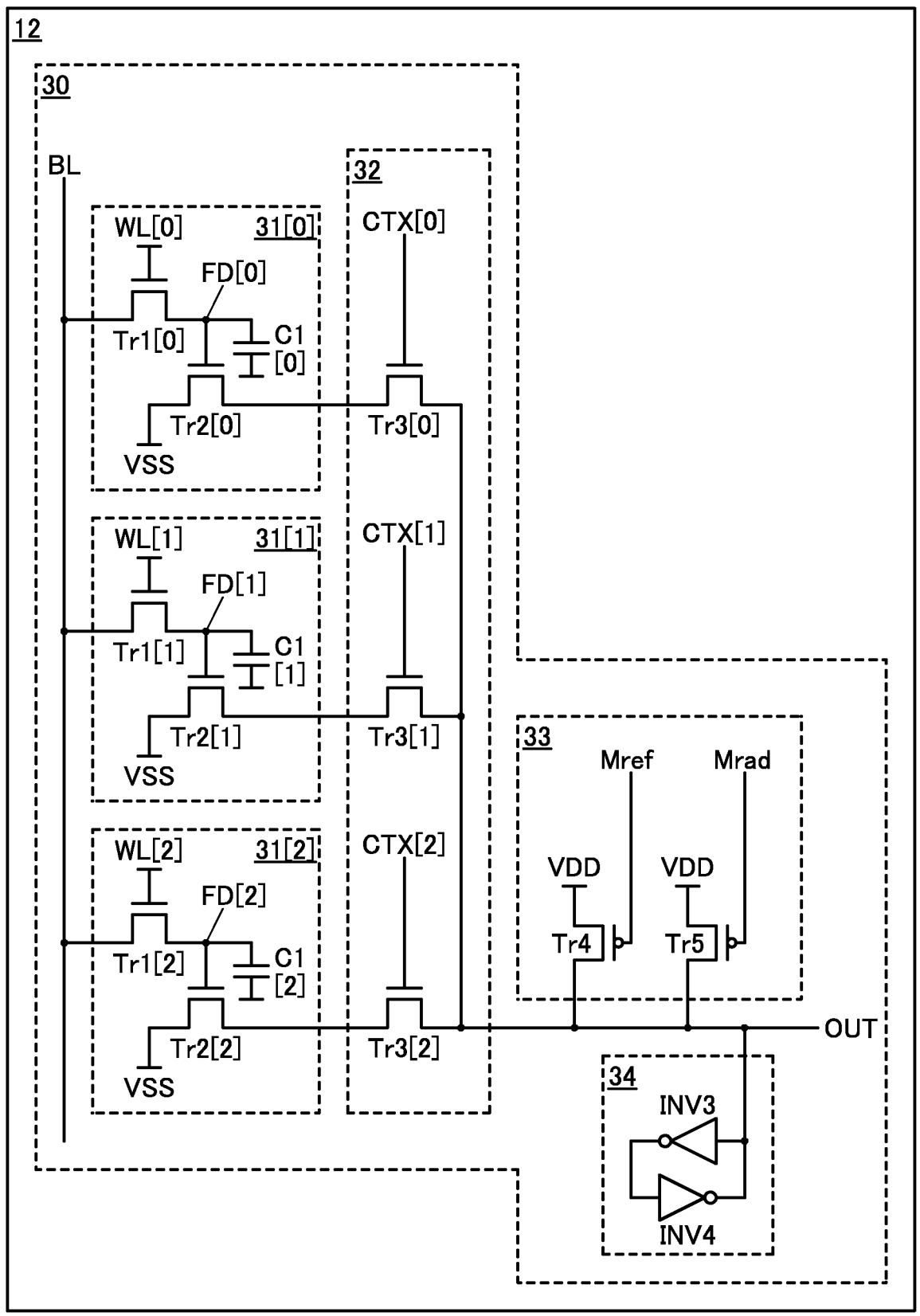
FIG. 5 illustrates a structure example of a PLD.

Next, a structure example of the PLD 12 will be described. FIG. 5 illustrates a structure example of an LE included in the PLD 12. An LE 30 includes a plurality of memory circuits 31, a selection circuit 32, a current supply circuit 33, and a latch 34. The LE 30 is configured to supply an output signal from the memory circuit 31 that is selected by the control circuit 11 to a wiring OUT and supply a majority signal of the output signals from the plurality of memory circuits 31 to the wiring OUT.

The memory circuits 31 correspond to configuration memories of the LE 30. In FIG. 5, three memory circuits 31 are provided. The memory circuits 31[0], 31[1], and 31[2] correspond to the configuration memories of the contexts [0], [1], and [2], respectively.

The memory circuits 31 each include a transistor Tr1, a transistor Tr2, and a capacitor C1. Although the transistors Tr1 and Tr2 are described as being of an n-channel type, the polarities of the transistors can be set freely.

A gate of the transistor Tr1 is connected to a wiring WL, one of a source and a drain of the transistor Tr1 is connected to a gate of the transistor Tr2 and one electrode of the capacitor C1, and the other thereof is connected to a wiring BL. One of a source and a drain of the transistor Tr2 is connected to the selection circuit 32, and the other of the source and the drain is connected to a wiring through which a low power supply potential VSS is supplied. A node connected to the one of the source and the drain of the transistor Tr1, the gate of the transistor Tr2, and the one electrode of the capacitor C1 is referred to as a node FD.

The selection circuit 32 includes a plurality of transistors Tr3 and is configured to control the conduction state between the memory circuits 31 and the wiring OUT. Although the transistors Tr3 are described as being of an n-channel type here, the polarities of the transistors Tr3 can be set freely.

In each of the transistors Tr3, a gate is connected to a wiring through which the signal CTX is supplied, one of a source and a drain is connected to the one of the source and the drain of the transistor Tr2, and the other of the source and the drain is connected to the wiring OUT. When the transistor Tr3 [0] is brought into an on state, the memory circuit 31[0] is selected. When the transistor Tr3[1] is brought into an on state, the memory circuit 31[1] is selected. When the transistor Tr3[2] is brought into an on state, the memory circuit 31[2] is selected.

The current supply circuit 33 includes a transistor Tr4 and a transistor Tr5, and is configured to supply a current corresponding to the operation mode of the PLD 12 to the wiring OUT. Although the transistors Tr4 and Tr5 are described as being of a p-channel type here, the polarities of the transistors Tr4 and Tr5 may be set freely.

A gate of the transistor Tr4 is connected to a wiring through which the signal Mref is supplied, one of a source and a drain of the transistor Tr4 is connected to the wiring OUT, and the other of the source and the drain of the transistor Tr4 is connected to a wiring through which the high power supply potential VDD is supplied. A gate of the transistor Tr5 is connected to a wiring through which the signal Mrad is supplied, one of a source and a drain of the transistor Tr5 is connected to the wiring OUT, and the other of the source and the drain of the transistor Tr5 is connected to the wiring through which the high power supply potential VDD is supplied.

When the PLD 12 operates in the context mode, the transistor Tr4 is turned on by the signal Mref, and the transistor Tr5 is turned off by the signal Mrad. This makes a current flow through the transistor Tr4 to the wiring OUT. Furthermore, when the PLD 12 operates in the radiation-resistant mode, the transistor Tr4 is turned off by the signal Mref and the transistor Tr5 is turned on by the signal Mrad. This makes a current flow through the transistor Tr5 to the wiring OUT.

The latch 34 includes an inverter INV3 and an inverter INV4. An input terminal of the inverter INV3 is connected to the wiring OUT, and an output terminal of the inverter INV3 is connected to an input terminal of the inverter INV4. An output terminal of the inverter INV4 is connected to the wiring OUT.

The latch 34 is configured to hold the potential of the wiring OUT. Thus, the output of an intermediate potential to the wiring OUT can be prevented. Note that the latch 34 can be omitted.

Next, an operation example of the LE 30 will be described. An operation example at the time of writing configuration data to the memory circuit 31, an operation example in the context mode, and an operation example in the radiation-resistant mode will be described. In the following description, a current flowing between a source and a drain of a transistor which is in an on state is referred to as an on-state current.

[Writing of Configuration Data]

First, the potential of the wiring WL is set to turn on the transistor Tr1, so that the potential of the wiring BL corresponding to the configuration data is supplied to the node FD. Then, the potential of the wiring WL is set to turn off the transistor Tr1. This makes the node FD floating, and the potential of the node FD is held. In this manner, the configuration data is written to the memory circuit 31.

In the case where the PLD 12 operates in the context mode, the memory circuits 31[0], 31[1], and 31[2] store configuration data corresponding to the contexts [0], [1], and [2], respectively. In contrast, in the case where the PLD 12 operates in the radiation-resistant mode, the same configuration data is stored in the memory circuits 31[0], 31[1], and 31[2].

[Context Mode]

In the context mode, any one of the memory circuits 31[0], 31[1], and 31[2] is selected, and the potential corresponding to the configuration data stored in the selected memory circuit 31 is supplied to the wiring OUT. For example, in the case where the context [0] is selected, the signal CTX[0] is set at a high level and the signals CTX[1] and CTX[2] are set at a low level. Accordingly, the transistor Tr3[0] is on and the transistors Tr3[1] and Tr3[2] are off. Thus, the memory circuit 31[0] is selected.

Then, the potential corresponding to the potential of the node FD[0] is output to the wiring OUT through the transistor Tr3[0]. Specifically, in the case where a high-level potential is held in the node FD[0], the transistor Tr2[0] is on and the low power supply potential VSS is supplied to the wiring OUT through the transistors Tr2[0] and Tr3[0]. Thus, the potential of the wiring OUT becomes low. In contrast, in the case where a low-level potential is held in the node FD[0], the transistor Tr2[0] is off and the low power supply potential VSS is not supplied to the wiring OUT. Thus, the potential of the wiring OUT becomes high.

Furthermore, in the context mode, the signal Mref is at a low level, and the signal Mrad is at a high level, so that the high power supply potential VDD is supplied to the wiring OUT through the transistor Tr4. Here, the transistor Tr4 functions as a pullup resistor. Specifically, the on-state current of the transistor Tr2 ($I_{Tr2}$) is larger than the on-state current of the transistor Tr4 ($I_{Tr4}$). Therefore, when the transistor Tr2 is on, the wiring OUT is at a low level, and when the transistor Tr2 is off, the wiring OUT is at a high level. Thus, the potential of the wiring OUT can be prevented from becoming an intermediate potential.

In order that the current $I_{Tr2}$ can be larger than the current $I_{Tr4}$, the structures and dimensions of the transistors Tr2 and Tr4 are adjusted as appropriate. For example, the channel width W/the channel length L of the transistor Tr2 may be set larger than the channel width W/the channel length L of the transistor Tr4.

[Radiation-Resistant Mode]

In the radiation-resistant mode, the memory circuits 31[0], 31[1], and 31[2] are selected and a majority potential of the potentials output from the memory circuits 31[0], 31[1], and 31[2] is supplied to the wiring OUT. Here, as an example, a state in which the potentials of the nodes FD[0] and FD[1] are at a high level and the potential of the node FD[2] is inverted from a high level to a low level owing to a soft error will be described.

High-level potentials are supplied to the gates of the transistors Tr3[0], Tr3[1], and Tr3[2] as the signals CTX[0], CTX [1], and CTX[2], which brings the transistors Tr3[0], Tr3[1], and Tr3[2] into an on state, so that the memory circuits 31[0], 31[1], and 31[2] are selected.

Then, the potentials corresponding to the potentials of the nodes FD[0], FD[1], and FD[2] are output to the wiring OUT through the transistors Tr3[0], Tr3[1], and Tr3[2], respectively. Specifically, the transistors Tr2[0] and Tr2[1] are in an on state and the low power supply potential VSS is supplied from each of the memory circuits 31[0] and 31[1] to the wiring OUT. The transistor Tr2[2] is in an off state and thus the low power supply potential VSS is not supplied from the memory circuit 31[2] to the wiring OUT.

Moreover, in the radiation-resistant mode, the signal Mref is at a high level and the signal Mrad is at a low level; accordingly, the high power supply potential VDD is supplied to the wiring OUT through the transistor Tr5. Here, the transistor Tr5 functions as a pullup resistor. Specifically, the on-state current of the transistor Tr5 (a current $I_{Tr5}$) is larger than the current $I_{Tr2}$ and smaller than the current $I_{Tr2} \times 2$. Therefore, when two or more of the transistors Tr2[0], Tr2[1], and Tr2[2] are in an on state, the wiring OUT is at a low level. In contrast, when zero or one of the transistors Tr2[0], Tr2[1], and Tr2[2] is in an on state, the wiring OUT is at a high level. In this way, the majority potential of the potentials output from the memory circuits 31[0], 31[1], and 31[2] can be output to the wiring OUT. Thus, even when configuration data of any one of the memory circuits 31[0], 31[1], and 31[2] is changed owing to a soft error, a precise logical value can be output.

In order that the current $I_{Tr5}$ can be larger than the current $I_{Tr2}$ and smaller than the current $I_{Tr2} \times 2$, the structures and dimensions of the transistors Tr2 and Tr5 are adjusted as appropriate. For example, the channel width W/the channel length L of the transistor Tr5 may be set larger than the channel width W/the channel length L of the transistor Tr2 and smaller than twice the channel width W/the channel length L of the transistor Tr2.

Furthermore, a current $I_{Lat}$ which flows between the latch 34 and the wiring OUT is preferably the one that does not influence the logical value output to the wiring OUT. Specifically, it is preferable that the current $I_{Lat}$ be smaller than the current $I_{Tr4}$, the sum of the current $I_{Lat}$ and the current $I_{Tr4}$ be smaller than the current $I_{Tr2}$, and the sum of the current $I_{Lat}$ and the current $I_{Tr5}$ be smaller than twice the current $I_{Tr2}$. Under such conditions, variations in the logical value due to the latch 34 can be prevented.

In the above-described manner, the LE 30 can supply the potential that is output from the memory circuit 31 selected by the signal CTX to the wiring OUT and supply the majority potential of the potentials output from the memory circuits 31[0], 31[1], and 31[2] to the wiring OUT. Thus, the LE 30 can be used in the PLD 12 which operates in the context mode and the radiation-resistant mode.

Note that an OS transistor is preferably used as the transistor Tr1. Because the OS transistor has an extremely low off-state current, the potential of the node FD can be held for a long time in a period when the transistor Tr1 is in an off state. This allows power supply to the memory circuit 31 to stop in a period when update of configuration data is not performed. As a result, power consumption of the PLD 12 can be reduced.

Note that the transistor Tr1 is not necessarily the OS transistor. For example, a transistor whose channel formation region is formed in part of a substrate containing a single-crystal semiconductor other than a metal oxide can be used. Examples of this kind of substrate include a single-crystal silicon substrate and a single-crystal germanium substrate. In addition, a transistor whose channel formation region is formed in a film containing a material other than a metal oxide can be used as the transistor Tr1. Examples of the material other than a metal oxide include silicon, germanium, silicon germanium, silicon carbide, gallium arsenide, aluminum gallium arsenide, indium phosphide, gallium nitride, and an organic semiconductor. Each of the above materials may be a single-crystal semiconductor or a non-single-crystal semiconductor such as an amorphous semiconductor, a microcrystalline semiconductor, or a polycrystalline semiconductor.

Moreover, examples of the material that can be used in the transistors Tr2, Tr3, Tr4, and Tr5 and the transistors in the following description are similar to those for the transistor Tr1.

The transistor Tr2 and the wiring through which the high power supply potential VDD is supplied may be connected to each other, and the transistors Tr4 and Tr5 and the wiring through which the low power supply potential VSS is supplied may be connected to each other. In this case, the transistor Tr2 is preferably of a p-channel type, and the transistors Tr4 and Tr5 are preferably of an n-channel type.

<Structure Example of Detection Circuit>

Next, a structure example of the detection circuit 13 will be described. The structure of the detection circuit 13 is not particularly limited as long as it has a function of outputting the signal RAD corresponding to the amount of received radiation. Here, as an example, the detection circuit 13 having a function of outputting the signal RAD on the basis of whether a soft error occurs in a memory device provided in the detection circuit 13 will be described.

Figure 6:
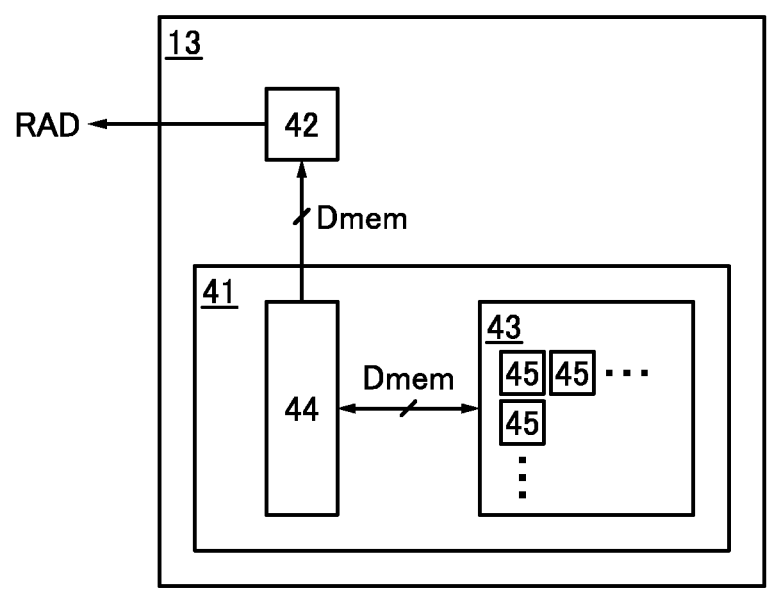
FIG. 6 illustrates a structure example of a detection circuit.

FIG. 6 illustrates a structure example of the detection circuit 13. The detection circuit 13 includes a memory device 41 and an inspection circuit 42.

The memory device 41 includes a cell array 43 and a driver circuit 44. The cell array 43 includes a plurality of memory cells 45 provided in a matrix. Predetermined data Dmem is written to each of the memory cells 45. As an example, a case where a high-level potential is stored in all the memory cells 45 used for detection of radiation will be described below.

The driver circuit 44 is configured to write the data Dmem to the memory cells 45 and read the data Dmem from the memory cells 45. The driver circuit 44 reads the data Dmem from the memory cells 45 on a regular basis at the time of measuring the amount of radiation. The data Dmem read by the driver circuit 44 is output to the inspection circuit 42.

The inspection circuit 42 is configured to inspect whether variations in the data stored in the memory device 41 have occurred. Specifically, the inspection circuit 42 inspects whether the high-level potential held in the plurality of memory cells 45 is changed to a low level by receiving radiation. If a change in data is found or if the number of pieces of changed data is more than or equal to a certain number, the inspection circuit 42 outputs a high-level signal as the signal RAD. In this manner, the detection circuit 13 can generate the signal RAD on the basis of whether a soft error occurs in the memory device 41 and output the signal RAD.

Here, the circuit configuration of the memory cells 45 is preferably similar to that of the memory circuit 31 (see FIG. 5). For example, as illustrated in FIG. 5, a structure in which a potential is held in a node connected to one of a source and a drain of an OS transistor and a capacitor is preferably applied to the memory circuits 31 and the memory cells 45. This can improve harmonization between the timing of the occurrence of a soft error in the configuration memory of the PLD 12 and the timing of switching the signal RAD.

At the time of measuring the radiation, the memory cells 45 are maintained in a state where the data Dmem is held. Here, by using the memory circuits 31 of FIG. 5 where the transistor Tr1 is an OS transistor as the memory cells 45, the data Dmem stored in the memory cells 45 can be held for an extremely long period. Consequently, operation in which writing is performed again at predetermined intervals (refresh operation) becomes unnecessary or the frequency of the refresh operation can be extremely low. Accordingly, power consumption of the detection circuit 13 can be reduced.

Note that although a case where an inspection for a soft error is performed on the basis of the existence or the number of changed data in the inspection circuit 42 has been described here, the inspection method is not particularly limited. For example, an inspection can be performed using a parity check, an error correction code (ECC), cyclic redundancy check (CRC), or the like.

Furthermore, in the detection circuit 13, part of another memory device can be used as the memory device 41. In other words, the data Dmem may be stored in part of memory cells included in a memory device used for another purpose. Thus, the area of the memory device can be reduced.

<Operation Example of Semiconductor Device>

Figure 7:
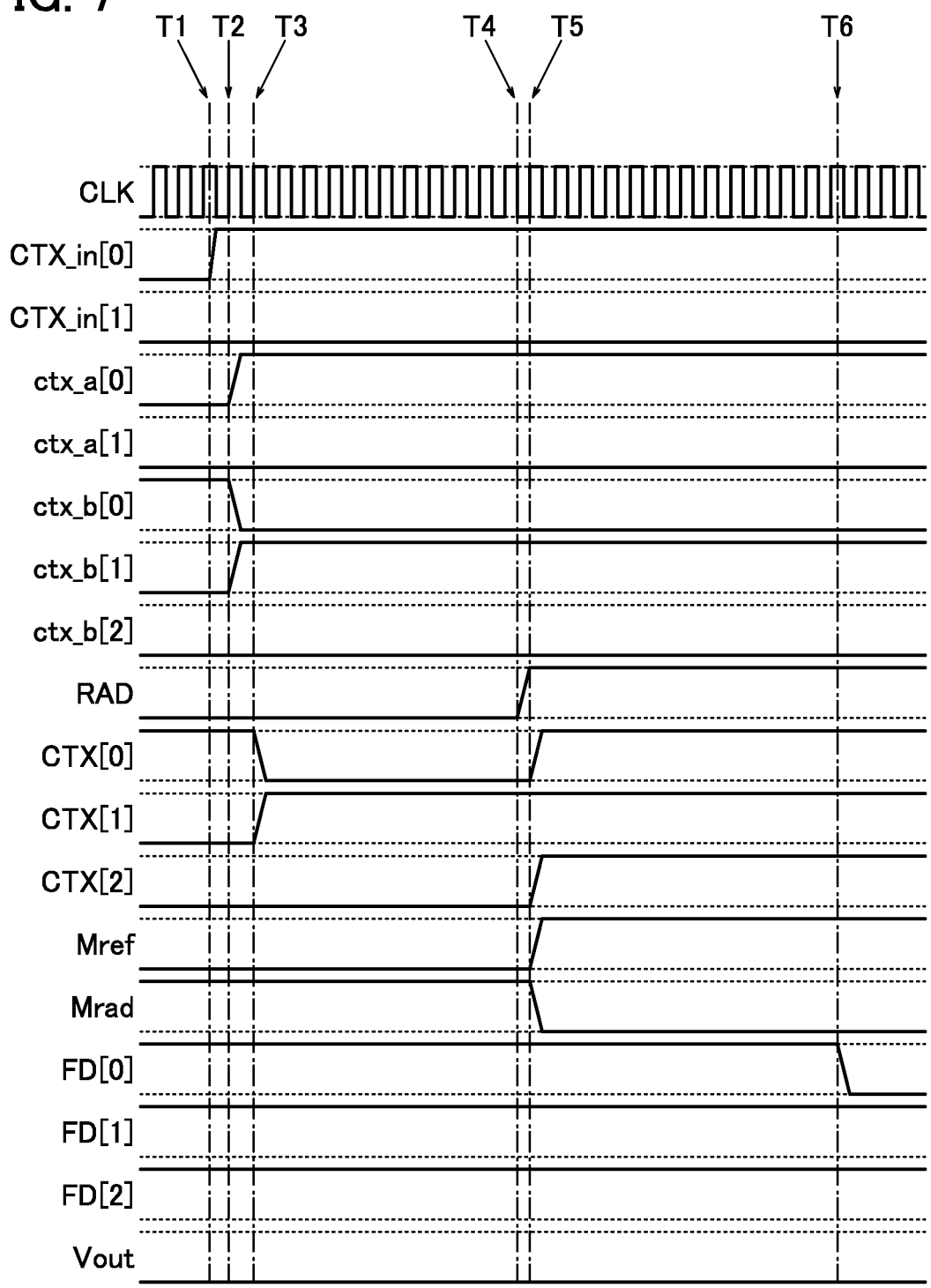
FIG. 7 is a timing chart.

Next, an operation example of the semiconductor device 10 will be described. FIG. 7 is a timing chart illustrating an operation example of the semiconductor device 10. Here, as an example, the semiconductor device 10 including the control circuit 11 illustrated in FIG. 4 and the PLD 12 illustrated in FIG. 5 will be described.

[Context Mode]

From Time T1 to Time T3, the signal RAD is at a low level, so that the semiconductor device 10 operates in the context mode. Furthermore, conditions where the context [0] is selected by the low-level signals CTX_in[0] and CTX_in [1] and a high-level potential is held in the nodes FD[0], FD[1], and FD[2] immediately before Time T1 are assumed.

First, at Time T1, the signal CTX_in[0] is brought to a high level, and the signal CTX_in[1] remains at a low level. At this time, the signals CTX_in[1:0] correspond to signals that designate the context [1].

Next, at Time T2, in synchronization with a low to high transition of the clock signal CLK, the signal CTX_in[0] is stored in the flip-flop FF1[0], and the signal CTX_in[1] is stored in the flip-flop FF1[1]. Accordingly, the signal ctx_a [0] is brought to a high level and the signal ctx_a[1] remains at a low level. Then, the signal ctx_b[0] is brought to a low level, the signal ctx_b[1] is brought to a high level, and the signal ctx_b[2] remains at a low level.

Here, the signal RAD is at a low level, so that the multiplexers MUX[0], MUX[1], and MUX[2] select the signals ctx_b[0], ctx_b[1], and ctx_b[2], respectively.

Next, at Time T3, in synchronization with a low to high transition of the clock signal CLK, the signal ctx_b[0] is stored in the flip-flop FF2[0], the signal ctx_b[1] is stored in the flip-flop FF2[1], and the signal ctx_b[2] is stored in the flip-flop FF2[2]. Accordingly, the signal CTX[0] is brought to a low level, the signal CTX[1] is brought to a high level, and the signal CTX[2] remains at a low level, so that the context [1] is selected in the PLD 12.

In addition, the signal RAD is stored in the flip-flop FF3, so that the signal Mref is at a low level, and the signal Mrad is at a high level. Accordingly, the transistor Tr4 is in an on state and the transistor Tr5 is in an off state.

In the above-described manner, in the context mode, a particular context is selected in accordance with the signals CTX_in[1:0].

[Radiation-Resistant Mode]

Then, at Time T4, the signal RAD is switched from the low level to a high level, so that the mode is switched from the context mode to the radiation-resistant mode. Accordingly, the multiplexers MUX[0], MUX[1], and MUX[2] each select the high power supply potential VDD.

Next, at Time T5, in synchronization with a low to high transition of the clock signal CLK, the high power supply potential VDD is stored in the flip-flops FF2[0], FF2[1], and FF2[2]. Accordingly, the signals CTX[0], CTX[1], and CTX[2] are brought to a high level, so that the contexts [0], [1], and [2] are selected in the PLD 12.

In addition, the signal RAD is stored in the flip-flop FF3, so that the signal Mref is brought to a high level and the signal Mrad is brought to a low level. Accordingly, the transistor Tr4 is in an off state and the transistor Tr5 is in an on state.

In the above-described manner, in the radiation-resistant mode, the contexts [0], [1], and [2] are selected regardless of the signals CTX_in[1:0].

Time T6 is the time when the potential of the node FD[0] is inverted owing to a soft error. In this case, if the potentials of the nodes FD[1] and FD[2] remain at the high level, the sum of a current flowing through the transistor Tr2[1] and a current flowing through the transistor Tr2[2] is larger than a current flowing through the transistor Try, and therefore the potential of the wiring OUT is kept at a low level. Thus, even when a soft error occurs in the memory circuit 31[0], the PLD 12 can operate normally.

Structural Example 2 of Semiconductor Device

Next, another structure example of the semiconductor device 10 will be described. The semiconductor device 10 illustrated in FIG. 8 includes a control circuit 14 in addition to the control circuit 11, the PLD 12, and the detection circuit 13.

The control circuit 14 is configured to control reconfiguration of the PLD 12. Specifically, the control circuit 14 is configured to control writing of configuration data to the PLD 12. Furthermore, the control circuit 14 includes a memory device 15 which is configured to store configuration data.

Here, a case in which the PLD 12 switches from the context mode where processing is performed using the context [0] to the radiation-resistant mode is considered. In order to make decision by majority using the contexts [0], [1], and [2] in the radiation-resistant mode, the contexts [1] and [2] need to have the same circuit configuration as the context [0]. Accordingly, the same configuration data as the context [0] needs to be stored in the contexts [1] and [2]. At this time, the control circuit 14 is configured to read out data Dcon that is the same data as the configuration data stored in the context [0] from the memory device 15 and output the data to the contexts [1] and [2]. In this way, the same circuit can be configured in the contexts [0], [1], and [2].

Specifically, first, a signal RAD_in that corresponds to the amount of radiation is input from the detection circuit 13 to the control circuit 14. Here, as an example, a case in which the detection circuit 13 outputs the low-level signal RAD_in when the value corresponding to the amount of radiation received by the detection circuit 13 is smaller than or equal to a reference value and outputs the high-level signal RAD_in when the value is greater than the reference value will be described.

When the high-level signal RAD_in is input, the control circuit 14 identifies the selected context on the basis of the signals CTX_in[1:0]. Then, the data Dcon that is the same as the configuration data stored in the selected context is read out from the memory device 15.

Then, the control circuit 14 writes the data Dcon read out from the memory device 15, to a non-selected context using the clock signal DCLK. Accordingly, a multiplex circuit configured by the selected context can be obtained.

Moreover, the control circuit 14 outputs the high-level signal RAD to the control circuit 11 after writing of the data Dcon is finished. This makes the high-level signals CTX[0], CTX[1], and CTX[2] output from the control circuit 11, bringing the contexts [0], [1], and [2] into a selected state. Thus, the PLD 12 switches to the radiation-resistant mode. By switching the PLD 12 to the radiation-resistant mode after writing of the data Dcon to the non-selected context is finished in this manner, processing by the selected context can continue in a period when the non-selected context is under reconfiguration.

Figure 8:
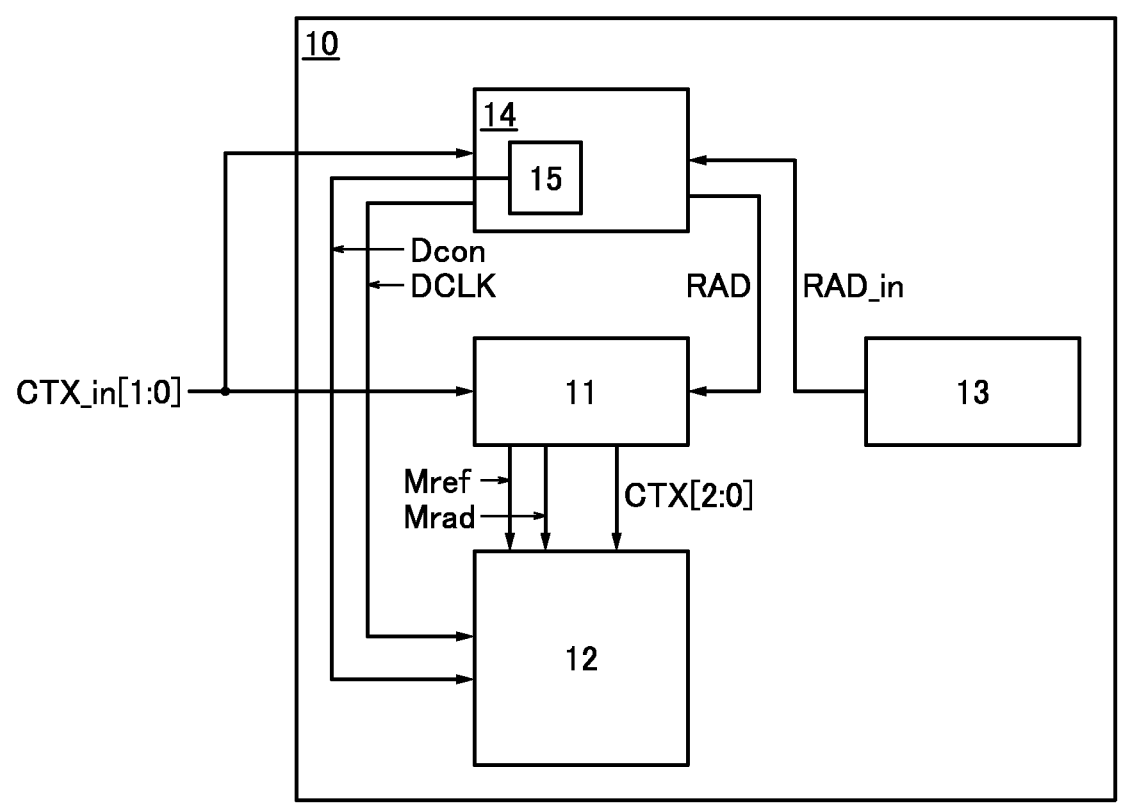
FIG. 8 illustrates a structure example of a semiconductor device.
Figure 9:
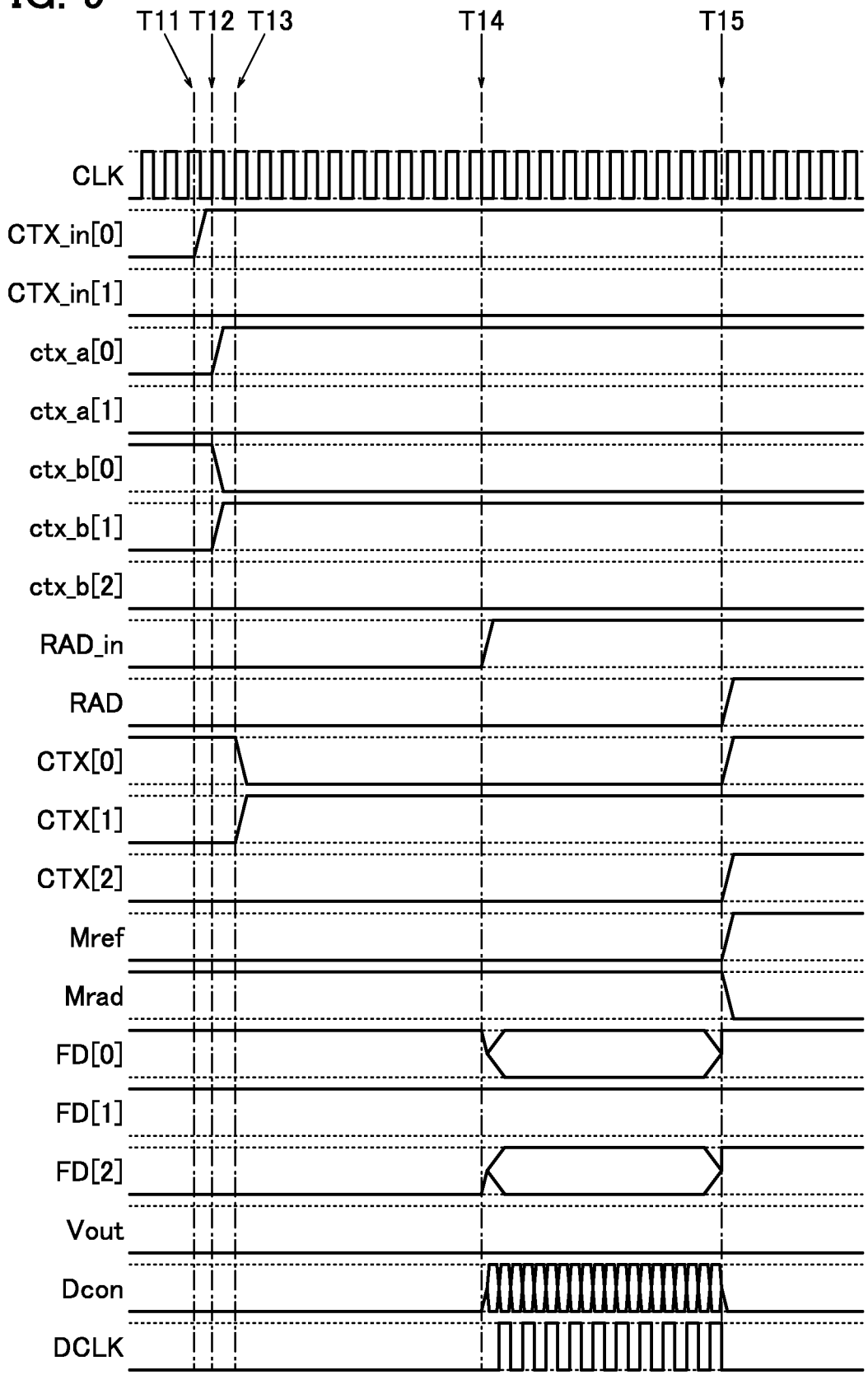
FIG. 9 is a timing chart.

FIG. 9 illustrates a timing chart showing an operation example of the semiconductor device 10 illustrated in FIG. 8. The operation from Time T11 to Time T13 is similar to that from Time T1 to Time T3 in FIG. 7. Note that conditions where high-level potentials are held in the nodes FD[0] and FD[1] and a low-level potential is held in the node FD[2] immediately before Time T11 are assumed.

First, at Time T14 when the detection circuit 13 detects radiation in an amount exceeding the reference value, the signal RAD_in is brought to a high level. Accordingly, the data Dcon and the clock signal DCLK are supplied from the control circuit 14 to the PLD 12, so that reconfiguration of the contexts [0] and [2] is performed.

Note that the signal RAD is kept at a low level at Time T14. Therefore, processing continues in the context [1].

Next, at Time T15 when the contexts [0] and [2] finish reconfiguration, the potentials of the nodes FD [0] and FD [2] become equal to the high level potential of the node FD[1]. Furthermore, after the reconfiguration, the signal RAD is brought to a high level. This switches the PLD 12 to the radiation-resistant mode, bringing the signal Mref to a high level and the signal Mrad to a low level.

Thus, in the radiation-resistant mode, a multiplex circuit can be formed by using the control circuit 14.

As described above, in one embodiment of the present invention, switching between the mode in which high-speed processing is performed using a multi-context method and the mode having a high resistance to radiation can be conducted in accordance with the amount of received radiation. Thus, a semiconductor device capable of high-speed operation and having high reliability which can deal with soft errors while maintaining high-speed performance of the PLD can be provided. This semiconductor device can be used in a variety of places such as the indoors or the outdoors and is particularly useful for an electronic device or the like which receives a variable amount of radiation depending on the use conditions.

Moreover, in one embodiment of the present invention, using an OS transistor in the memory circuit can provide a low-power-consumption semiconductor device.

This embodiment can be combined with any of the other embodiments as appropriate.

Embodiment 2

In this embodiment, a modification example of the semiconductor device described in Embodiment 1 will be described.

<Modification Example of Semiconductor Device>

Figure 10:
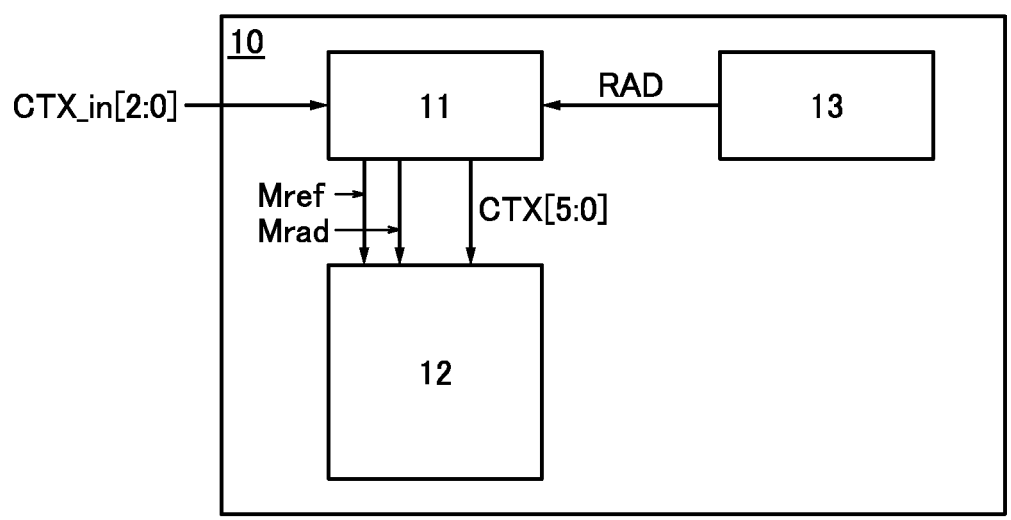
FIG. 10 illustrates a structure example of a semiconductor device.

Although the case where the semiconductor device 10 operates in the first mode using a multi-context method or the second mode having a high resistance to radiation is described in Embodiment 1, the semiconductor device 10 can also operate in a third mode which uses a multi-context method and has a high resistance to radiation. The third mode is also referred to as a combination mode below. FIG. 10 illustrates a structure example of the semiconductor device 10 which can operate in the combination mode.

The semiconductor device 10 illustrated in FIG. 10 is different from that illustrated in FIG. 1 in that signals CTX_in[2:0] are input to the control circuit 11 and signals CTX[5:0] are input to the PLD 12. In addition, the PLD 12 in FIG. 10 includes six contexts (contexts [0] to [5]).

Figure 11A:
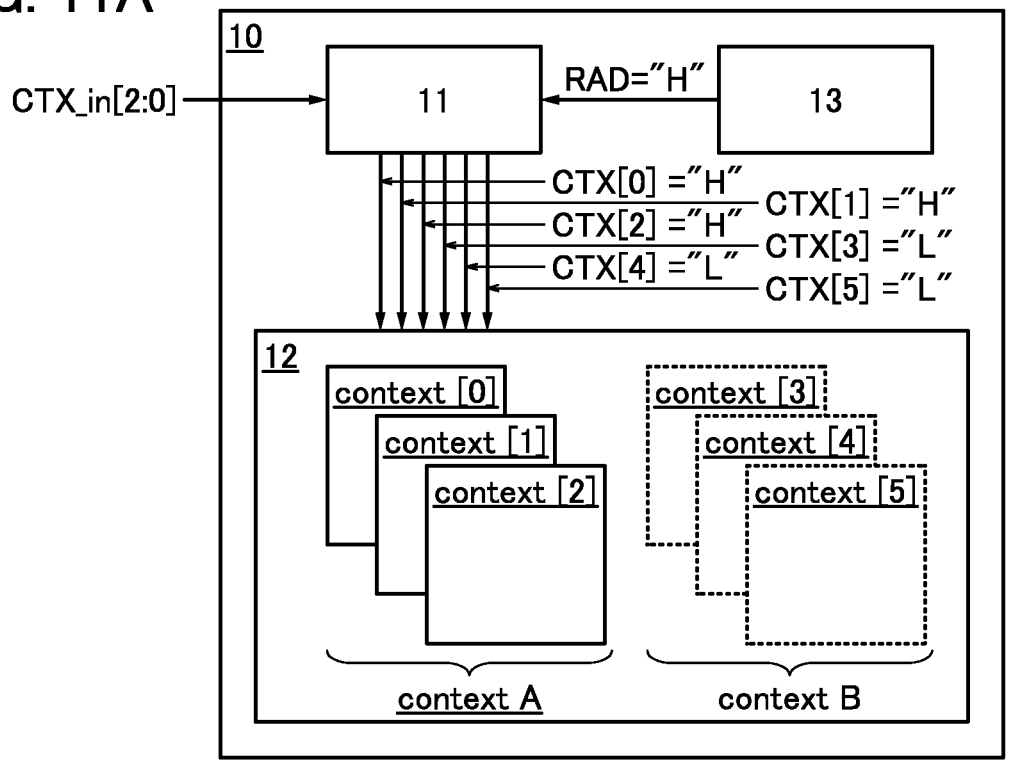
FIGS. 11A and 11B illustrate operation examples of a semiconductor device.
Figure 11B:
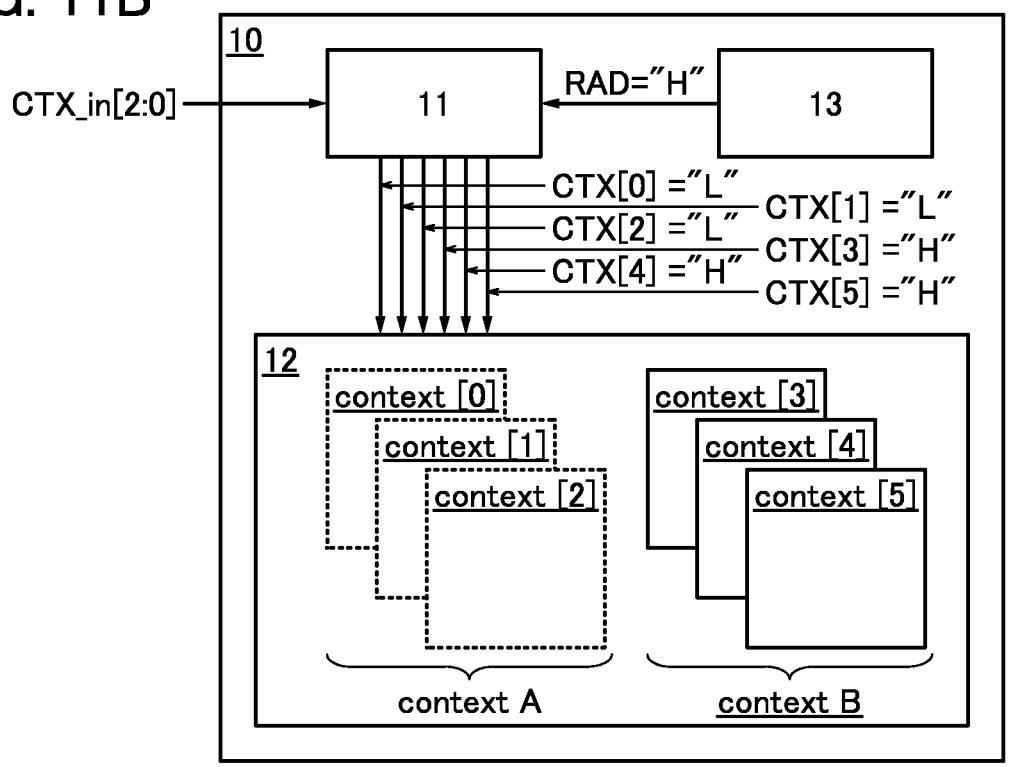

When the value corresponding to the amount of radiation is smaller than or equal to the reference value, the semiconductor device 10 can operate in the context mode where one or more contexts are selected from the contexts [0] to [5] and processing is performed. When the value corresponding to the amount of radiation is greater than the reference value, the semiconductor device 10 can operate in the combination mode in which processing is performed by a multi-context method using a plurality of multiplex circuits. FIGS. 11A and 11B illustrate operation examples of the semiconductor device 10 in the combination mode.

When the signal RAD is brought to a high level, the contexts [0], [1], and [2] form the same circuit and the contexts [3], [4], and [5] form the same circuit, so that a plurality of multiplex circuits are formed. Then, the PLD 12 operates by a multi-context method in which either a context (context A) formed of the contexts [0], [1], and [2] or a context (context B) formed of the contexts [3], [4], and [5] is selected and processing is performed. In this manner, the PLD 12 can operate in the combination mode.

In the case where processing is performed using the context A, the high-level signals CTX[0], CTX[1], and CTX[2] and the low-level signals CTX[3], CTX[4], and CTX[5] are input from the control circuit 11 to the PLD 12 as illustrated in FIG. 11A, so that the context A is selected and the context A performs processing using the multiplex circuit. In contrast, in the case where processing is performed using the context B, the low-level signals CTX[0], CTX[1], and CTX[2] and the high-level signals CTX[3], CTX[4], and CTX[5] are input from the control circuit 11 to the PLD 12 as illustrated in FIG. 11B, so that the context B is selected and the context B performs processing using the multiplex circuit.

Note that although the case where the number of contexts in the PLD 12 is six has been described here, the number of contexts is not particularly limited. In other words, the number of contexts used for multiplexing may be an odd number of three or more, and the number of multiplex circuits may be two or more.

<Modification Example of Memory Circuit>

Figure 12A:
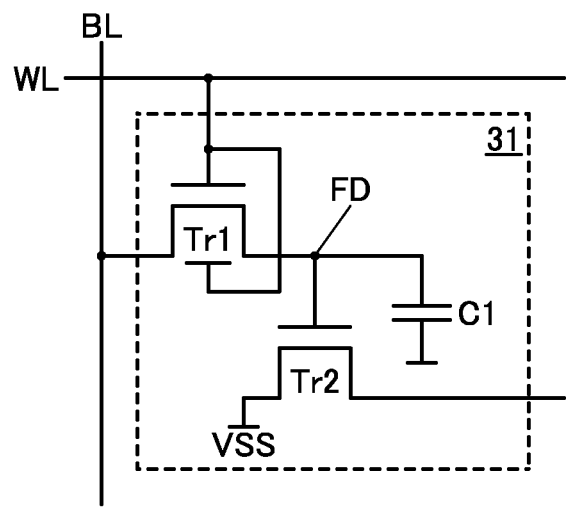
FIGS. 12A to 12C illustrate structure examples of a memory circuit.
Figure 12B:
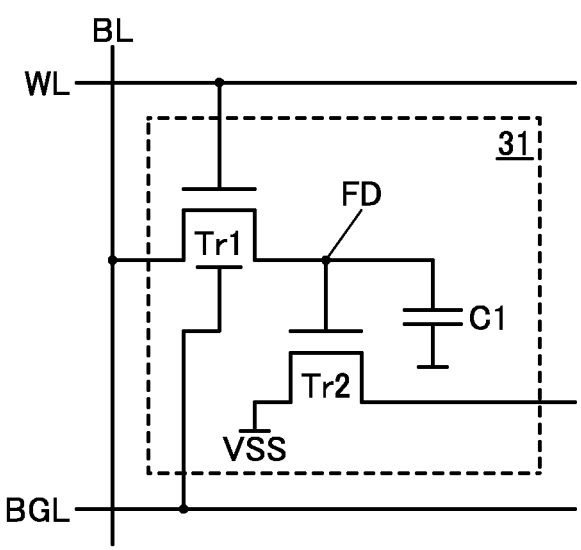

The transistors included in the memory circuits 31 illustrated in FIG. 5 may have a pair of gates. Structure examples where the transistor Tr1 includes a pair of gate electrodes are illustrated in FIGS. 12A and 12B. Here, an OS transistor is used as the transistor Tr1.

Note that when a transistor includes a pair of gates, one of the pair of gates is referred to as a first gate, a front gate, or simply a gate in some cases, and the other thereof is referred to as a second gate or a back gate in some cases.

The transistor Tr1 illustrated in FIG. 12A includes a back gate, and the back gate is connected to a front gate. In this case, the same potential as that of the front gate is applied to the back gate, whereby the on-state current of the transistor Tr1 can be increased. Because the transistor Tr1 is used for writing configuration data, the employment of the structure illustrated in FIG. 12A enables high-speed reading and writing of data.

The back gate of the transistor Tr1 illustrated in FIG. 12B is connected to a wiring BGL. The wiring BGL has a function of supplying a predetermined potential to the backgate. The threshold voltage of the transistor Tr1 can be controlled by controlling the potential of the wiring BGL. Since the transistor Tr1 is used for retention of the potential of the node FD, the off-state current of the transistor Tr1 may be reduced by controlling the potential of the wiring BGL so as to shift the threshold voltage of the transistor Tr1 to the positive side. Note that the potential supplied to the wiring BGL may be either a fixed potential or a variable potential.

The wirings BGL may be separately provided for the individual memory circuits 31, or all or part of the memory circuits 31 included in the PLD 12 may share one wiring BGL.

Although the structures provided with the back gate in the transistor Tr1 have been described here, the transistors Tr2, Tr3, Tr4, and Tr5 may also have a back gate similarly.

Figure 12C:
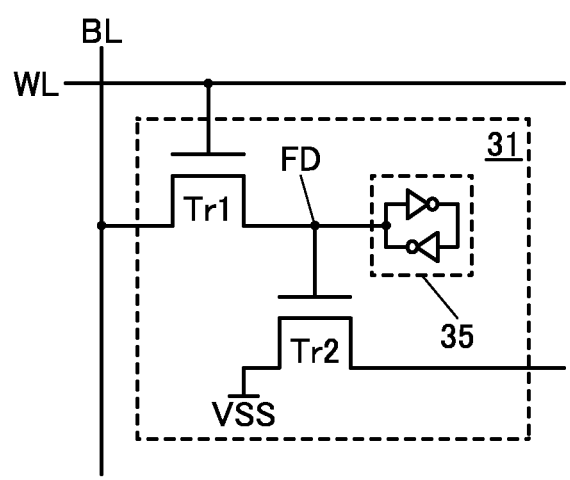

FIG. 12C illustrates another structure example of the memory circuit 31. The memory circuit 31 illustrated in FIG. 12C includes a circuit 35 instead of the capacitor C1. The circuit 35 forms an inverter loop. The potential of the node FD can be kept at a high level or a low level by the circuit 35.

The structures illustrated in FIGS. 12A to 12C can also be used in the memory cells 45 illustrated in FIG. 6.

This embodiment can be combined with any of the other embodiments as appropriate.

Embodiment 3

In this embodiment, a structure example of the detection circuit 13 described in Embodiment 1 will be described. Specifically, a structure in which a multi-level memory is used as the memory device 41 provided in the detection circuit 13 will be described.

Figure 13:
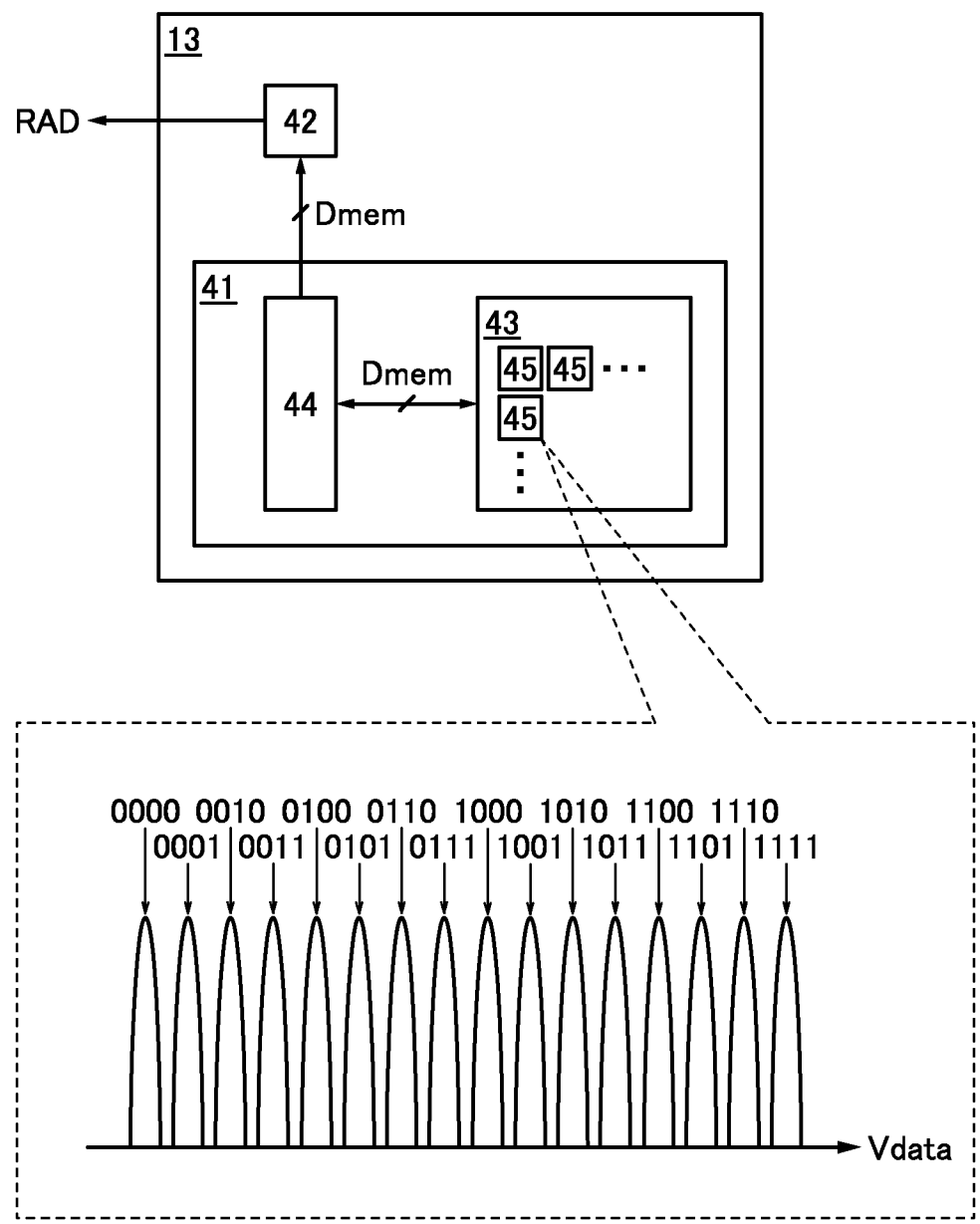
FIG. 13 illustrates a structure example of a detection circuit.

FIG. 13 illustrates a structure example of the detection circuit 13. The detection circuit 13 illustrated in FIG. 13 is different from that illustrated in FIG. 6 in that the memory cells 45 have a function of storing multi-level data. In the following description, as an example, a case where the memory cells 45 each have a function of storing 16-level (4-bit) data is described. However, the number of levels stored in the memory cells 45 is not particularly limited and can be arbitrarily determined.

A potential Vdata corresponding to the data is written to and held in the memory cells 45. In the case where the memory cells 45 store 4-bit data, the potential Vdata has 16 potential levels as illustrated in FIG. 13. The 16 potential levels correspond to the 4-bit data "0000" to "1111".

In the case where multi-level data is stored in the memory cells 45, OS transistors are preferably used in the memory cells. By using OS transistors with an extremely low off-state current, leakage of charges held in the memory cells 45 can be suppressed. Thus, the memory cells 45 can accurately retain multi-level data. In addition, the distribution width of the potential Vdata illustrated in FIG. 13 can be narrowed; accordingly, the number of bits of data that can be stored in the memory cells 45 can be increased.

Furthermore, the OS transistors have a higher withstand voltage than Si transistors. Therefore, when the OS transistors are used in the memory cells 45, the range of the potential Vdata held in the memory cells 45 can be widened. This can increase the number of bits that can be stored in the memory cells 45. Note that specific structure examples of the memory cells 45 using OS transistors will be described in Embodiment 4.

Figure 14A:
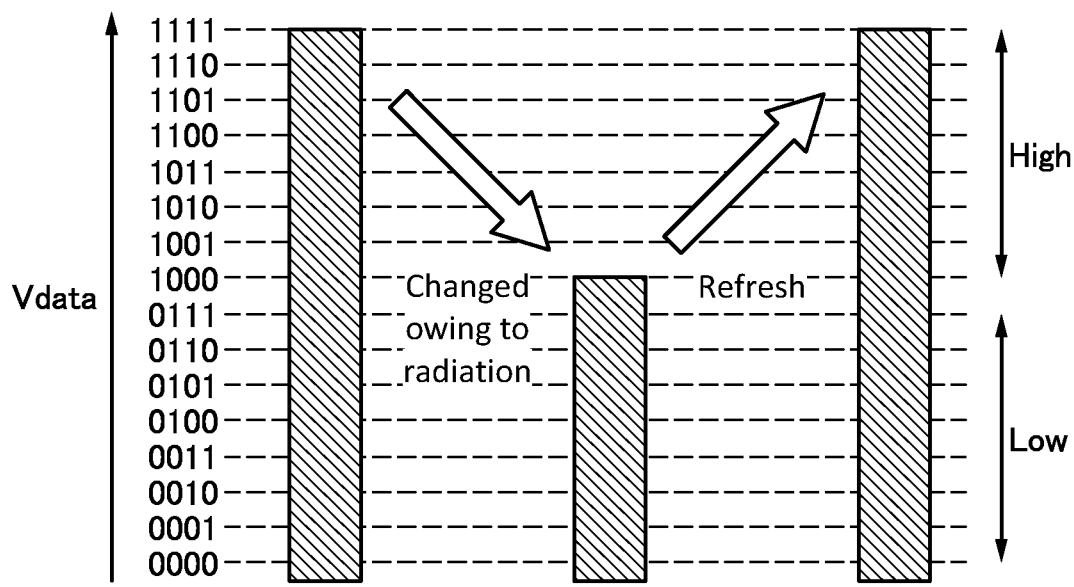
FIGS. 14A and 14B each show transition of data.
Figure 14B:
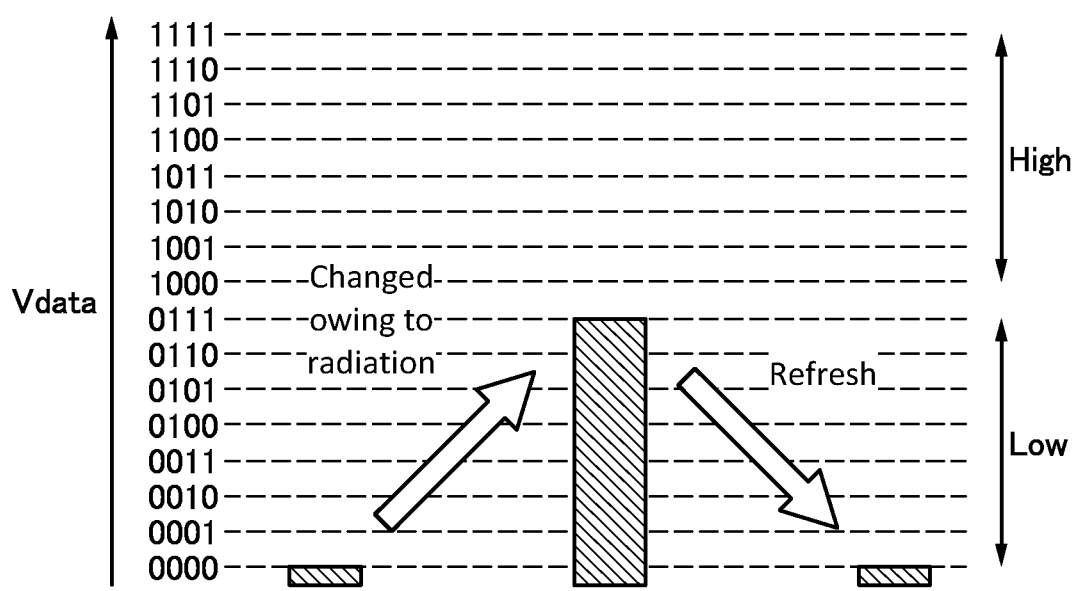

Next, an operation example at the time of switching from the context mode to the radiation-resistant mode with the use of the detection circuit 13 provided with the memory cells 45 which store multi-level data will be described. FIGS. 14A and 14B illustrate examples of the transition of data stored in the memory cell 45.

FIG. 14A illustrates an operation example of the memory cell 45 which stores data "1111" in an initial state. When the memory cell 45 receives radiation and the data changes from "1111" owing to a soft error, the inspection circuit 42 detects a variation of data and generates the signal RAD to switch the PLD 12 (see FIG. 1 or the like) to the radiation-resistant mode. FIG. 14A illustrates a case where the data "1111" is changed to the data "1000" owing to a soft error. Thus, the detection circuit 13 has a function of generating the signal RAD in accordance with a variation of the multi-level data stored in the memory cell 45 to switch the PLD 12 to the radiation-resistant mode.

After the PLD 12 is switched to the radiation-resistant mode, data refresh is performed by writing the data "1111" to the memory cell 45. This brings the memory cell 45 to be in the initial state. In this state, detection of a soft error is possible again.

Here, in the case where the memory cell 45 stores two-level data, even when the potential held in the memory cell 45 varies owing to the radiation, a soft error is not detected as long as the potential variation is within a range where data inversion does not occur. In the case where multi-level data is stored in the memory cell 45, the resolution in detecting a soft error can be improved to the interval in the multi-level data. Therefore, even when the potential variation by the radiation is within a high-level range as illustrated in FIG. 14A, a risk of the occurrence of a soft error can be sensed, so that the switching to the radiation-resistant mode can be conducted in advance.

Note that the condition for switching the PLD 12 to the radiation-resistant mode can be set freely. For example, the condition may be the variation of the data "1111" stored in the memory cell 45 to another data (any of "0000" to "1110") or the variation of a logical value in a specific-order bit (e.g., high-order two bits or high-order three bits). By appropriately setting the condition for switching to the radiation-resistant mode, the sensitivity to a soft error can be adjusted.

In FIG. 14A, the data "1111" is stored in the memory cell 45 in the initial state. However, the data stored in the memory cell 45 in the initial state can be set freely. For example, the data "0000" can be stored in the memory cell 45 in the initial state as illustrated in FIG. 14B. When the PLD 12 is switched to the radiation-resistant mode by the data variation, refreshing of data can be performed by writing the data "0000" to the memory cell 45. The condition for switching to the radiation-resistant mode can be set freely in a manner similar to that in FIG. 14A.

When the memory cell 45 has a function of storing multi-level data as described above, the sensitivity to a soft error in the detection circuit 13 can be improved. Therefore, the semiconductor device 10 can have higher reliability.

This embodiment can be combined with any of the other embodiments as appropriate.

Embodiment 4

In this embodiment, configuration examples of a PLD and a memory device that can be used in the semiconductor device described in the above embodiment will be described.

<Structure Example of PLD>

Figure 15:
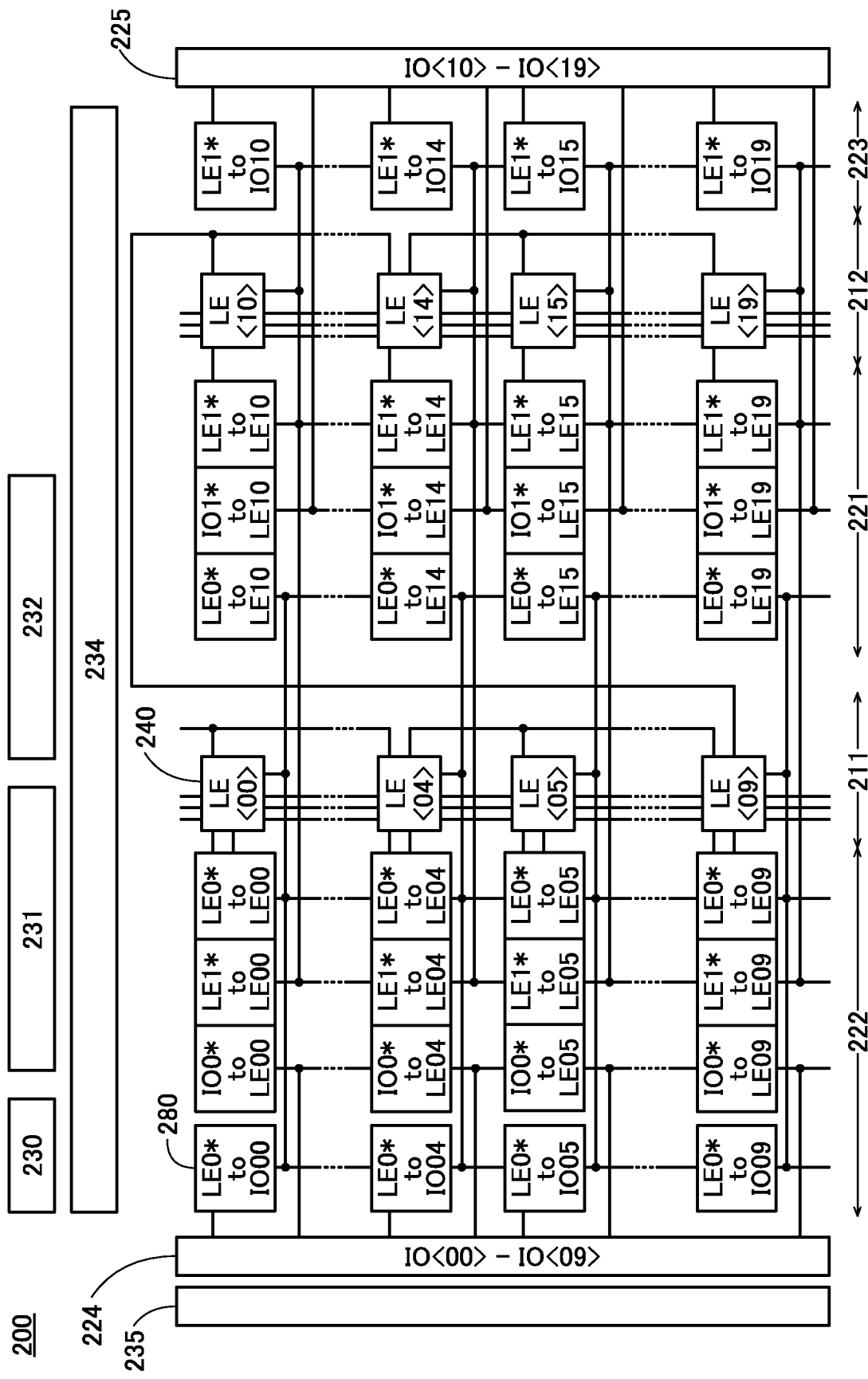
FIG. 15 illustrates a structure example of a PLD.

FIG. 15 illustrates a configuration of a PLD 200. The PLD 200 can be used as the PLD 12 of the above embodiment. A multi-context PLD can be used as the PLD 200.

The PLD 200 includes a logic unit, an input/output unit, and a peripheral circuit unit. The logic unit includes logic arrays (LAs) 211 and 212 and switch arrays (SWAs) 221 to 223. The input/output unit includes input/output arrays (IOAs) 224 and 225. The peripheral circuit unit includes circuits having a function of driving the logic unit and the input/output unit. For example, the peripheral circuit unit includes a clock signal generator 230, a context controller 231, a configuration controller 232, a column driver circuit 234, and a row driver circuit 235.

The context controller 231 and the configuration controller 232 correspond to the control circuit 11 illustrated in FIG. 1 and the control circuit 14 illustrated in FIG. 8, respectively.

The LAs 211 and 212 each include a plurality of LEs 240. In the configuration example of FIG. 15, the LA 211 includes IO LEs 240 (LE <00> to LE <09>), and the LA 212 includes IO LEs 240 (LE <10> to LE <19>); however, the number of LEs 240 can be determined freely. The IOAs 224 and 225 have a function of controlling input and output of signals between external terminals of the PLD 200 and the LAs 211 and 212.

The IOAs 224 and 225 each include a plurality of input/output circuits (IOs). In the configuration example of FIG. 15, the IOA 224 includes IO input/output circuits (IO <00> to IO <09>), and the IOA 225 includes IO input/output circuits (IOs <10> to <19>). The IO <00> to IO <19> are connected to different external terminals from each other.

The SWAs 221 to 223 each include a plurality of RSs 280. The expressions in the RSs 280 in the drawing represent the functions of the RSs 280. For example, an RS 280 expressed as "LE0* to IO00" has a function of a switch between the output nodes of the LE <00> to LE <09> and the input node of the IO<00>, and determines the connection between the LE <00> to LE <09> and the IO<00> in accordance with configuration data and data for selecting a context (hereinafter also referred to as context data).

The clock signal generator 230 has a function of generating one or more clock signals used in the PLD 200. The column driver circuit 234 has a function of generating configuration data. The row driver circuit 235 has a function of generating a signal for selecting a configuration memory. The configuration controller 232 has a function of controlling the column driver circuit 234 and the row driver circuit 235. The context controller 231 has a function of generating context data.

Figure 16:
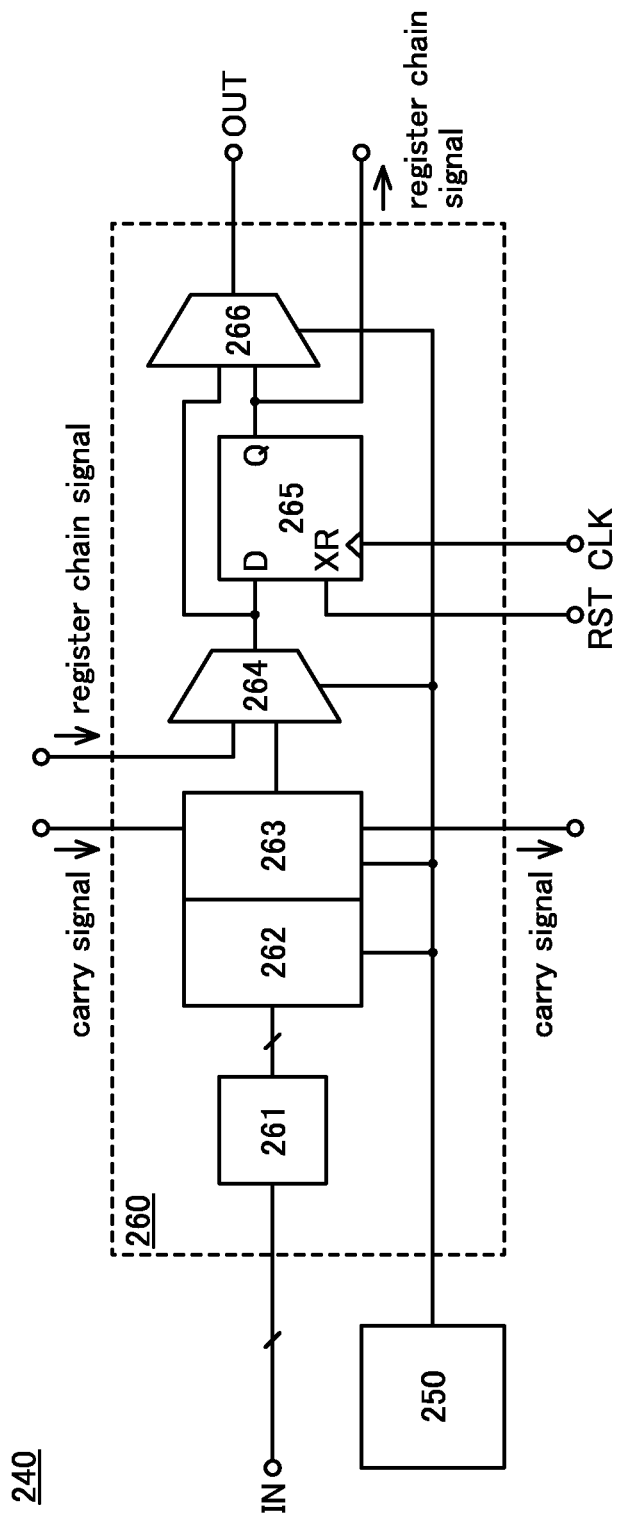
FIG. 16 illustrates a structure example of an LE.

FIG. 16 illustrates a configuration example of the LE 240. The LE 240 is a programmable logic circuit and includes a configuration memory unit 250 and a logic cell (LCELL) 260.

The configuration memory unit 250 has a function of storing configuration data. The function of the LE 240 is determined in accordance with configuration data stored in the configuration memory unit 250. As the configuration memory unit 250, the memory circuit 31 illustrated in FIG. 5 can be used.

The LE 240 has a function of generating data by subjecting input data IN to a predetermined logical operation and outputting the data as output data OUT. The LE 240 includes an exclusive OR (XOR) circuit group 261, an LUT 262, a carry logic 263, a selector (SEL) 264, a flip-flop (FF) 265, and a selector (SEL) 266. The FF 265 has a function of a register. The FF 265 includes a terminal D to which data is input, a terminal XR to which a reset signal RST is input, a terminal to which a clock signal CLK is input, and a terminal Q from which data is output. The logic function of the LCELL 260 is controlled by the configuration data output from the configuration memory unit 250.

The data IN is input from an RS 280. Furthermore, the data OUT is output to another RS 280. In the case where a carry chain is formed with a plurality of LEs 240, input and output of carry signals are performed between the plurality of LEs 240. In the case where a register chain is formed with a plurality of LEs 240, input and output of register chain signals are performed between the adjacent LEs 240.

The LEs 240 and the RSs 280 in the PLD 200 each include a configuration memory. A configuration memory includes a memory circuit having a function of storing configuration data. The memory circuit included in the configuration memory may be volatile or nonvolatile. Examples of the volatile memory circuit include an SRAM. Examples of the nonvolatile memory circuit include a flash memory, a ferroelectric random access memory (FeRAM), a magnetoresistive random access memory (MRAM), a phase change random access memory (PRAM), and a resistive random access memory (ReRAM).

It is particularly preferable to use an OS transistor in the memory circuit as described in the above embodiment. When an OS transistor is included in the configuration memory, the configuration memory can retain configuration data for a significantly long time.

<Configuration Example of Memory Device>

Next, a configuration example of a memory device which can be used in the detection circuit 13 illustrated in FIG. 6 will be described.

Figure 17A:
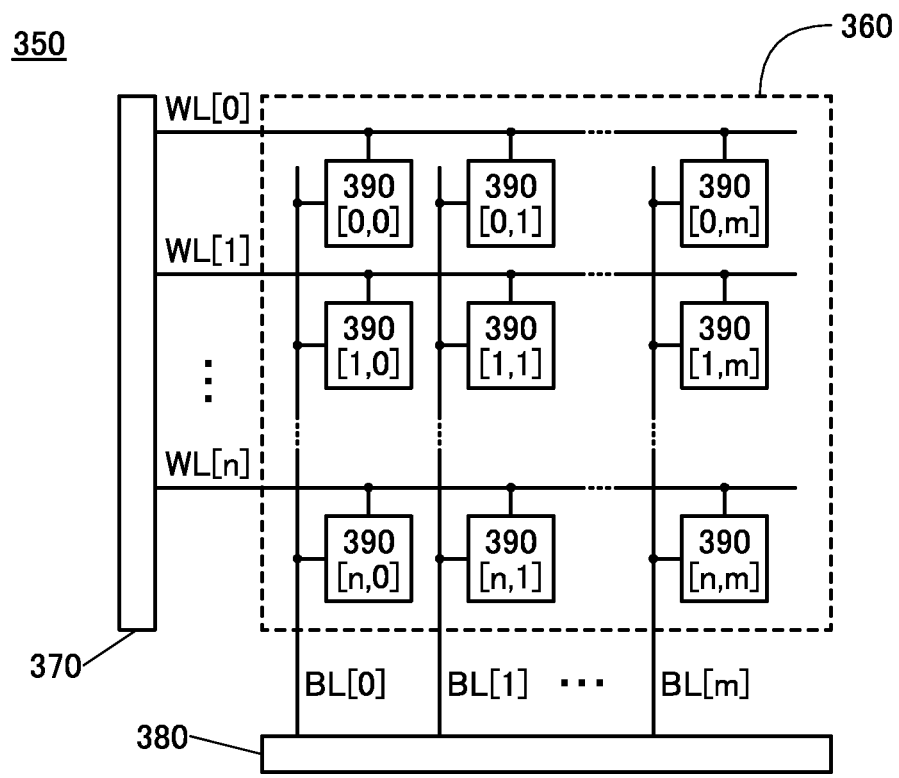
FIGS. 17A to 17D illustrate structure examples of a memory device.

FIG. 17A illustrates a configuration example of a memory device 350. The memory device 350 can be used as the memory device 41 in the above embodiment. The memory device 350 includes a cell array 360, a driver circuit 370, and a driver circuit 380. The cell array 360 includes a plurality of memory cells 390. Here, the cell array 360 includes (n+1)×(m+1) memory cells 390 (390[0,0] to 390[$n,m$]) (n and m are natural numbers).

Figure 17B:
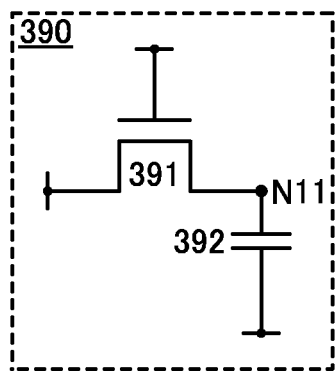

A configuration is preferable in which data can be retained in the memory cell 390 even in a period during which the power supply is stopped. An OS transistor is preferably used as a transistor in the memory cell 390 because of its extremely low off-state current. Specifically, as illustrated in FIG. 17B, the memory cell 390 is preferably provided with a transistor 391 which is an OS transistor and a capacitor 392.

One of a source and a drain of the transistor 391 is connected to the capacitor 392. Here, a node which is connected to the one of the source and the drain of the transistor 391 and the capacitor 392 is referred to as a node N11.

A potential to be retained in the memory cell 390 is supplied to the node N11 from a wiring BL or the like through the transistor 391. When the transistor 391 is in an off state, the node N11 is in a floating state and thus the potential of the node N11 is retained. Since the off-state current of the transistor 391 which is an OS transistor is extremely low, the potential of the node N11 can be retained for a long time. The conduction state of the transistor 391 can be controlled by supply of a predetermined potential to a wiring which is connected to a gate of the transistor 391.

Figure 17C:
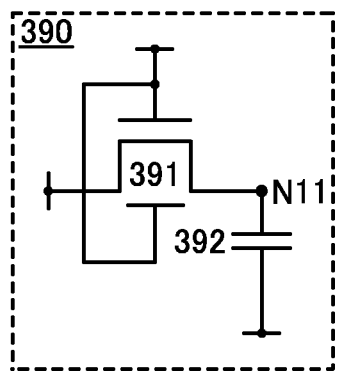
Figure 17D:
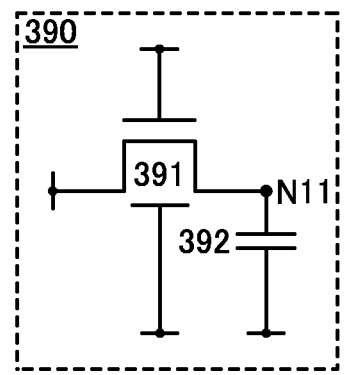

The OS transistor may include a back gate. FIGS. 17C and 17D each illustrate an example in which the transistor 391 includes a back gate. The back gate of the transistor 391 in FIG. 17C is connected to a front gate of the transistor 391. The back gate of the transistor 391 in FIG. 17D is connected to a wiring to which a predetermined potential is supplied.

With the use of the OS transistor in the memory cell 390 in such a manner, a highly reliable semiconductor device in which data stored in the memory cell 390 can be retained for a long time can be provided. Specific configuration examples of the memory cell 390 will be described below.

Figure 18A:
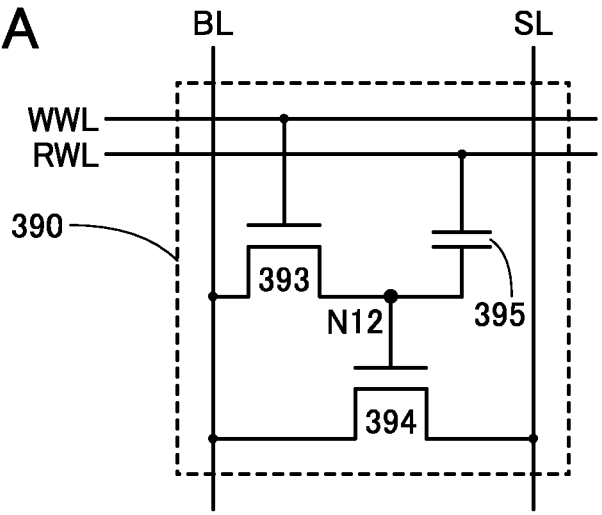
FIGS. 18A to 18C each illustrate a structure example of a memory cell.

FIG. 18A illustrates a configuration example of the memory cell 390. The memory cell 390 illustrated in FIG. 18A includes transistors 393 and 394 and a capacitor 395. Note that the transistor 393 is an OS transistor. Although the transistor 394 is an n-channel transistor here, the transistor 394 may be a p-channel transistor.

A gate of the transistor 393 is connected to a wiring WWL. One of a source and a drain of the transistor 393 is connected to a gate of the transistor 394 and one electrode of the capacitor 395. The other of the source and the drain of the transistor 393 is connected to the wiring BL. One of a source and a drain of the transistor 394 is connected to the wiring SL, and the other of the source and the drain is connected to the wiring BL. The other electrode of the capacitor 395 is connected to a wiring RWL. Here, a node which is connected to the one of the source and the drain of the transistor 393, the gate of the transistor 394, and the one electrode of the capacitor 395 is referred to as a node N12.

The wiring WWL has a function of transmitting a selection signal to the memory cell 390 to which data is written. The wiring RWL has a function of transmitting a selection signal to the memory cell 390 from which data is read. The wiring BL has a function of transmitting a potential corresponding to data written to the memory cell 390 (hereinafter also referred to as a write potential) or a potential corresponding to data stored in the memory cell 390 (hereinafter also referred to as a read potential). The wiring SL is supplied with a predetermined potential. The predetermined potential may be a fixed potential, or may be two or more different potentials. Note that the wiring WWL and the wiring RWL are connected to the driver circuit 370. The wiring SL may be connected to the driver circuit 370 or the driver circuit 380, or may be connected to a power supply line provided separately from the driver circuit 370 and the driver circuit 380.

When an OS transistor is used as the transistor 393, the transistor 393 in the off state enables the potential of the node N12 to be retained for an extremely long time.

Next, an operation of the memory cell 390 illustrated in FIG. 18A will be described. First, the potential of the wiring WWL is set to a potential at which the transistor 393 is turned on, so that the transistor 393 is turned on. Accordingly, the potential of the wiring BL is supplied to the node N12. That is, a predetermined charge is supplied to the gate electrode of the transistor 394 (data writing).

After that, the potential of the wiring WWL is set to a potential at which the transistor 393 is turned off, so that the transistor 393 is turned off. This makes the node N12 floating, so that the potential of the node N12 is retained (data retention).

Next, the potential of the wiring SL is fixed to a constant potential, and then, the potential of the wiring RWL is set to a predetermined potential, so that the potential of the wiring BL varies depending on the amount of charge retained at the node N12. This is because, in general, in the case where the transistor 394 is an n-channel transistor, an apparent threshold voltage $V_{th\_H}$ at the time when the potential of the gate of the transistor 394 is at the high level is lower than an apparent threshold voltage $V_{th\_L}$ at the time when the potential of the gate of the transistor 394 is at the low level. Here, the apparent threshold voltage refers to the potential of the wiring RWL which is needed to turn on the transistor 394. Thus, by setting the potential of the wiring RWL to a potential $V_0$ which is between $V_{th\_H}$ and $V_{th\_L}$, the potential of the node N12 can be determined. For example, in the case where the potential of the node N12 is at the high level, the transistor 394 is turned on when the potential of the wiring RWL becomes $V_0$ ($>V_{th\_H}$). In the case where the potential of the node N12 is at the low level, the transistor 394 remains in the off state even when the potential of the wiring RWL becomes $V_0$ ($<V_{th\_L}$). Thus, the data stored in the memory cell 390 can be read out by determining the potential of the wiring BL.

In the case where the data reading is not performed, a potential at which the transistor 394 is turned off regardless of the potential of the node N12, that is, a potential lower than $V_{th\_H}$ may be supplied to the wiring RWL.

Rewriting of data can be performed in a manner similar to that of the writing and retaining of data. Specifically, the potential of the wiring WWL is set to a potential at which the transistor 393 is turned on, so that the transistor 393 is turned on. Accordingly, the potential of the wiring BL which corresponds to data to be rewritten is supplied to the node N12. After that, the potential of the wiring WWL is set to a potential at which the transistor 393 is turned off, so that the transistor 393 is turned off. This makes the node N12 floating, so that the potential corresponding to the rewritten data is retained at the node N12.

Since the transistor 393 is an OS transistor with an extremely low off-state current, the potential of the node N12 can be maintained for a long time in the retention period. Consequently, even in a period during which the power supply to the memory cell 390 is stopped, data can be retained.

Figure 18B:
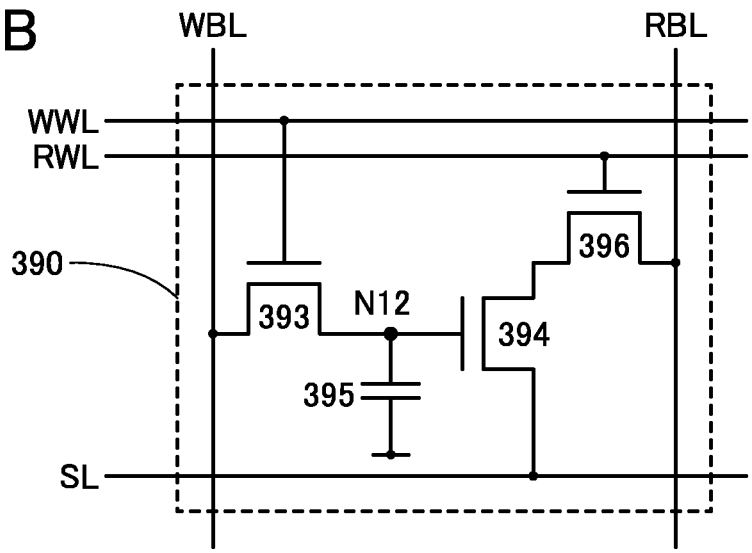

Although FIG. 18A illustrates a configuration in which the data writing and the data reading are performed using the same wiring BL, the data writing and the data reading may be performed using different wirings. In other words, the other of the source and the drain of the transistor 393 and the other of the source and the drain of the transistor 394 may be connected to different wirings. In addition, the transistor 394 may be connected to the wiring BL through another transistor, or the transistor 394 may be connected to the wiring SL through another transistor. FIG. 18B illustrates a modification example of the memory cell 390 in FIG. 18A.

The memory cell 390 illustrated in FIG. 18B includes the transistors 393 and 394, the capacitor 395, and a transistor 396. Although the transistors 394 and 396 are n-channel transistors here, the transistors 394 and 396 may be p-channel transistors.

A gate of the transistor 393 is connected to the wiring WWL. One of a source and a drain of the transistor 393 is connected to a gate of the transistor 394 and one electrode of the capacitor 395. The other of the source and the drain of the transistor 393 is connected to a wiring WBL. One of a source and a drain of the transistor 394 is connected to the wiring SL, and the other of the source and the drain is connected to one of a source and a drain of the transistor 396. A gate of the transistor 396 is connected to the wiring RWL, and the other of the source and the drain of the transistor 396 is connected to a wiring RBL. The other electrode of the capacitor 395 is connected to a wiring to which a predetermined potential is supplied.

The memory cell 390 in FIG. 18B includes different wirings, the wiring WBL and the wiring RBL, as the wiring BL. The wiring WBL has a function of transmitting the write potential, and the wiring RBL has a function of transmitting the read potential.

In FIG. 18B, the potential of the wiring RWL is set to a potential at which the transistor 396 is turned on, so that the transistor 396 is turned on. Accordingly, the read potential can be output to the wiring RBL. That is, data reading from the memory cell 390 can be controlled by a signal supplied to the wiring RBL.

Figure 18C:
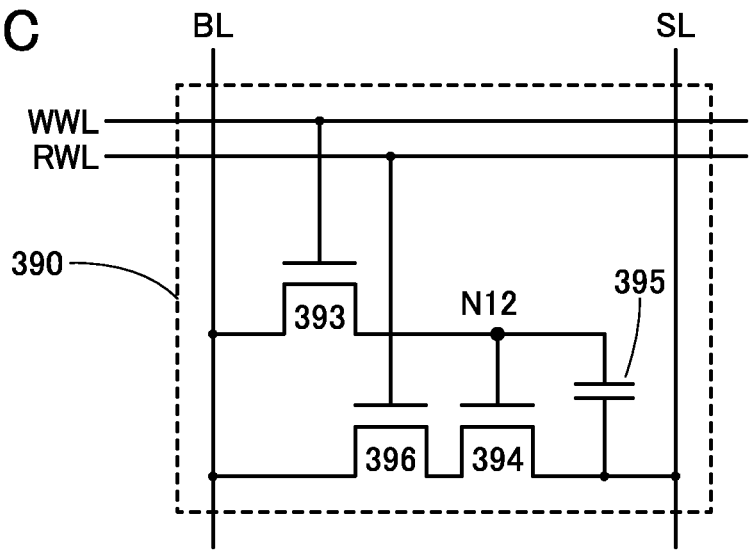

In FIG. 18B, the wiring WBL and the wiring RBL may be the single wiring BL. FIG. 18C illustrates such a configuration of the memory cell 390. In FIG. 18C, the transistor 393 and the transistor 396 are connected to the wiring BL. The capacitor 395 is connected to the wiring SL.

Note that the transistor 393 and the transistor 394 (and the transistor 396) in FIGS. 18A to 18C can be stacked. For example, an insulating layer can be provided above the transistor 394, and the transistor 393 which is an OS transistor and the capacitor 395 can be provided above the insulating layer. Accordingly, the area of the memory cell 390 can be reduced.

When the OS transistor is used in the memory cell 390 as described above, data stored in the memory cell 390 can be retained for a long time. Data stored in the memory cell 390 can be retained even in a period during which power supply to the memory cell 390 is stopped.

Furthermore, the memory cells 390 illustrated in FIGS. 18A to 18C have a structure in which data is retained in the node that is connected to one of the source and the drain of the transistor and one electrode of the capacitor, in a manner similar to that of the memory circuit 31 illustrated in FIG. 5. When the memory circuit 31 and the memory cell 390 have similar structures in this manner, the timing of the occurrence of a soft error in the configuration memory in the PLD 12 can well match the timing of switching the signal RAD (see FIG. 1 or the like).

Note that the memory cells 390 illustrated in FIGS. 17A to 17D and FIGS. 18A to 18C can store multi-level data. Accordingly, the detection circuit 13 including a multi-level memory described in Embodiment 3 can be formed. For example, in the case where multi-level data is stored in the memory cell 390 illustrated in FIG. 18A, supplying potentials of three or more levels to the wiring BL enables a supply of potentials of three or more levels to the node N12. Data can be read from the memory cell 390 by supplying a potential that changes step by step to the wiring RWL and monitoring the change in the potential of the wiring BL, for example. Alternatively, data can be read with the value of a current which is supplied to the wiring BL in accordance with the potential of the node N12.

This embodiment can be combined with any of the other embodiments as appropriate.

Embodiment 5

In this embodiment, a structure example of a display system including the semiconductor device described in the above embodiment will be described.

Figure 19:
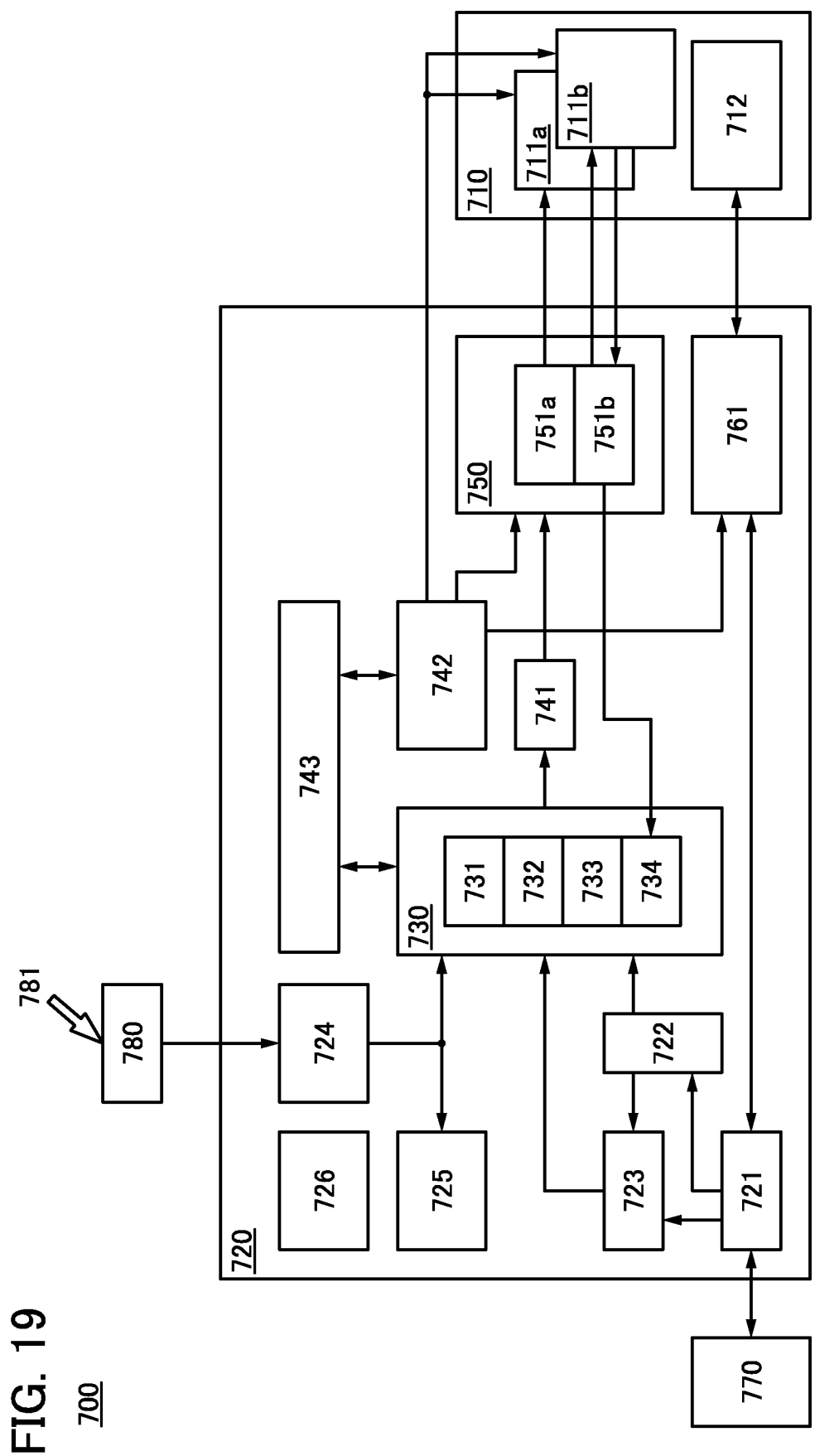
FIG. 19 illustrates a structure example of a display system.

FIG. 19 illustrates a structure example of a display system 700 including a display portion 710 and a control portion 720 having a function of controlling the operation of the display portion 710. The control portion 720 includes an interface 721, a frame memory 722, a decoder 723, a sensor controller 724, a controller 725, a clock generation circuit 726, an image processing portion 730, a memory device 741, a timing controller 742, a register 743, a driver circuit 750, and a touch sensor controller 761.

The display portion 710 has a function of displaying an image on a display unit 711 using an image signal input from the control portion 720. In addition, the display portion 710 may include a touch sensor unit 712 having a function of obtaining information on whether an object touches, where an object touches, or the like. In the case where the display portion 710 does not include the touch sensor unit 712, the touch sensor controller 761 may be omitted.

The display unit 711 has a function of performing display with a display element. Examples of the display element include a liquid crystal element and a light-emitting element. As the liquid crystal element, a transmissive liquid crystal element, a reflective liquid crystal element, a transflective liquid crystal element, or the like can be used. Alternatively, for example, a micro electro mechanical systems (MEMS) shutter element, an optical interference type MEMS element, or a display element using a microcapsule method, an electrophoretic method, an electrowetting method, an Electronic Liquid Powder (registered trademark) method, or the like can be used as the display element. Examples of the light-emitting element include a self-luminous element such as an organic light-emitting diode (OLED), a light-emitting diode (LED), a quantum-dot light-emitting diode (QLED), and a semiconductor laser.

The number of display units 711 provided in the display portion 710 may be one or two or more. Here, as an example, a structure in which the display portion 710 includes a display unit 711a that performs display using a reflective liquid crystal element and a display unit 711b that performs display using a light-emitting element, will be described.

The driver circuit 750 includes a source driver 751. The source driver 751 is a circuit having a function of supplying an image signal to the display unit 711. Since the display portion 710 includes the display units 711a and 711b in FIG. 19, the driver circuit 750 includes source drivers 751a and 751b.

Communication between the control portion 720 and a host 770 can be performed through the interface 721. Image data, various control signals, and the like are transmitted from the host 770 to the control portion 720. In addition, information on whether an object touches, where an object touches, or the like which the touch sensor controller 761 obtains is transmitted from the control portion 720 to the host 770. Note that the circuits included in the control portion 720 can be selected as appropriate in accordance with the standard of the host 770, the specifications of the display portion 710, and the like. The host 770 corresponds to the processor or the like that controls operation of the control portion 720.

The frame memory 722 is a memory circuit having a function of storing image data input to the control portion 720. In the case where compressed image data is transmitted from the host 770 to the control portion 720, the frame memory 722 can store the compressed image data. The decoder 723 is a circuit for decompressing the compressed image data. When decompression of the image data is not needed, processing is not performed in the decoder 723. Note that the decoder 723 can be provided between the frame memory 722 and the interface 721.

The image processing portion 730 has a function of performing various kinds of image processing on image data input from the frame memory 722 or the decoder 723 and generating an image signal. For example, the image processing portion 730 includes a gamma correction circuit 731, a dimming circuit 732, and a toning circuit 733.

In the case where the source driver 751b includes a circuit (current sensing circuit) having a function of sensing current which flows to a light-emitting element included in the display unit 711b, an EL correction circuit 734 may be provided in the image processing portion 730. The EL correction circuit 734 has a function of adjusting the luminance of the light-emitting element on the basis of a signal transmitted from the current sensing circuit.

An image signal generated in the image processing portion 730 is output to the driver circuit 750 through the memory device 741. The memory device 741 has a function of temporarily storing image data. The source drivers 751a and 751b have a function of performing various kinds of processing on image signals input from the memory device 741 and outputting the signals to the display units 711a and 711b.

The timing controller 742 has a function of generating timing signals and the like used in the driver circuit 750, the touch sensor controller 761, and the driver circuit included in the display unit 711.

The touch sensor controller 761 has a function of controlling the operation of the touch sensor unit 712. A signal including touch information sensed by the touch sensor unit 712 is processed in the touch sensor controller 761 and transmitted to the host 770 through the interface 721. The host 770 generates image data in accordance with the touch information and transmits the image data to the control portion 720. The control portion 720 may have a function of incorporating the touch information in the image data. The touch sensor controller 761 may be provided in the touch sensor unit 712.

The clock generation circuit 726 has a function of generating a clock signal used in the control portion 720. The controller 725 has a function of processing a variety of control signals transmitted from the host 770 through the interface 721 and controlling a variety of circuits in the control portion 720. The controller 725 also has a function of controlling power supply to the variety of circuits in the control portion 720. For example, the controller 725 can temporarily interrupt the power supply to a circuit which is not driven.

The register 743 has a function of storing data used for the operation of the control portion 720. Examples of the data stored in the register 743 include a parameter used to perform correction processing in the image processing portion 730 and parameters used to generate waveforms of a variety of timing signals in the timing controller 742. The register 743 includes a scan chain register including a plurality of registers.

The sensor controller 724 connected to a photosensor 780 can be provided in the control portion 720. The photosensor 780 has a function of sensing external light 781 and generating a sensing signal. The sensor controller 724 has a function of generating a control signal on the basis of the sensing signal. The control signal generated in the sensor controller 724 is output to the controller 725, for example.

In the case where the display units 711a and 711b display the same image, the image processing portion 730 has a function of separately generating an image signal of the display unit 711a and an image signal of the display unit 711b. In that case, in accordance with the brightness of the external light 781 measured by the photosensor 780 and the sensor controller 724, the reflection intensity of the reflective liquid crystal element included in the display unit 711a and the emission intensity of the light-emitting element included in the display unit 711b can be adjusted. Here, the adjustment can be referred to as dimming or dimming treatment. In addition, a circuit that performs the dimming treatment is referred to as a dimming circuit.

The image processing portion 730 may include another processing circuit such as an RGB-RGBW conversion circuit depending on the specifications of the display portion 710. The RGB-RGBW conversion circuit has a function of converting image data of red, green, and blue (RGB) into image signals of red, green, blue, and white (RGBW). That is, in the case where the display portion 710 includes pixels of four colors of RGBW, power consumption can be reduced by displaying a white (W) component in the image data using the white (W) pixel. Note that in the case where the display portion 710 includes pixels of four colors of RGBY, a RGB-RGBY (red, green, blue, and yellow) conversion circuit can be used, for example.

Note that although the case in which the display unit 711a includes the reflective liquid crystal element and the display unit 711b includes the light-emitting element has been described above, the display elements provided in the display units 711a and 711b are not particularly limited and can be freely selected. For example, a transmissive liquid crystal element may be provided in one of the display units 711a and 711b, and a reflective liquid crystal element may be provided in the other. In this case, a transflective liquid crystal element is formed. Alternatively, different kinds of light-emitting elements can be provided in the display units 711a and 711b.

The control portion 720 can include the semiconductor device described in the above embodiment. For example, the image processing portion 730 may include the semiconductor device 10, and the PLD 12 may include a context that generates an image signal for the display unit 711a and a context that generates an image signal for the display unit 711b. In this case, switching between a circuit which generates the image signal for the display unit 711a and a circuit which generates an image signal for the display unit 711b can be performed by a multi-context method.

Furthermore, in the case where the display system 700 is used in a place where the amount of radiation is large, a multiplex circuit can be formed in the image processing portion 730 to generate an image signal. Accordingly, errors of image signals can be reduced.

This embodiment can be combined with any of the other embodiments as appropriate.

Embodiment 6

In this embodiment, structure examples of a display device that can be used for the display system described with reference to FIG. 19 will be described. Here, structure examples of a display device provided with various kinds of display elements will be specifically described.

A hybrid display method can be applied to the display device of this embodiment. Note that the hybrid display method is a method for displaying a plurality of lights in one pixel unit to display a letter and/or an image. The hybrid display is an aggregate which display a plurality of lights in one pixel unit included in a display portion to display a letter and/or an image.

As an example of the hybrid display method, a method in which first light and second light are displayed at different timings in one pixel unit can be given. At this time, in one pixel unit, the first light and the second light having the same color tone (any one of red, green, and blue, or any one of cyan, magenta, and yellow) can be displayed at the same time, and a letter and/or an image can be displayed on a display portion.

As another example of the hybrid display method, a method in which reflected light and self-emission light are displayed in one pixel unit can be given. Reflected light and self-emission light (e.g., OLED light, LED light) having the same color tone can be displayed at the same time in one pixel unit.

Note that in a hybrid display method, a plurality of lights may be displayed in not one pixel unit but adjacent pixel units. Furthermore, displaying first light and second light at the same time means displaying the first light and the second light for the same length of time to the extent that flickering is not perceived by a viewer's eye. As long as flickering is not perceived by a viewer's eye, the display period of the first light may deviate from the display period of the second light.

Moreover, the hybrid display is an aggregate which includes a plurality of display elements in one pixel unit and in which each of the plurality of display elements performs display in the same period. The hybrid display includes the plurality of display elements and active elements for driving the display elements in one pixel unit. As the active elements, switches, transistors, thin film transistors, or the like can be given. The active element is connected to each of the plurality of display elements, so that display of the plurality of display elements can be individually controlled.

The display device of this embodiment includes a first display element and a second display element. A case where the first display element is a display element reflecting visible light and the second display element is a display element emitting visible light will be described. The display device of this embodiment has a function of displaying an image using one or both of light reflected by the first display element and light emitted from the second display element.

As the first display element, an element which displays an image by reflecting external light can be used. Such an element does not include a light source; thus, power consumed in displaying an image can be significantly reduced. As a typical example of the first display element, a reflective liquid crystal element can be given. As the first display element, an element using a microcapsule method, an electrophoretic method, an electrowetting method, an Electronic Liquid Powder (registered trademark) method, or the like can also be used, other than a MEMS shutter element or an optical interference type MEMS element.

As the second display element, a light-emitting element is preferably used. Since the luminance and the chromaticity of light emitted from such a display element are not affected by external light, a clear image that has high color reproducibility (wide color gamut) and a high contrast can be displayed. As the second display element, a self-luminous light-emitting element such as an OLED, an LED, or a QLED can be used.

The display device of this embodiment has a first display mode in which an image is displayed using the first display element, a second display mode in which an image is displayed using the second display element, and a third display mode in which an image is displayed using both the first display element and the second display element. The display device of this embodiment can be switched between these modes automatically or manually.

In the first display mode, an image is displayed using the first display element and external light. Because a light source is unnecessary in the first display mode, power consumed in this mode is extremely low. When sufficient external light enters the display device (e.g., in a bright environment), for example, an image can be displayed by using light reflected by the first display element. The first display mode is effective in the case where external light is white light or light near white light and is sufficiently strong, for example. The first display mode is suitable for displaying text. Furthermore, the first display mode enables eye-friendly display owing to the use of reflected external light, which leads to an effect of easing eyestrain.

In the second display mode, an image is displayed using light emitted from the second display element. Thus, an extremely vivid image (with high contrast and excellent color reproducibility) can be displayed regardless of the illuminance and the chromaticity of external light. The second display mode is effective in the case of extremely low illuminance, such as in a night environment or in a dark room, for example. When a bright image is displayed in a dark environment, a user may feel that the image is too bright. To prevent this, an image with reduced luminance is preferably displayed in the second display mode. In that case, glare can be reduced, and power consumption can also be reduced. The second display mode is suitable for displaying a vivid (still and moving) image or the like.

In the third display mode, an image is displayed using both light reflected by the first display element and light emitted from the second display element. An image displayed in the third display mode can be more vivid than an image displayed in the first display mode while power consumption can be lower than that in the second display mode. The third display mode is effective in the case where the illuminance is relatively low or in the case where the chromaticity of external light is not white, for example, in an environment under indoor illumination or in the morning or evening. With the use of the combination of reflected light and emitted light, an image that makes a viewer feel like looking at a painting can be displayed.

With such a structure, an all-weather display device or a highly convenient display device with high visibility regardless of the ambient brightness can be fabricated.

The display device of this embodiment includes a plurality of first pixels including the first display elements and a plurality of second pixels including the second display elements. The first pixels and the second pixels are preferably arranged in matrices.

Each of the first pixels and the second pixels can include one or more sub-pixels. For example, each pixel can include one sub-pixel (e.g., a white (W) sub-pixel), three sub-pixels (e.g., red (R), green (G), and blue (B) sub-pixels, or yellow (Y), cyan (C), and magenta (M) sub-pixels), or four sub-pixels (e.g., red (R), green (G), blue (B), and white (W) sub-pixels, or red (R), green (G), blue (B), and yellow (Y) sub-pixels).

The display device of this embodiment can display a full-color image using either the first pixels or the second pixels. Alternatively, the display device of this embodiment can display a black-and-white image or a grayscale image using the first pixels and can display a full-color image using the second pixels. The first pixels that can be used for displaying a black-and-white image or a grayscale image are suitable for displaying information that need not be displayed in color such as text information.

Note that the first display element and the second display element are not limited to those described above and can be selected freely. For example, one of the first display element and the second display element can be a transmissive liquid crystal element, and the other thereof can be a reflective liquid crystal element. In this case, a transflective liquid crystal element can be formed.

The display device of this embodiment can operate in the above-described several display modes because of including several kinds of display elements. Thus, the display device can change its display mode in accordance with the ambient environment, so that the display device can have high visibility. When the display device of this embodiment is combined with the display system including the semiconductor device described in the above embodiment (see FIG. 19), the operation mode of the circuit which generates an image signal can be switched in accordance with the amount of radiation in the place of use. Therefore, the display device can be used in various environments.

<Structure Example of Display Device>

Structure examples of a display device of this embodiment will be described with reference to FIG. 20, FIG. 21, FIG. 22, and FIG. 23.

Structure Example 1

Figure 20:
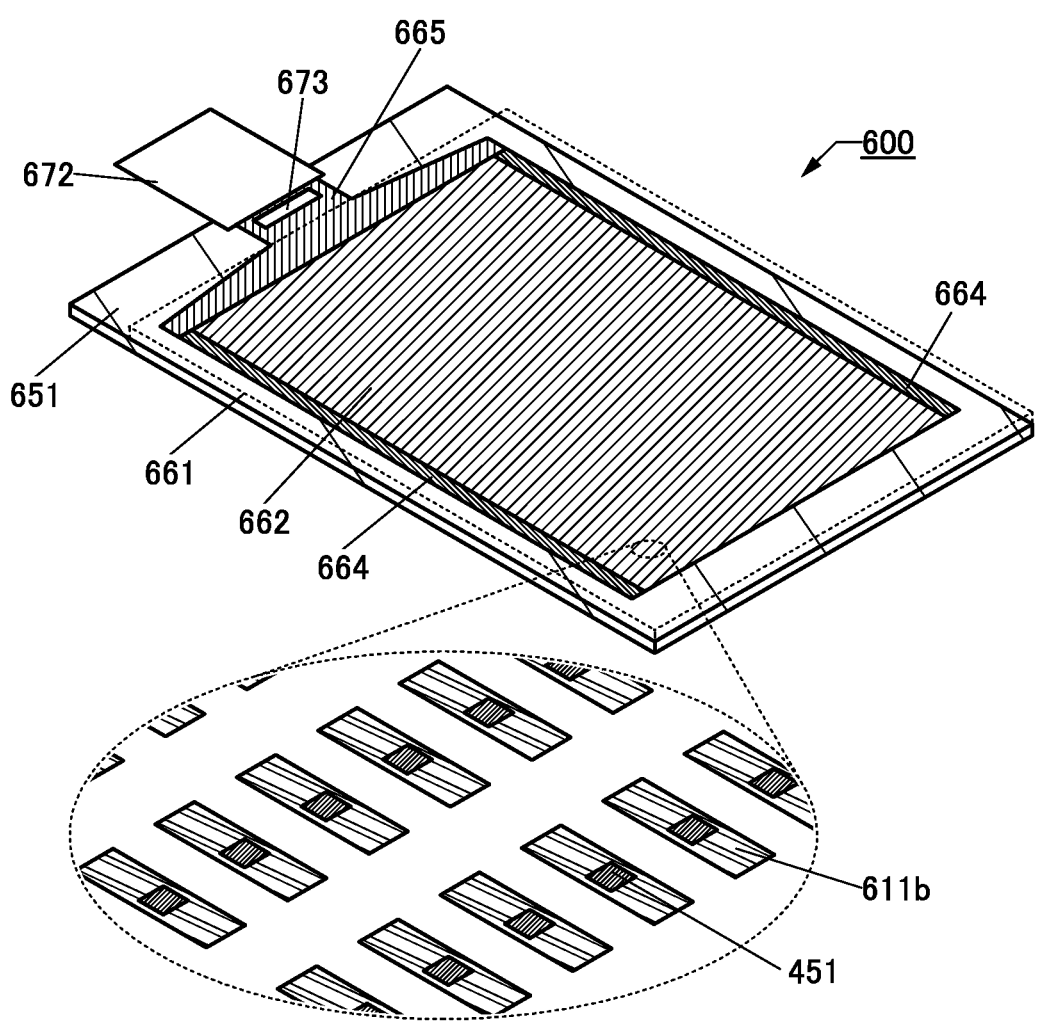
FIG. 20 illustrates a structure example of a display device.

FIG. 20 is a schematic perspective view of a display device 600. In the display device 600, a substrate 651 and a substrate 661 are bonded to each other. In FIG. 20, the substrate 661 is denoted by a dashed line.

The display device 600 includes a display portion 662, a circuit 664, a wiring 665, and the like. FIG. 20 illustrates an example in which the display device 600 is provided with an integrated circuit (IC) 673 and an FPC 672. Thus, the structure illustrated in FIG. 20 can be regarded as a display module including the display device 600, the IC 673, and the FPC 672.

As the circuit 664, for example, a scan line driver circuit can be used.

The wiring 665 has a function of supplying a signal and power to the display portion 662 and the circuit 664. The signal and power are input to the wiring 665 from the outside through the FPC 672 or from the IC 673.

FIG. 20 illustrates an example in which the IC 673 is provided over the substrate 651 by a COG method, a COF method, or the like. An IC including a scan line driver circuit, a signal line driver circuit, or the like can be used as the IC 673, for example. Note that the display device 600 and the display module are not necessarily provided with an IC. The IC may be provided over the FPC by a COF method or the like.

FIG. 20 also illustrates an enlarged view of part of the display portion 662. Electrodes 611b included in a plurality of display elements are arranged in a matrix in the display portion 662. The electrode 611b has a function of reflecting visible light, and serves as a reflective electrode of a liquid crystal element.

As illustrated in FIG. 20, the electrode 611b includes an opening 451. In addition, the display portion 662 includes a light-emitting element that is positioned closer to the substrate 651 than the electrode 611b is. Light from the light-emitting element is emitted to the substrate 661 side through the opening 451 in the electrode 611b. The area of the light-emitting region of the light-emitting element may be equal to the area of the opening 451. One of the area of the light-emitting region of the light-emitting element and the area of the opening 451 is preferably larger than the other because a margin for misalignment can be increased. It is particularly preferable that the area of the opening 451 be larger than the area of the light-emitting region of the light-emitting element. When the area of the opening 451 is small, part of light from the light-emitting element is blocked by the electrode 611b and cannot be extracted to the outside, in some cases. The opening 451 with a sufficiently large area can reduce waste of light emitted from the light-emitting element.

Figure 21:
FIG. 21 illustrates a structure example of a display device.

FIG. 21 illustrates an example of cross sections of part of a region including the FPC 672, part of a region including the circuit 664, and part of a region including the display portion 662 of the display device 600 illustrated in FIG. 20.

The display device 600 illustrated in FIG. 21 includes a transistor 501, a transistor 503, a transistor 505, a transistor 506, a liquid crystal element 480, a light-emitting element 470, an insulating layer 520, a coloring layer 431, a coloring layer 434, and the like between the substrate 651 and the substrate 661. The substrate 661 is bonded to the insulating layer 520 with an adhesive layer 441. The substrate 651 is bonded to the insulating layer 520 with an adhesive layer 442.

The substrate 661 is provided with the coloring layer 431, a light-blocking layer 432, an insulating layer 421, an electrode 413 functioning as a common electrode of the liquid crystal element 480, an alignment film 433b, an insulating layer 417, and the like. A polarizing plate 435 is provided on an outer surface of the substrate 661. The insulating layer 421 may function as a planarization layer. The insulating layer 421 enables the electrode 413 to have a substantially flat surface, resulting in a uniform alignment state of a liquid crystal layer 412. The insulating layer 417 serves as a spacer for holding a cell gap of the liquid crystal element 480. In the case where the insulating layer 417 transmits visible light, the insulating layer 417 may be positioned to overlap with a display region of the liquid crystal element 480.

The liquid crystal element 480 is a reflective liquid crystal element. The liquid crystal element 480 has a stacked-layer structure of an electrode 611a functioning as a pixel electrode, the liquid crystal layer 412, and the electrode 413. The electrode 611b that reflects visible light is provided in contact with a surface of the electrode 611a on the substrate 651 side. The electrode 611b includes the opening 451. The electrode 611a and the electrode 413 transmit visible light. An alignment film 433a is provided between the liquid crystal layer 412 and the electrode 611a. The alignment film 433b is provided between the liquid crystal layer 412 and the electrode 413.

In the liquid crystal element 480, the electrode 611b has a function of reflecting visible light, and the electrode 413 has a function of transmitting visible light. Light entering from the substrate 661 side is polarized by the polarizing plate 435, transmitted through the electrode 413 and the liquid crystal layer 412, and reflected by the electrode 611b. Then, the light is transmitted through the liquid crystal layer 412 and the electrode 413 again to reach the polarizing plate 435. In this case, alignment of liquid crystals can be controlled with a voltage that is applied between the electrode 611b and the electrode 413, and thus optical modulation of light can be controlled. In other words, the intensity of light emitted through the polarizing plate 435 can be controlled. Light excluding light in a particular wavelength region is absorbed by the coloring layer 431, and thus, emitted light is red light, for example.

As illustrated in FIG. 21, the electrode 611a that transmits visible light is preferably provided across the opening 451. Accordingly, liquid crystals are aligned in a region overlapping with the opening 451 as in the other regions, in which case an alignment defect of the liquid crystals is prevented from being generated in a boundary portion of these regions and undesired light leakage can be suppressed.

At a connection portion 507, the electrode 611b is connected to a conductive layer 522a included in the transistor 506 via a conductive layer 521b. The transistor 506 has a function of controlling the driving of the liquid crystal element 480.

A connection portion 552 is provided in part of a region where the adhesive layer 441 is provided. In the connection portion 552, a conductive layer obtained by processing the same conductive film as the electrode 611a is connected to part of the electrode 413 with a connector 543. Accordingly, a signal or a potential input from the FPC 672 connected to the substrate 651 side can be supplied to the electrode 413 formed on the substrate 661 side through the connection portion 552.

As the connector 543, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 543, a material capable of elastic deformation or plastic deformation is preferably used. As illustrated in FIG. 21, the connector 543, which is the conductive particle, has a shape that is vertically crushed in some cases. With the crushed shape, the contact area between the connector 543 and a conductive layer electrically connected to the connector 543 can be increased, thereby reducing contact resistance and suppressing the generation of problems such as disconnection.

The connector 543 is preferably provided so as to be covered with the adhesive layer 441. For example, the connectors 543 are dispersed in the adhesive layer 441 before curing of the adhesive layer 441.

The light-emitting element 470 is a bottom-emission light-emitting element. The light-emitting element 470 has a stacked-layer structure in which an electrode 491 serving as a pixel electrode, an EL layer 492, and an electrode 493 serving as a common electrode are stacked in this order from the insulating layer 520 side. The electrode 491 is connected to a conductive layer 522b included in the transistor 505 through an opening provided in an insulating layer 514. The transistor 505 has a function of controlling the driving of the light-emitting element 470. An insulating layer 516 covers an end portion of the electrode 491. The electrode 493 includes a material that reflects visible light, and the electrode 491 includes a material that transmits visible light. An insulating layer 494 is provided to cover the electrode 493. Light is emitted from the light-emitting element 470 to the substrate 661 side through the coloring layer 434, the insulating layer 520, the opening 451, the electrode 611a, and the like.

The liquid crystal element 480 and the light-emitting element 470 can exhibit various colors when the color of the coloring layer varies among pixels. The display device 600 can display a color image using the liquid crystal element 480. The display device 600 can display a color image using the light-emitting element 470.

The transistor 501, the transistor 503, the transistor 505, and the transistor 506 are formed on a plane of the insulating layer 520 on the substrate 651 side. These transistors can be fabricated using the same process.

A circuit connected to the liquid crystal element 480 and a circuit connected to the light-emitting element 470 are preferably formed on the same plane. In that case, the thickness of the display device can be smaller than that in the case where the two circuits are formed on different planes. Furthermore, since two transistors can be formed in the same process, a manufacturing process can be simplified as compared with the case where two transistors are formed on different planes.

The pixel electrode of the liquid crystal element 480 is positioned on the opposite side of a gate insulating layer included in the transistor from the pixel electrode of the light-emitting element 470.

In the case where an OS transistor is used as the transistor 506 or a memory element connected to the transistor 506 is used, for example, a gray level can be maintained even when writing operation to the pixel is stopped while a still image is displayed using the liquid crystal element 480. That is, display can be maintained even when the frame rate is set to an extremely small value. In one embodiment of the present invention, the frame rate can be extremely low, so that driving with low power consumption can be performed.

The transistor 503 is used for controlling whether the pixel is selected or not (such a transistor is also referred to as a switching transistor or a selection transistor). The transistor 505 is used for controlling current flowing to the light-emitting element 470 (such a transistor is also referred to as a driving transistor).

Insulating layers such as an insulating layer 511, an insulating layer 512, an insulating layer 513, and the insulating layer 514 are provided on the substrate 651 side of the insulating layer 520. Part of the insulating layer 511 functions as a gate insulating layer of each transistor. The insulating layer 512 is provided to cover the transistor 506 and the like. The insulating layer 513 is provided to cover the transistor 505 and the like. The insulating layer 514 functions as a planarization layer. Note that the number of insulating layers covering the transistor is not limited and may be one or two or more.

A material through which impurities such as water and hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be achieved.

Each of the transistors 501, 503, 505, and 506 includes a conductive layer 521a functioning as a gate, the insulating layer 511 functioning as a gate insulating layer, the conductive layer 522a and the conductive layer 522b functioning as a source and a drain, and a semiconductor layer 531. Here, a plurality of layers obtained by processing the same conductive film are shown with the same hatching pattern.

The transistor 501 and the transistor 505 each include a conductive layer 523 functioning as a gate, in addition to the components of the transistor 503 or the transistor 506.

The structure in which the semiconductor layer including a channel formation region is sandwiched between two gates is applied to the transistors 501 and 505. Such a structure enables the control of the threshold voltages of the transistors. The two gates may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Alternatively, by supplying a potential for controlling the threshold voltage to one of the two gates and a potential for driving to the other, the threshold voltage of the transistors can be controlled.

The structure of the transistors included in the display device is not limited. The transistor included in the circuit 664 and the transistor included in the display portion 662 may have the same structure or different structures. A plurality of transistors included in the circuit 664 may have the same structure or a combination of two or more kinds of structures. Similarly, a plurality of transistors included in the display portion 662 may have the same structure or a combination of two or more kinds of structures.

It is preferable to use a conductive material containing an oxide for the conductive layer 523. A conductive film used for the conductive layer 523 is formed in an oxygen-containing atmosphere, whereby oxygen can be supplied to the insulating layer 512. The proportion of an oxygen gas in a deposition gas is preferably higher than or equal to 90% and lower than or equal to 100%. Oxygen supplied to the insulating layer 512 is supplied to the semiconductor layer 531 by later heat treatment, so that oxygen vacancies in the semiconductor layer 531 can be reduced.

It is particularly preferable to use a low-resistance metal oxide for the conductive layer 523. In that case, an insulating film that releases hydrogen, such as a silicon nitride film, is preferably used for the insulating layer 513, for example, because hydrogen can be supplied to the conductive layer 523 during the formation of the insulating layer 513 or by heat treatment performed after the formation of the insulating layer 513, which leads to an effective reduction in the electric resistance of the conductive layer 523.

The coloring layer 434 is provided in contact with the insulating layer 513. The coloring layer 434 is covered with the insulating layer 514.

A connection portion 504 is provided in a region where the substrates 651 and 661 do not overlap with each other. In the connection portion 504, the wiring 665 is connected to the FPC 672 via a connection layer 542. The connection portion 504 has a structure similar to that of the connection portion 507. On the top surface of the connection portion 504, a conductive layer obtained by processing the same conductive film as the electrode 611a is exposed. Thus, the connection portion 504 and the FPC 672 can be connected to each other via the connection layer 542.

As the polarizing plate 435 provided on the outer surface of the substrate 661, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 480 are controlled depending on the kind of the polarizing plate so that desirable contrast is obtained.

Note that a variety of optical members can be arranged on the outer surface of the substrate 661. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing a scratch in use, or the like may be arranged on the outer surface of the substrate 661.

For each of the substrates 651 and 661, glass, quartz, ceramic, sapphire, an organic resin, or the like can be used. When the substrates 651 and 661 are formed using a flexible material, the flexibility of the display device can be increased.

In the case where the reflective liquid crystal element is used, the polarizing plate 435 is provided on the display surface side. In addition, a light diffusion plate is preferably provided on the display surface side to improve visibility.

A front light may be provided on the outer side of the polarizing plate 435. As the front light, an edge-light front light is preferably used. A front light including a light-emitting diode (LED) is preferably used to reduce power consumption.

Structure Example 2

Figure 22:
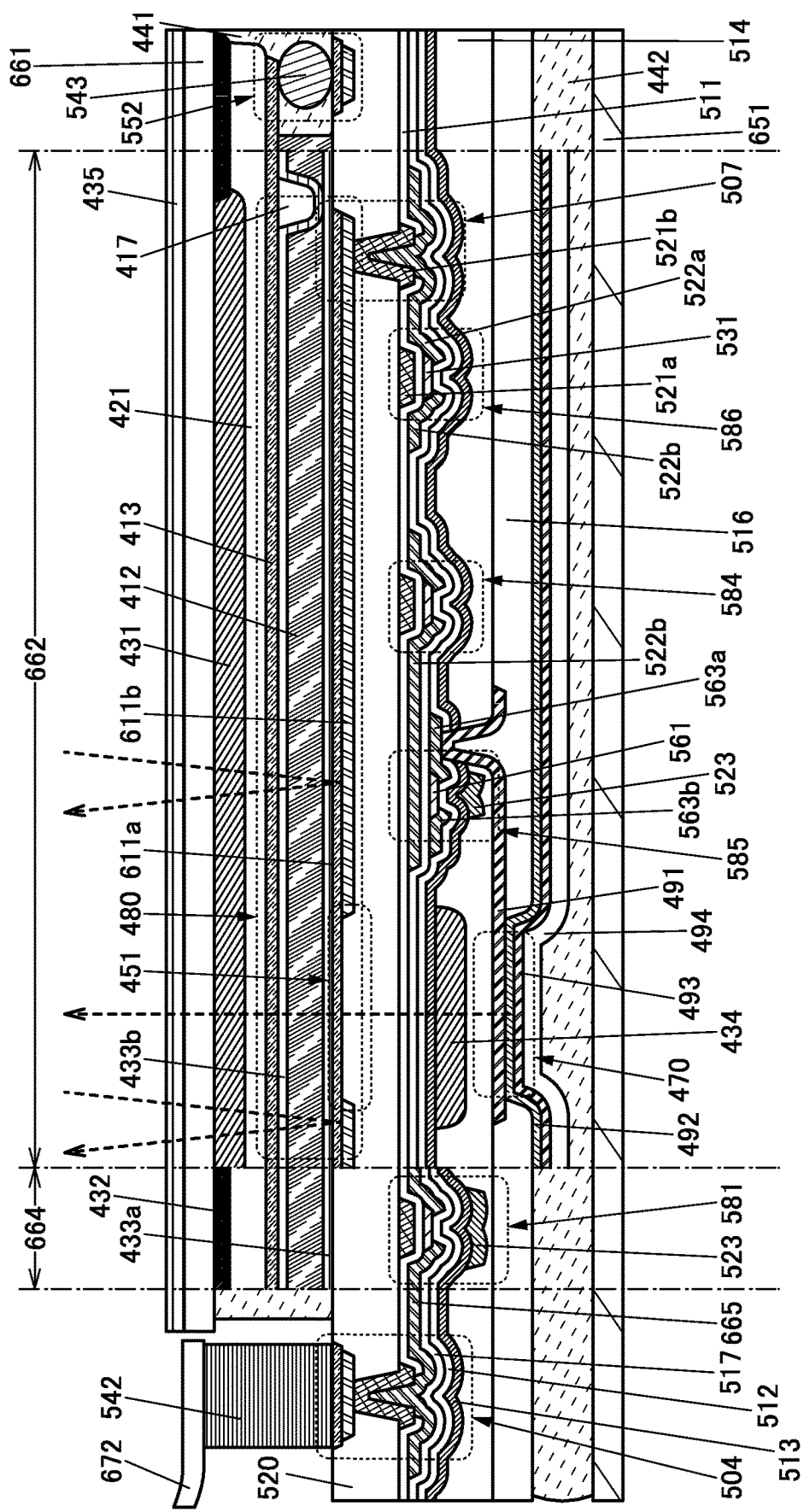
FIG. 22 illustrates a structure example of a display device.

A display device 600A illustrated in FIG. 22 is different from the display device 600 mainly in that a transistor 581, a transistor 584, a transistor 585, and a transistor 586 are included instead of the transistor 501, the transistor 503, the transistor 505, and the transistor 506.

Note that the positions of the insulating layer 417, the connection portion 507, and the like in FIG. 22 are different from those in FIG. 21. FIG. 22 illustrates an end portion of a pixel. The insulating layer 417 is provided so as to overlap with an end portion of the coloring layer 431 and an end portion of the light-blocking layer 432. As in this structure, the insulating layer 417 may be provided in a region not overlapping with a display region (or in a region overlapping with the light-blocking layer 432).

Two transistors included in the display device may partly overlap with each other like the transistor 584 and the transistor 585. In that case, the area occupied by a pixel circuit can be reduced, leading to an increase in resolution. Furthermore, the light-emitting area of the light-emitting element 470 can be increased, leading to an improvement in aperture ratio. The light-emitting element 470 with a high aperture ratio requires low current density to obtain necessary luminance; thus, the reliability is improved.

Each of the transistors 581, 584, and 586 includes the conductive layer 521a, the insulating layer 511, the semiconductor layer 531, the conductive layer 522a, and the conductive layer 522b. The conductive layer 521a overlaps with the semiconductor layer 531 with the insulating layer 511 positioned therebetween. The conductive layer 522a and the conductive layer 522b are electrically connected to the semiconductor layer 531. The transistor 581 includes the conductive layer 523.

The transistor 585 includes the conductive layer 522b, an insulating layer 517, a semiconductor layer 561, the conductive layer 523, the insulating layer 512, the insulating layer 513, a conductive layer 563a, and a conductive layer 563b. The conductive layer 522b overlaps with the semiconductor layer 561 with the insulating layer 517 positioned therebetween. The conductive layer 523 overlaps with the semiconductor layer 561 with the insulating layers 512 and 513 positioned therebetween. The conductive layer 563a and the conductive layer 563b are electrically connected to the semiconductor layer 561.

The conductive layer 521a functions as a gate. The insulating layer 511 functions as a gate insulating layer. The conductive layer 522a functions as one of a source and a drain. The conductive layer 522b functions as the other of the source and the drain.

The conductive layer 522b shared by the transistor 584 and the transistor 585 has a portion functioning as the other of a source and a drain of the transistor 584 and a portion functioning as a gate of the transistor 585. The insulating layer 517, the insulating layer 512, and the insulating layer 513 function as gate insulating layers. One of the conductive layers 563a and 563b functions as a source, and the other functions as a drain. The conductive layer 523 functions as a gate.

Structure Example 3

Figure 23:
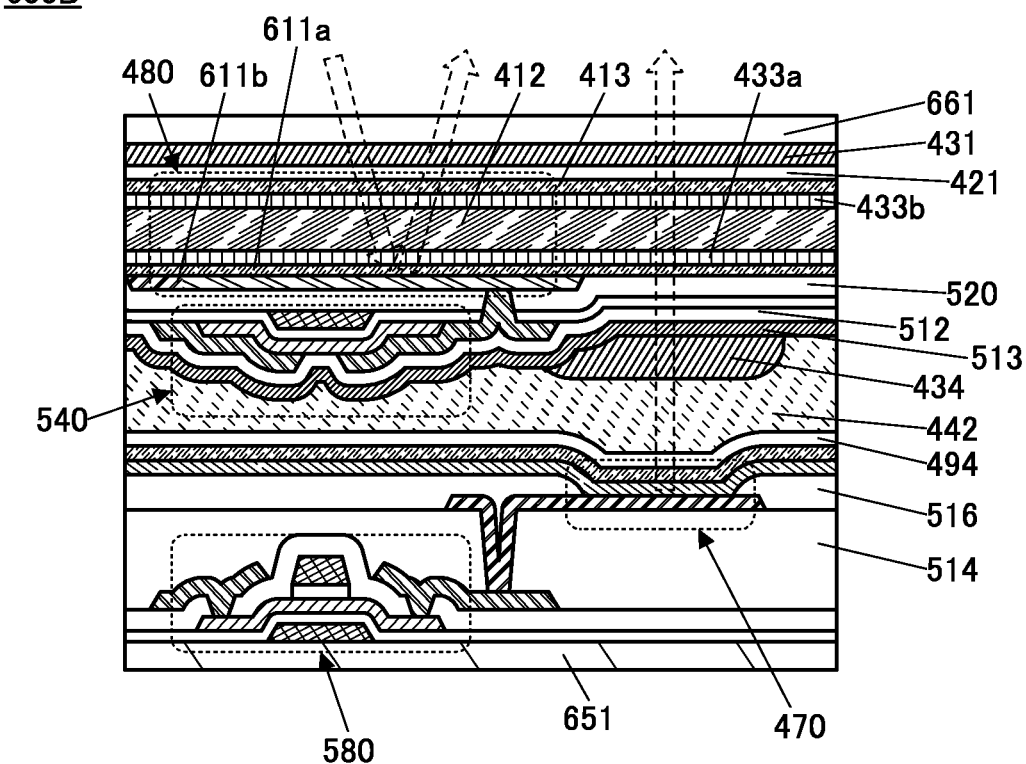
FIG. 23 illustrates a structure example of a display device.

FIG. 23 is a cross-sectional view illustrating a display portion of a display device 600B.

The display device 600B illustrated in FIG. 23 includes a transistor 540, a transistor 580, the liquid crystal element 480, the light-emitting element 470, the insulating layer 520, the coloring layer 431, the coloring layer 434, and the like between the substrate 651 and the substrate 661.

In the liquid crystal element 480, the electrode 611b reflects external light to the substrate 661 side. The light-emitting element 470 emits light to the substrate 661 side.

The substrate 661 is provided with the coloring layer 431, the insulating layer 421, the electrode 413 functioning as a common electrode of the liquid crystal element 480, and the alignment film 433b.

The liquid crystal layer 412 is provided between the electrode 611a and the electrode 413 with the alignment film 433a and the alignment film 433b positioned therebetween.

The transistor 540 is covered with the insulating layer 512 and the insulating layer 513. The insulating layer 513 and the coloring layer 434 are bonded to the insulating layer 494 with the adhesive layer 442.

In the display device 600B, the transistor 540 for driving the liquid crystal element 480 and the transistor 580 for driving the light-emitting element 470 are formed over different planes; thus, each of the transistors can be easily formed using a structure and a material suitable for driving the corresponding display element.

<Structure Example of Pixels>

Next, specific structure examples of pixels included in the display device will be described with reference to FIGS. 24A, 24B1, 24B2, 24B3, and 24B4, FIG. 25, and FIGS. 26A and 26B.

Figure 24A:
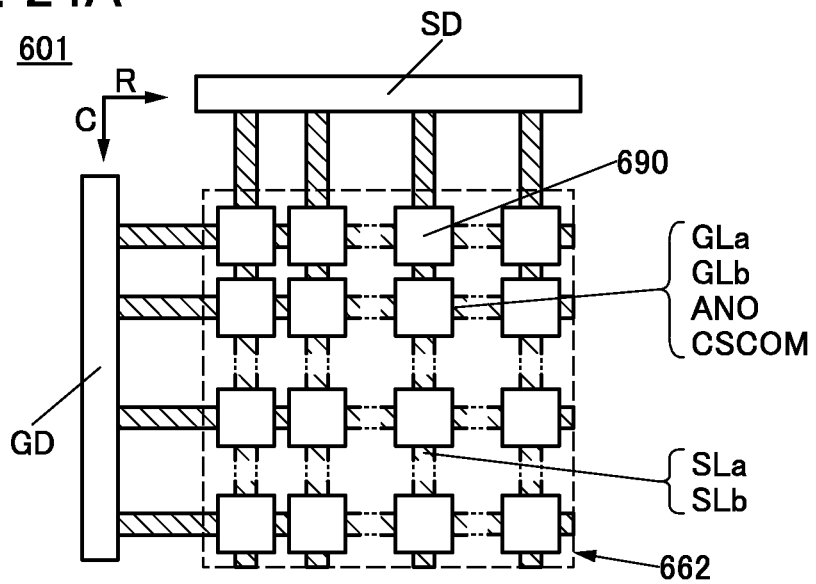
Figure 24A:
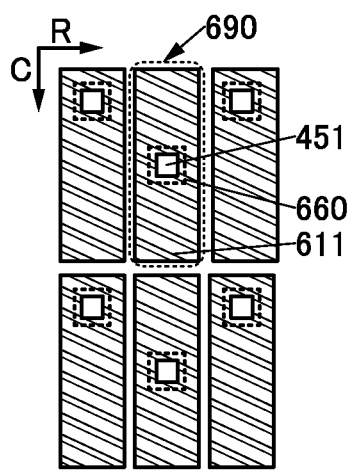
Figure 24A:
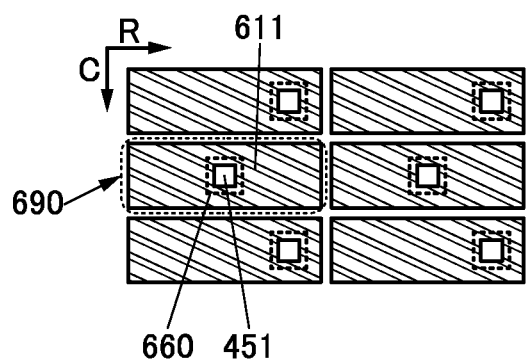
Figure 24A:
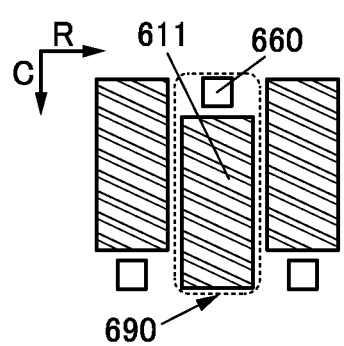
Figure 24A:
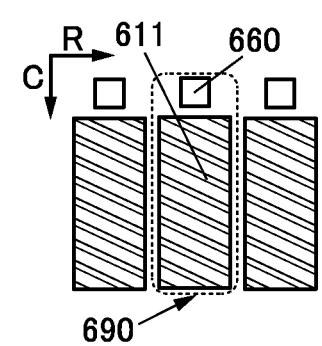

FIG. 24A is a block diagram of a display device 601. The display device 601 includes the display portion 662, a circuit GD, and a circuit SD. The display portion 662 includes a plurality of pixel units 690 arranged in a matrix. The circuit SD corresponds to the driver circuit 750 in FIG. 19.

The display device 601 includes a plurality of wirings GLa, a plurality of wirings GLb, a plurality of wirings ANO, a plurality of wirings CSCOM, a plurality of wirings SLa, and a plurality of wirings SLb. The plurality of wirings GLa, the plurality of wirings GLb, the plurality of wirings ANO, and the plurality of wirings CSCOM are each connected to the circuit GD and the plurality of pixel units 690 arranged in a direction indicated by an arrow R. The plurality of wirings SLa and the plurality of wirings SLb are each connected to the circuit SD and the plurality of pixel units 690 arranged in a direction indicated by an arrow C.

The pixel unit 690 includes a reflective liquid crystal element and a light-emitting element.

FIGS. 24B1 to 24B4 illustrate configuration examples of an electrode 611 included in the pixel unit 690. The electrode 611 serves as a reflective electrode of the liquid crystal element. The opening 451 is provided in the electrode 611 in FIGS. 24B1 and 24B2.

In FIGS. 24B1 and 24B2, a light-emitting element 660 positioned in a region overlapping with the electrode 611 is indicated by a broken line. The light-emitting element 660 overlaps with the opening 451 included in the electrode 611. Thus, light from the light-emitting element 660 is emitted to the display surface side through the opening 451.

In FIG. 24B1, the pixel units 690 adjacent in the direction indicated by an arrow R correspond to different emission colors. As illustrated in FIG. 24B1, the openings 451 are preferably provided in different positions in the electrodes 611 so as not to be aligned in the two pixel units 690 adjacent to each other in the direction indicated by the arrow R. This allows the two light-emitting elements 660 to be apart from each other, thereby preventing light emitted from the light-emitting element 660 from entering a coloring layer in the adjacent pixel unit 690 (such a phenomenon is also referred to as crosstalk). Furthermore, since the two adjacent light-emitting elements 660 can be arranged apart from each other, a high-resolution display device can be achieved even when EL layers of the light-emitting elements 660 are separately formed with a shadow mask or the like.

In FIG. 24B2, the pixel units 690 adjacent in a direction indicated by an arrow C correspond to different emission colors. Also in FIG. 24B2, the openings 451 are preferably provided in different positions in the electrodes 611 so as not to be aligned in the two pixel units 690 adjacent to each other in the direction indicated by the arrow C.

The smaller the ratio of the total area of the opening 451 to the total area except for the opening is, the brighter an image displayed using the liquid crystal element can be. Furthermore, the larger the ratio of the total area of the opening 451 to the total area except for the opening is, the brighter an image displayed using the light-emitting element 660 can be.

The opening 451 may have a polygonal shape, a quadrangular shape, an elliptical shape, a circular shape, a cross-like shape, a stripe shape, a slit-like shape, or a checkered pattern, for example. The opening 451 may be provided close to the adjacent pixel unit 690. Preferably, the opening 451 is provided close to another pixel unit 690 emitting light of the same color, in which case crosstalk can be suppressed.

As illustrated in FIGS. 24B3 and 24B4, a light-emitting region of the light-emitting element 660 may be positioned in a region where the electrode 611 is not provided, in which case light emitted from the light-emitting element 660 is emitted to the display surface side.

In FIG. 24B3, the light-emitting elements 660 are not aligned in the two pixel units 690 adjacent in the direction indicated by the arrow R. In FIG. 24B4, the light-emitting elements 660 are aligned in the two pixel units 690 adjacent to each other in the direction indicated by the arrow R.

The structure illustrated in FIG. 24B3 can, as mentioned above, prevent crosstalk and increase the resolution because the light-emitting elements 660 included in the two adjacent pixel units 690 can be apart from each other. The structure illustrated in FIG. 24B4 can prevent light emitted from the light-emitting element 660 from being blocked by the electrode 611 because the electrode 611 is not positioned along a side of the light-emitting element 660 which is parallel to the direction indicated by the arrow C. Thus, high viewing angle characteristics can be achieved.

As the circuit GD, any of a variety of sequential circuits such as a shift register can be used. In the circuit GD, a transistor, a capacitor, and the like can be used. A transistor included in the circuit GD can be formed in the same steps as the transistors included in the pixel units 690.

The circuit SD is connected to the wirings SLa and the wirings SLb. The driver circuit 750 described in the above embodiment can be used as the circuit SD.

For example, a COG method, a COF method, or the like can be used to mount the circuit SD on a pad electrically connected to the pixel units 690. Specifically, an anisotropic conductive film can be used to mount an integrated circuit on the pad.

Figure 25:
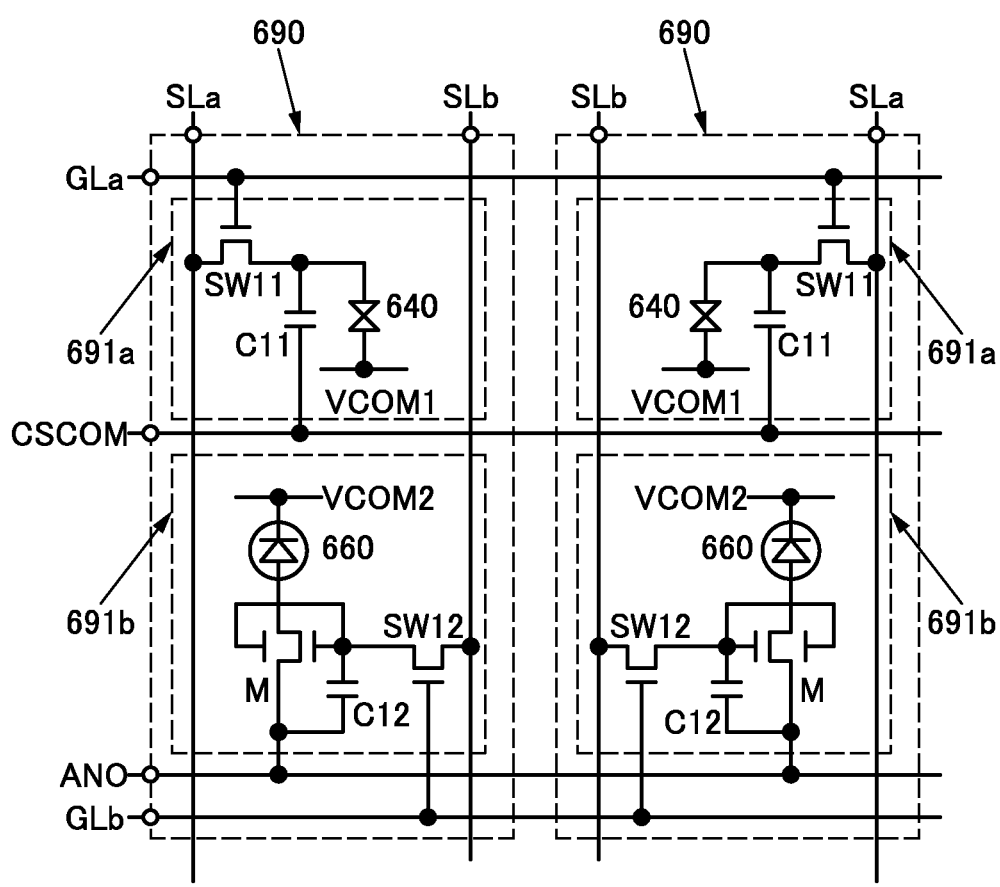
FIG. 25 illustrates a structure example of pixels.

FIG. 25 is an example of a circuit diagram of the pixel units 690. FIG. 25 illustrates two adjacent pixel units 690.

The pixel unit 690 includes a pixel 691*a* including a switch SW11, a capacitor C11, and a liquid crystal element 640 and a pixel 691*b* including a switch SW12, a transistor M, a capacitor C12, and the light-emitting element 660. The wiring GLa, the wiring GLb, a wiring ANO, a wiring CSCOM, a wiring SLa, and a wiring SLb are connected to the pixel unit 690. FIG. 25 illustrates a wiring VCOM1 which is connected to the liquid crystal element 640 and a wiring VCOM2 electrically connected to the light-emitting element 660.

FIG. 25 illustrates an example in which a transistor is used as each of the switches SW11 and SW12.

A gate of the switch SW11 is connected to the wiring GLa. One of a source and a drain of the switch SW11 is connected to the wiring SLa, and the other of the source and the drain is connected to one electrode of the capacitor C11 and one electrode of the liquid crystal element 640. The other electrode of the capacitor C11 is connected to the wiring CSCOM. The other electrode of the liquid crystal element 640 is connected to the wiring VCOM1.

A gate of the switch SW12 is connected to the wiring GLb. One of a source and a drain of the switch SW12 is connected to the wiring SLb, and the other of the source and the drain is connected to one electrode of the capacitor C12 and a gate of the transistor M. The other electrode of the capacitor C12 is connected to one of a source and a drain of the transistor M and the wiring ANO. The other of the source and the drain of the transistor M is connected to one electrode of the light-emitting element 660. The other electrode of the light-emitting element 660 is connected to the wiring VCOM2.

FIG. 25 illustrates an example in which the transistor M includes two gates between which a semiconductor is provided and which are connected to each other. This structure can increase the amount of current flowing through the transistor M.

A predetermined potential can be supplied to each of the wirings VCOM1 and CSCOM.

The wiring VCOM2 and the wiring ANO can be supplied with potentials having a difference large enough to make the light-emitting element 660 emit light.

In the pixel unit 690 of FIG. 25, for example, an image can be displayed in a reflective mode by driving the pixel unit with the signals supplied to the wiring GLa and the wiring SLa and utilizing the optical modulation of the liquid crystal element 640. In the case where an image is displayed in a transmissive mode, the pixel unit is driven with the signals supplied to the wiring GLb and the wiring SLb and the light-emitting element 660 emits light. In the case where both modes are performed at the same time, the pixel unit can be driven with the signals supplied to the wirings GLa, GLb, SLa, and SLb.

As the switches SW11 and SW12, OS transistors are preferably used. With the use of the OS transistors, image signals can be held in the pixels 691a and 691b for an extremely long time; thus, gray levels displayed by the pixels 691a and 691b can be maintained for a long time.

Figure 26A:
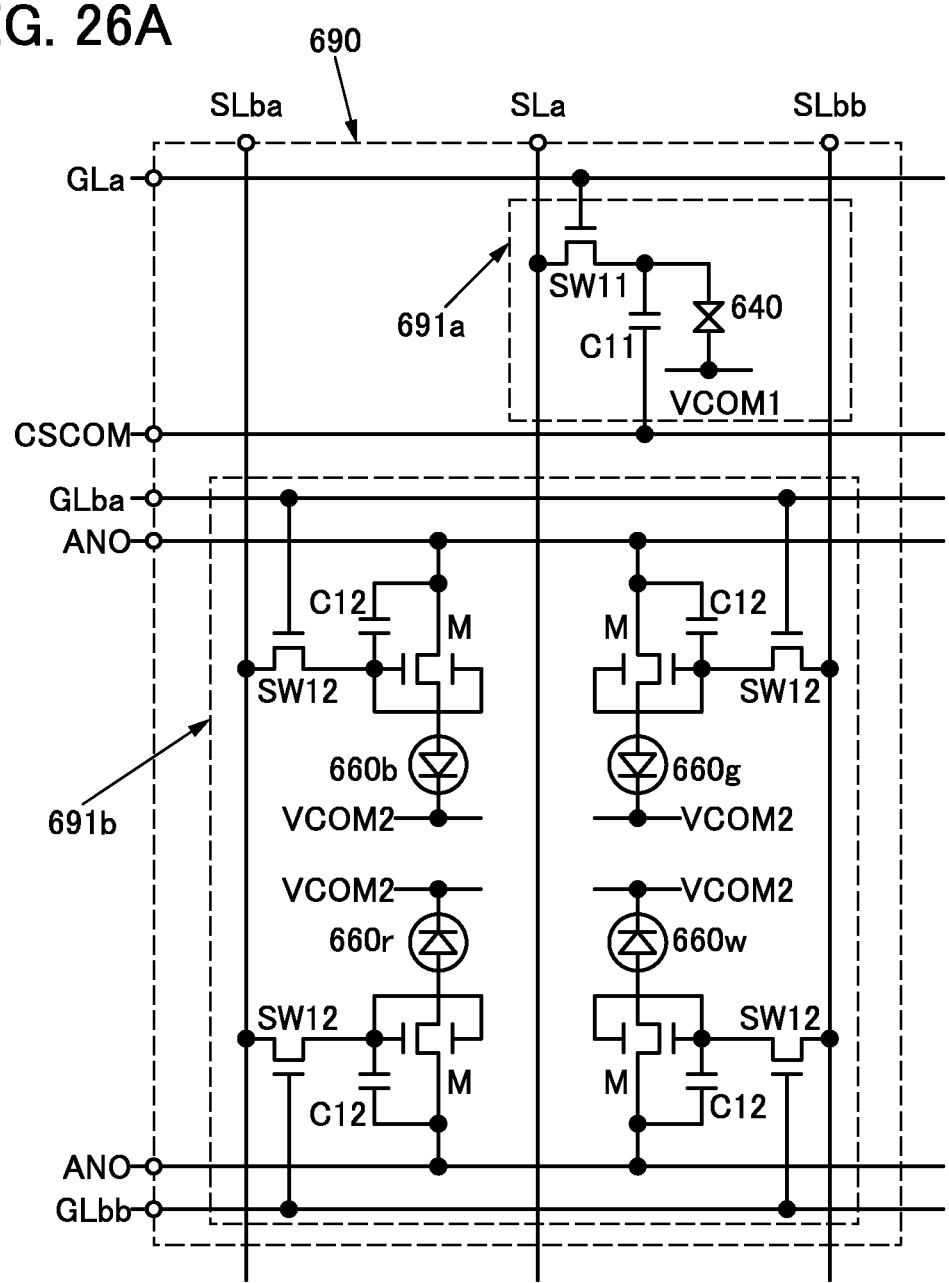
FIGS. 26A and 26B illustrate structure examples of pixels.

Although FIG. 25 illustrates an example in which one liquid crystal element 640 and one light-emitting element 660 are provided in one pixel unit 690, one embodiment of the present invention is not limited thereto. FIG. 26A illustrates an example in which one liquid crystal element 640 and four light-emitting elements 660 (light-emitting elements 660r, 660g, 660b, and 660w) are provided in one pixel unit 690. The pixel 691b illustrated in FIG. 26A differs from that in FIG. 25 in being capable of displaying a full-color image with the use of the light-emitting elements by one pixel.

In FIG. 26A, a wiring GLba, a wiring GLbb, a wiring SLba, and a wiring SLbb are connected to the pixel unit 690.

In the example in FIG. 26A, light-emitting elements emitting red light (R), green light (G), blue light (B), and white light (W) can be used as the four light-emitting elements 660, for example. Furthermore, as the liquid crystal element 640, a reflective liquid crystal element emitting white light can be used. Thus, in the case of performing display in the reflective mode, white display with high reflectivity can be performed. In the case of performing display in the transmissive mode, an image can be displayed with a higher color rendering property at low power consumption.

Figure 26B:
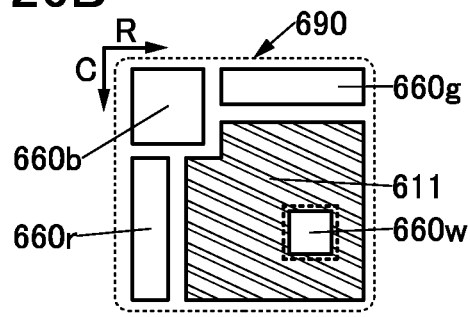

FIG. 26B illustrates a configuration example of the pixel unit 690 corresponding to FIG. 26A. The pixel unit 690 includes the light-emitting element 660w overlapping with the opening included in the electrode 611 as well as the light-emitting element 660r, the light-emitting element 660g, and the light-emitting element 660b which are provided around the electrode 611. It is preferable that the light-emitting elements 660r, 660g, and 660b have almost the same light-emitting area.

This embodiment can be combined with any of the other embodiments as appropriate.

Embodiment 7

In this embodiment, a structure example of a display module including any of the display devices described in the above embodiments will be described.

Figure 27:
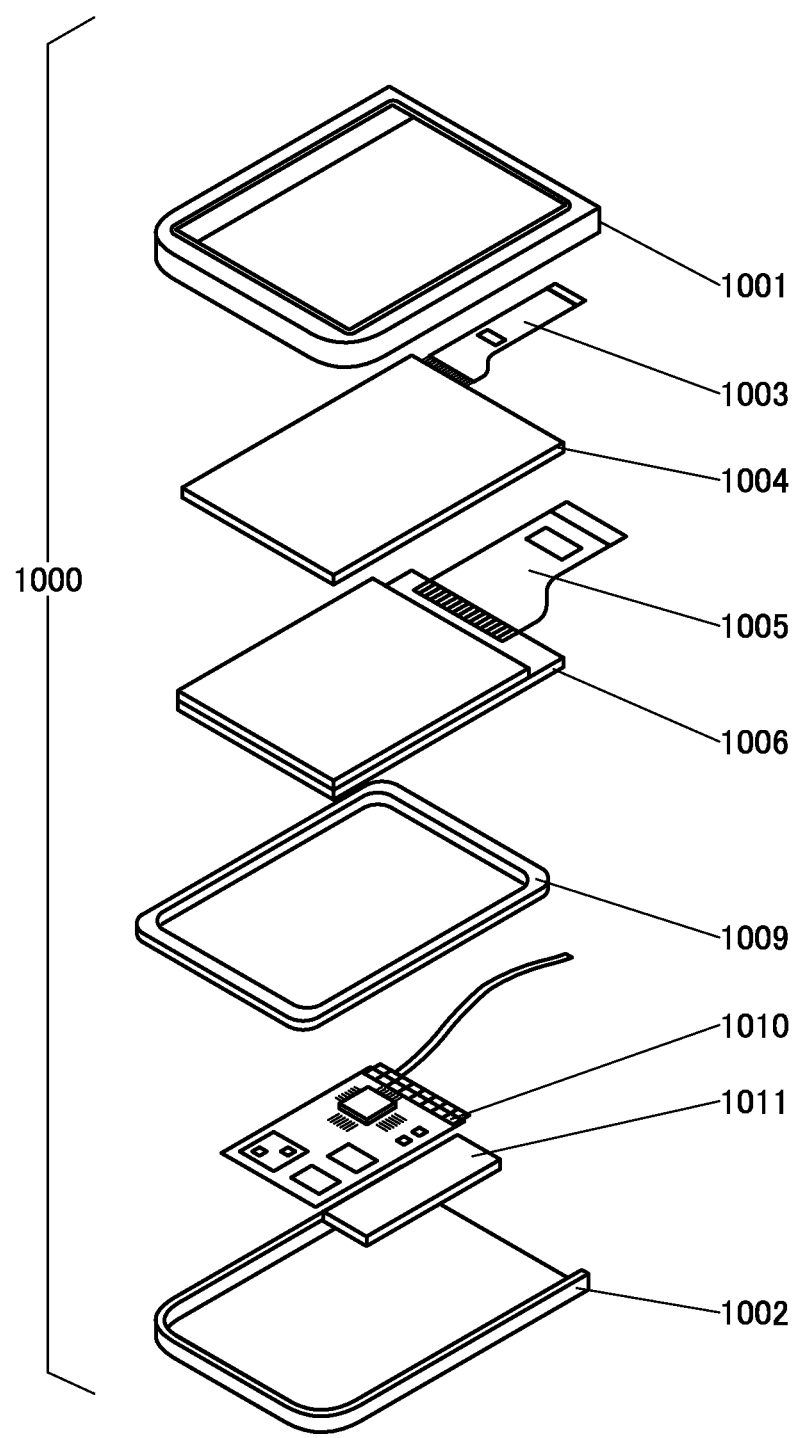
FIG. 27 illustrates a structure example of a display module.

In a display module 1000 illustrated in FIG. 27, a touch panel 1004 connected to an FPC 1003, a display device 1006 connected to an FPC 1005, a frame 1009, a printed circuit board 1010, and a battery 1011 are provided between an upper cover 1001 and a lower cover 1002.

The display device described in the above embodiment can be used as the display device 1006.

The shapes and sizes of the upper cover 1001 and the lower cover 1002 can be changed as appropriate in accordance with the sizes of the touch panel 1004 and the display device 1006.

The touch panel 1004 can be a resistive touch panel or a capacitive touch panel and may be formed to overlap with the display device 1006. Instead of providing the touch panel 1004, the display device 1006 having a touch panel function may be used.

The frame 1009 protects the display device 1006 and also functions as an electromagnetic shield for blocking electromagnetic waves generated by the operation of the printed circuit board 1010. The frame 1009 may also function as a radiator plate.

The printed circuit board 1010 is provided with a power supply circuit and a signal processing circuit for outputting a video signal and a clock signal. As a power source for supplying power to the power supply circuit, an external commercial power source or a power source using the battery 1011 provided separately may be used. The battery 1011 can be omitted in the case of using a commercial power source.

The display module 1000 may be additionally provided with a member such as a polarizing plate, a retardation plate, or a prism sheet.

This embodiment can be combined with any of the other embodiments as appropriate.

Embodiment 8

In this embodiment, structure examples of a memory device that can be used in the above embodiment will be described. The structure examples of the memory device described below can be used when an OS transistor and a Si transistor are used in the memory circuits 31 illustrated in FIG. 5 and FIGS. 12A to 12C or the memory cells 390 illustrated in FIGS. 18A to 18C, for example.

<Structure Example of Memory Device>

Figure 28:
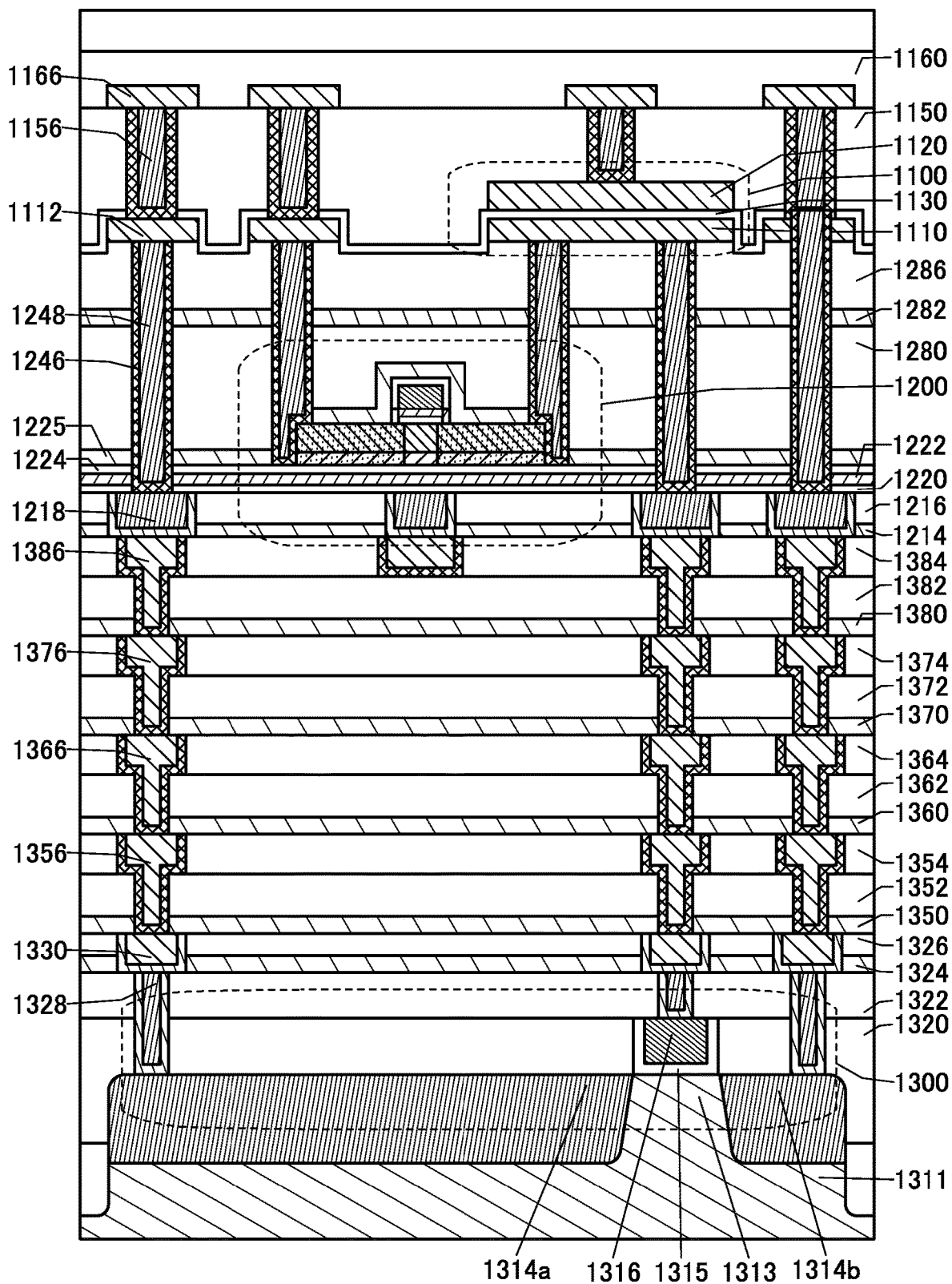
FIG. 28 illustrates a structure example of a memory device.

FIG. 28 is a schematic cross-sectional view illustrating an example of a memory device 1050. The memory device 1050 includes a transistor 1300, a transistor 1200, and a capacitor 1100. The transistor 1200 is provided above the transistor 1300, and the capacitor 1100 is provided above the transistor 1300 and the transistor 1200.

The transistor 1200 is an OS transistor including an oxide semiconductor in its channel formation region. Because an OS transistor can be formed with high yield even when it is miniaturized, the transistor 1200 can be miniaturized. By using such a transistor in a memory device, the memory device can be miniaturized or highly integrated. Because the off-state current of the OS transistor is small, by using the OS transistor in a memory device, stored data can be retained for a long time. In other words, such a memory device does not require refresh operation or has an extremely low frequency of the refresh operation, which leads to a sufficient reduction in power consumption of the memory device.

The transistor 1300 is provided over a substrate 1311 and includes a conductor 1316, an insulator 1315, a semiconductor region 1313 that is a part of the substrate 1311, and low-resistance regions 1314*a* and 1314*b* functioning as a source region and a drain region.

The transistor 1300 may be a p-channel transistor or an n-channel transistor.

It is preferable that a region of the semiconductor region 1313 where a channel is formed, a region in the vicinity thereof, the low-resistance regions 1314*a* and 1314*b* functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained.

The low-resistance regions 1314*a* and 1314*b* contain an element which imparts n-type conductivity, such as arsenic or phosphorus, or an element which imparts p-type conductivity, such as boron, in addition to a semiconductor material used for the semiconductor region 1313.

The conductor 1316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embedability of the conductor, it is preferable to use a stacked layer of metal materials such as tungsten and aluminum as the conductor. In particular, tungsten is preferable in terms of heat resistance.

In the transistor 1300 illustrated in FIG. 28, the semiconductor region 1313 (part of the substrate 1311) in which a channel is formed includes a protruding portion. Furthermore, the conductor 1316 is provided to cover side surfaces and a top surface of the semiconductor region 1313 with the insulator 1315 provided therebetween. Note that the conductor 1316 may be formed using a material for adjusting the work function. The transistor 1300 is also referred to as a FIN transistor because it utilizes the protruding portion of the semiconductor substrate. An insulator serving as a mask for forming the protruding portion may be provided in contact with a top surface of the protruding portion. Although the case where the protruding portion is formed by processing part of the semiconductor substrate is described here, a semiconductor film having a protruding portion may be formed by processing an SOI substrate.

Note that the transistor 1300 illustrated in FIG. 28 is only an example and is not limited to the structure illustrated therein; an appropriate transistor may be used in accordance with a circuit configuration or a driving method.

An insulator 1320, an insulator 1322, an insulator 1324, and an insulator 1326 are stacked sequentially so as to cover the transistor 1300.

The insulator 1320, the insulator 1322, the insulator 1324, and the insulator 1326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 1322 may function as a planarization film for eliminating a level difference caused by the transistor 1300 or the like underlying the insulator 1322. For example, the top surface of the insulator 1322 may be planarized by planarization treatment using a chemical mechanical polishing (CMP) method or the like to increase the level of planarity.

The insulator 1324 is preferably formed using a film having a barrier property that prevents impurities and hydrogen from diffusing from the substrate 1311, the transistor 1300, or the like into a region where the transistor 1200 is formed.

As an example of the film having a barrier property against hydrogen, silicon nitride formed by a CVD method can be given. The diffusion of hydrogen to a semiconductor element including an oxide semiconductor, such as the transistor 1200, degrades the characteristics of the semiconductor element in some cases. Therefore, a film that prevents hydrogen diffusion is preferably provided between the transistor 1200 and the transistor 1300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 1324 that is converted into hydrogen atoms per unit area of the insulator 1324 is less than or equal to $10 \times 10^{15}$ atoms/cm$^2$, preferably less than or equal to $5 \times 10^{15}$ atoms/cm$^2$ in the TDS analysis in the range of 50° C. to 500° C., for example.

Note that the permittivity of the insulator 1326 is preferably lower than that of the insulator 1324. For example, the relative permittivity of the insulator 1326 is preferably lower than 4, further preferably lower than 3. For example, the relative permittivity of the insulator 1326 is preferably 0.7 times or less that of the insulator 1324, further preferably 0.6 times or less that of the insulator 1324. In the case where a material with a low permittivity is used as an interlayer film, the parasitic capacitance between wirings can be reduced.

A conductor 1328, a conductor 1330, and the like are provided in the insulator 1320, the insulator 1322, the insulator 1324, and the insulator 1326. Note that the conductor 1328 and the conductor 1330 each function as a plug or a wiring. A plurality of structures of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material of each of plugs and wirings (e.g., the conductor 1328 and the conductor 1330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten.

Alternatively, a low-resistance conductive material such as aluminum or copper is preferably used. The use of a low-resistance conductive material can reduce wiring resistance.

A wiring layer may be provided over the insulator 1326 and the conductor 1330. For example, in FIG. 28, an insulator 1350, an insulator 1352, and an insulator 1354, an insulator 1360, an insulator 1362, an insulator 1364, an insulator 1370, an insulator 1372, an insulator 1374, an insulator 1380, an insulator 1382, and an insulator 1384 are stacked sequentially. Furthermore, a conductor 1356, a conductor 1366, a conductor 1376, and a conductor 1386 are formed in these insulators. These conductors function as plugs or wirings. Note that these conductors can be formed using a material similar to that used for forming the conductor 1328 or the conductor 1330.

Note that the insulator 1350, the insulator 1360, the insulator 1370, and the insulator 1380 are preferably formed using an insulator having a barrier property against hydrogen, like the insulator 1324. Furthermore, the conductor 1356, the conductor 1366, the conductor 1376, and the conductor 1386 preferably include a conductor having a barrier property against hydrogen. For example, when focusing on the insulator 1350 and the conductor 1356, formation of the conductor 1356 in an opening of the insulator 1350 can prevent the diffusion of hydrogen from the transistor 1300 to the transistor 1200. The same can apply to the other insulators and conductors.

Note that as the conductor having a barrier property against hydrogen, tantalum nitride may be used, for example. By stacking tantalum nitride and tungsten, which has high conductivity, the diffusion of hydrogen from the transistor 1300 can be prevented while the conductivity of a wiring is ensured.

An insulator 1214 and an insulator 1216 are stacked sequentially over the insulator 1384. A material having a barrier property against oxygen or hydrogen is preferably used for any of the insulators 1214 and 1216.

The insulator 1214 is preferably formed using, for example, a film having a barrier property that prevents hydrogen and impurities from diffusing from the substrate 1311, a region where the transistor 1300 is formed, or the like to a region where the transistor 1200 is formed. Therefore, the insulator 1214 can be formed using a material similar to that used for forming the insulator 1324.

As an example of the film having a barrier property against hydrogen, silicon nitride formed by a CVD method can be given. The diffusion of hydrogen to a semiconductor element including an oxide semiconductor, such as the transistor 1200, degrades the characteristics of the semiconductor element in some cases. Therefore, a film that prevents hydrogen diffusion is preferably provided between the transistor 1200 and the transistor 1300. Specifically, the film that prevents hydrogen diffusion is a film from which hydrogen is less likely to be released.

As the film having a barrier property against hydrogen, for example, as the insulator 1214, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 1200 in and after a manufacturing process of the transistor. In addition, release of oxygen from the oxide in the transistor 1200 can be prevented. Therefore, aluminum oxide is suitably used as a protective film for the transistor 1200.

For example, the insulator 1216 can be formed using a material similar to that used for forming the insulator 1320. In the case where interlayer films formed of a material with a relatively low permittivity are used for the insulator, the parasitic capacitance between wirings can be reduced. For example, a silicon oxide film, a silicon oxynitride film, or the like can be used for the insulator 1216.

A conductor 1218, a conductor (e.g., an electrode serving as a back gate) included in the transistor 1200, and the like are provided in the insulators 1214 and 1216. The conductor 1218 can be formed using a material similar to that used for forming the conductor 1328 or 1330.

The conductor 1218 is preferably a conductor having a barrier property against oxygen, hydrogen, and water. In this case, the diffusion of oxygen, hydrogen, and water from the transistor 1300 to the transistor 1200 can be prevented.

The transistor 1200 is provided over the insulator 1216. Note that an OS transistor may be used as the transistor 1200. The details of the transistor 1200 are described later.

The insulator 1280 is provided over the transistor 1200. In the insulator 1280, an excess-oxygen region is preferably formed. In particular, in the case of using an oxide semiconductor in the transistor 1200, when an insulator including an excess-oxygen region is provided in an interlayer film or the like in the vicinity of the transistor 1200, oxygen vacancies in the oxide 1230 included in the transistor 1200 are reduced, whereby the reliability can be improved. The insulator 1280 that covers the transistor 1200 may function as a planarization film that covers roughness thereunder. Note that the insulator 1280 is provided in contact with an insulator 1225 formed over the transistor 1200.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 1282 may be provided over the insulator 1280. A material having a barrier property against oxygen or hydrogen is preferably used for the insulator 1282. Thus, the insulator 1282 can be formed using a material similar to that used for forming the insulator 1214. As the insulator 1282, a metal oxide such as aluminum oxide, hafnium oxide, or tantalum oxide is preferably used, for example. For example, when the insulator 1282 is formed by a sputtering method with the use of plasma including oxygen, oxygen can be added to an insulator 1280 serving as a base layer of the oxide.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 1200 in and after a manufacturing process of the transistor. In addition, release of oxygen from the oxide in the transistor 1200 can be prevented. Therefore, aluminum oxide is suitably used as a protective film for the transistor 1200.

The insulator 1286 is provided over the insulator 1282. The insulator 1286 can be formed using a material similar to that of the insulator 1320. In the case where a material with a relatively low permittivity is used for an interlayer film, the parasitic capacitance between wirings can be reduced. For example, a silicon oxide film, a silicon oxynitride film, or the like can be used for the insulator 1286.

The conductors 1246 and 1248 and the like are provided in the insulators 1220, 1222, 1224, 1250, 1280, 1282, and 1286.

The conductors 1246 and 1248 can be formed using a material similar to those used for forming the conductors 1328 and 1330.

The capacitor 1100 is provided above the transistor 1200. The capacitor 1100 includes a conductor 1110, a conductor 1120, and an insulator 1130.

A conductor 1112 may be provided over the conductors 1246 and 1248. The conductor 1112 and the conductor 1110 can be formed at the same time.

The conductor 1112 and the conductor 1110 can be formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 1112 and the conductor 1110 each have a single-layer structure in FIG. 28; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 1100, the insulator 1130 is provided over the conductors 1112 and 1110. The insulator 1130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a material with high dielectric strength, such as silicon oxynitride, is preferably used for the insulator 1130. In the capacitor 1100 having the structure, the dielectric strength can be increased and the electrostatic breakdown of the capacitor 1100 can be prevented because of the insulator 1130.

Over the insulator 1130, the conductor 1120 is provided so as to overlap with the conductor 1110. Note that the conductor 1120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 1120 is formed concurrently with another component such as a conductor, Cu (copper), Al (aluminum), or the like which is a low-resistance metal material may be used.

An insulator 1150 is provided over the conductor 1120 and the insulator 1130. The insulator 1150 can be formed using a material similar to that used for forming the insulator 1320. The insulator 1150 may function as a planarization film that covers roughness thereunder.

The above is the description of the structure example. With the use of the structure, a change in electrical characteristics can be prevented and reliability can be improved in a memory device including an OS transistor. The power consumption of a memory device including an OS transistor can be reduced. Miniaturization or high integration of a memory device including an OS transistor can be achieved. A miniaturized or highly integrated memory device can be provided with high yield.

Figure 29:
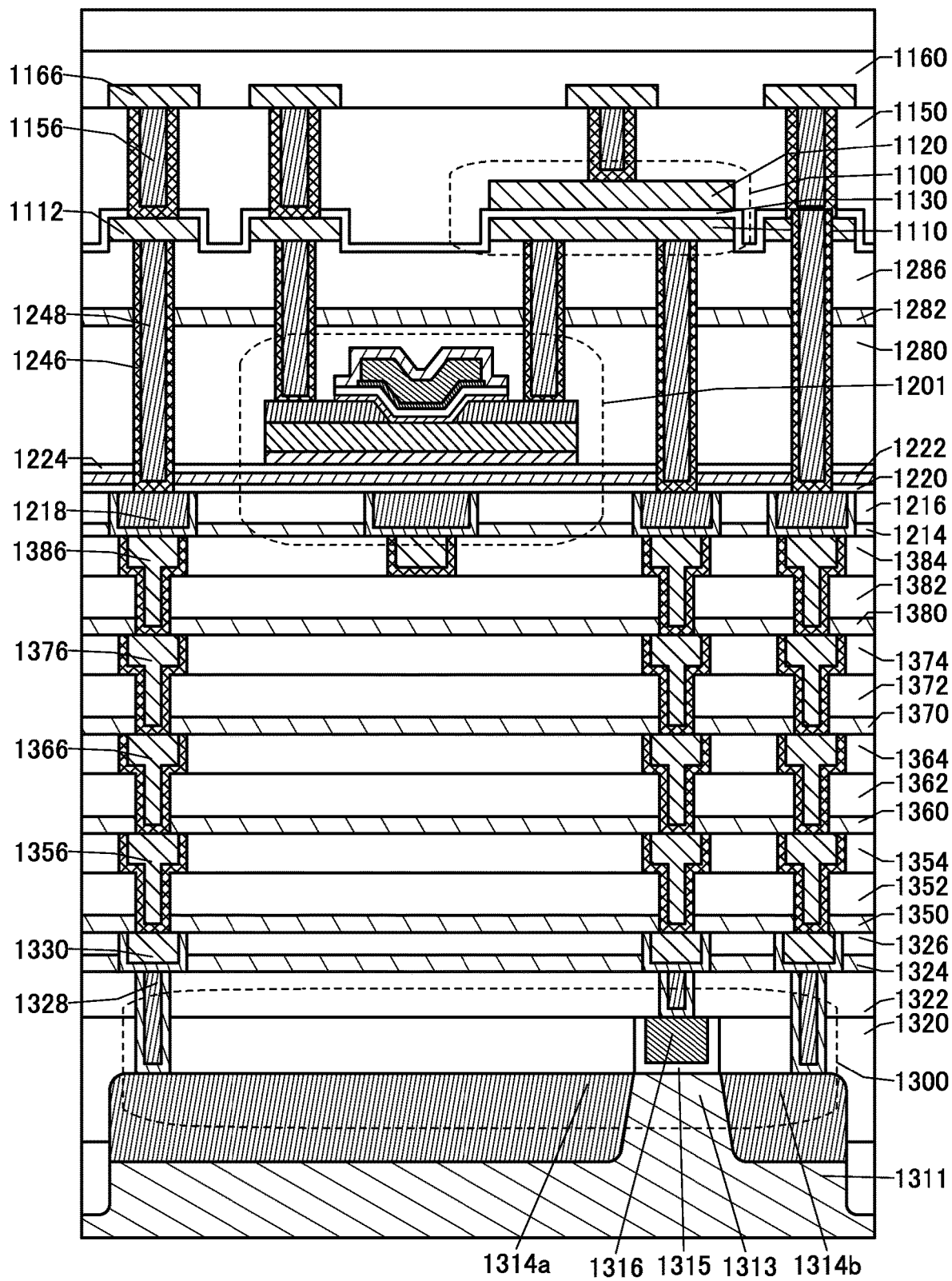
FIG. 29 illustrates a structure example of a memory device.

FIG. 29 illustrates another structure example of a memory device. FIG. 29 is a schematic cross-sectional view of the memory device obtained by including a transistor 1201 instead of the transistor 1200 illustrated in FIG. 28. Like the transistor 1200, the transistor 1201 is an OS transistor. Note that the details of the transistor 1201 are described later.

For the details of the other components in FIG. 29, the description of FIG. 28 can be referred to.

Structure Example 1 of Transistor

Next, the details of the transistor 1200 illustrated in FIG. 28 will be described.

Figure 30A:
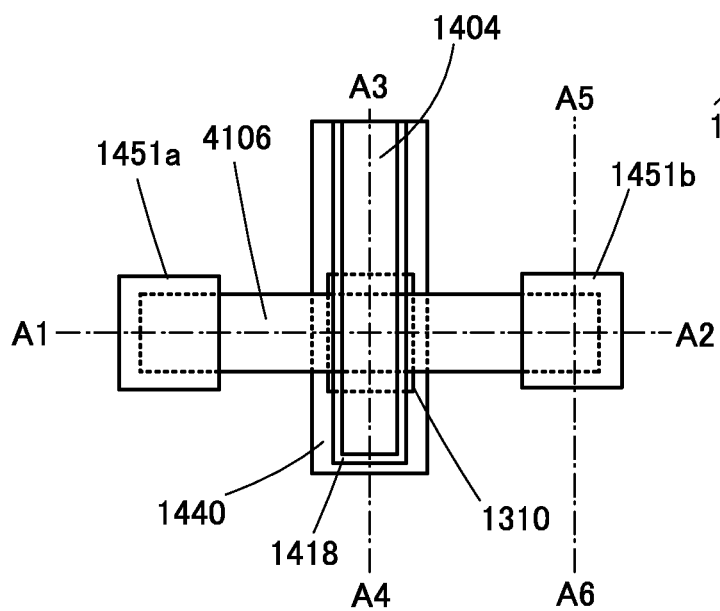
FIGS. 30A to 30C illustrate a structure example of a transistor.
Figure 30C:
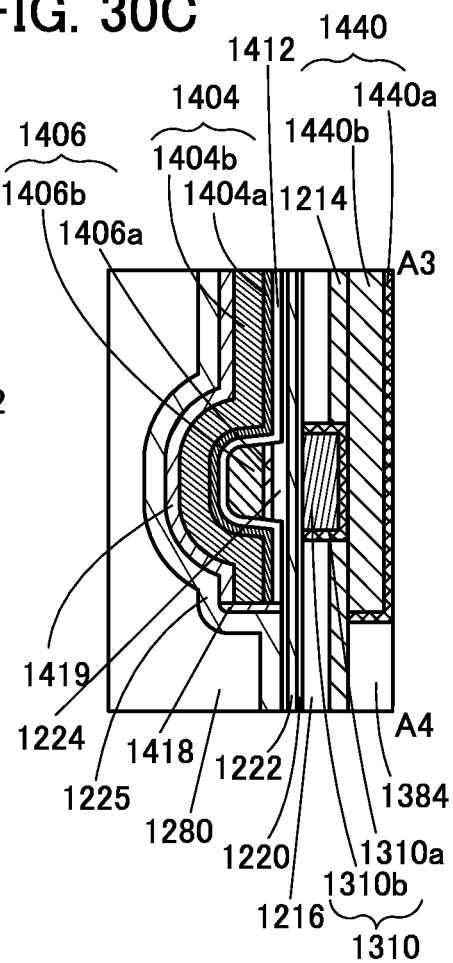
Figure 30B:
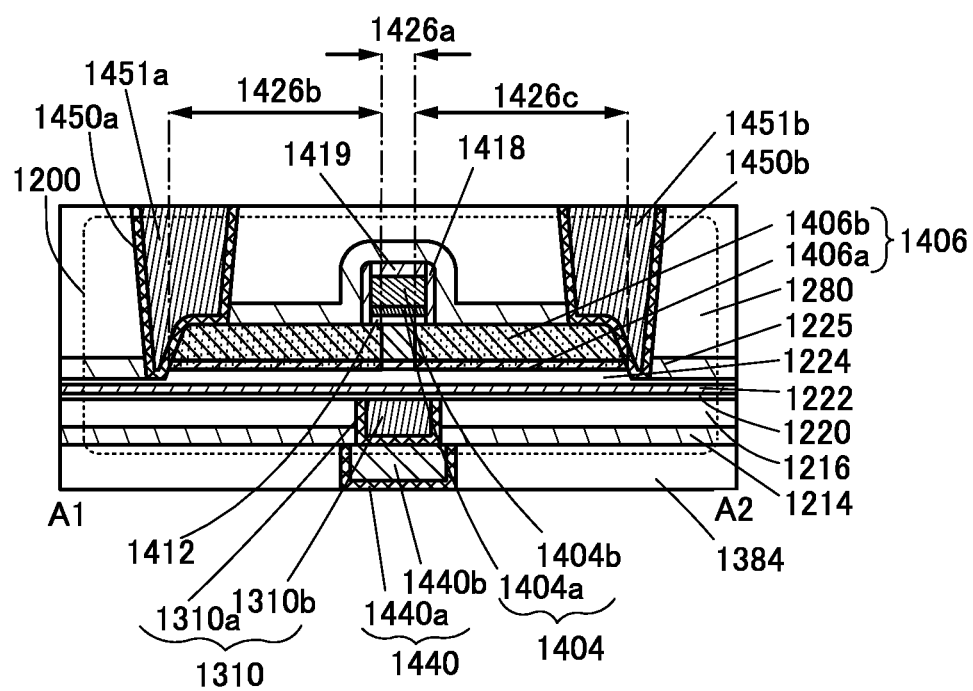

FIG. 30A is a plan view of a semiconductor device including the transistor 1200. FIG. 30B is a cross-sectional view of a portion indicated by a dashed-dotted line A1-A2 in FIG. 30A, illustrating a cross section of the transistor 1200 in a channel length direction. FIG. 30C is a cross-sectional view of a portion indicated by a dashed-dotted line A3-A4 in FIG. 30A, illustrating a cross section of the transistor 1200 in a channel width direction. In the top view of FIG. 30A, some components are not illustrated for simplification of the drawing.

As illustrated in FIGS. 30A to 30C, the transistor 1200 includes an insulator 1224 over a substrate (not illustrated), a metal oxide 1406*a* over the insulator 1224, a metal oxide 1406*b* in contact with at least part of a top surface of the metal oxide 1406*a*, an insulator 1412 over the metal oxide 1406*b*, a conductor 1404*a* over the insulator 1412, a conductor 1404*b* over the conductor 1404*a*, an insulator 1419 over the conductor 1404*b*, an insulator 1418 in contact with side surfaces of the insulator 1412, the conductor 1404*a*, the conductor 1404*b*, and the insulator 1419, and the insulator 1225 in contact with a top surface of the metal oxide 1406*b* and a side surface of the insulator 1418. Here, as illustrated in FIG. 30B, a top surface of the insulator 1418 is preferably substantially aligned with a top surface of the insulator 1419. Furthermore, the insulator 1225 is preferably provided to cover the insulator 1419, the conductor 1404, the insulator 1418, and the metal oxide 1406.

In the following description, the metal oxide 1406*a* and the metal oxide 1406*b* are collectively referred to as the metal oxide 1406 in some cases. Although the metal oxide 1406*a* and the metal oxide 1406*b* are stacked in the transistor 1200, the structure of the present invention is not limited to this structure. For example, only the metal oxide 1406*b* may be provided. Furthermore, the conductor 1404*a* and the conductor 1404*b* are collectively referred to as the conductor 1404 in some cases. Although the conductor 1404*a* and the conductor 1404*b* are stacked in the transistor 1200, the structure of the present invention is not limited to this structure. For example, only the conductor 1404b may be provided.

A conductor 1440 includes a conductor 1440a that is in contact with an inner wall of an opening of the insulator 1384 and a conductor 1440b positioned inside the conductor 1440a. Here, the height of the top surfaces of the conductors 1440a and 1440b can be substantially the same as that of the top surface of the insulator 1384. Although the conductor 1440a and the conductor 1440b are stacked in the transistor 1200, the structure of the present invention is not limited to this structure. For example, only the conductor 1440b may be provided.

Of a conductor 1310, a conductor 1310a is formed in contact with an inner wall of an opening of the insulators 1214 and 1216, and a conductor 1310b is formed inside the conductor 1310a. Thus, a structure in which the conductor 1310a is in contact with the conductor 1440b is preferable. Here, the height of the top surfaces of the conductors 1310a and 1310b can be substantially the same as that of the top surface of the insulator 1216. Although the conductor 1310a and the conductor 1310b are stacked in the transistor 1200, the structure of the present invention is not limited to this structure. For example, only the conductor 1310b may be provided.

The conductor 1404 can function as a top gate, and the conductor 1310 can function as a back gate. The potential of the back gate can be the same as the potential of the top gate, the ground potential, or an arbitrary potential. By changing the potential of the back gate independently of the potential of the top gate, the threshold voltage of the transistor can be changed.

The conductor 1440 extends in the channel width direction in a manner similar to that of the conductor 1404, and functions as the conductor 1310, which is a wiring through which a potential is applied to the back gate. When the conductor 1310 is stacked over the conductor 1440 functioning as the wiring for the back gate so as to be embedded in the insulators 1214 and 1216, the insulators 1214 and 1216 and the like are positioned between the conductor 1440 and the conductor 1404, reducing the parasitic capacitance between the conductor 1440 and the conductor 1404 and thereby increasing the withstand voltage. The reduction in the parasitic capacitance between the conductor 1440 and the conductor 1404 can improve the switching speed of the transistor, so that the transistor can have high frequency characteristics. The increase in the withstand voltage between the conductor 1440 and the conductor 1404 can improve the reliability of the transistor 1200. Therefore, the thicknesses of the insulators 1214 and the insulator 1216 are preferably large. Note that the extending direction of the conductor 1440 is not limited to this example; for example, the conductor 1440 may extend in the channel length direction of the transistor 1200.

Here, it is preferable to use conductive materials that have a function of inhibiting the passage of impurities such as water or hydrogen or hardly transmit such impurities for the conductor 1310a and the conductor 1440a. For example, a single layer or a stacked layer of tantalum, tantalum nitride, ruthenium, ruthenium oxide, or the like is preferably used. Owing to this, diffusion of impurities such as water or hydrogen from a lower layer into an upper layer through the conductors 1440 and 1310 can be inhibited. Note that it is preferable that the conductors 1310a and 1440a have a function of inhibiting the passage of at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom and oxygen (e.g., an oxygen atom or an oxygen molecule). Furthermore, in the following description, the same applies to a conductive material having a function of inhibiting the passage of impurities. When the conductors 1310a and 1440a have a function of inhibiting the passage of oxygen, the conductivity of the conductors 1310b and 1440b can be prevented from being lowered because of oxidation.

Moreover, the conductor 1310b is preferably formed using a conductive material including tungsten, copper, or aluminum as its main component. Although not illustrated, the conductor 1310b may have a stacked structure and be, for example, stacked layers of titanium, titanium nitride, and the above-described conductive material.

The conductor 1440b, which serves as a wiring, is preferably formed using a conductor having a higher conductivity than the conductor 1310b; a conductive material including copper or aluminum as its main component can be used, for example. Although not illustrated, the conductor 1440b may have a stacked structure and be, for example, stacked layers of titanium, titanium nitride, and the above-described conductive material.

The insulator 1214 can function as a barrier insulating film for preventing impurities such as water or hydrogen from entering the transistor from a lower layer. The insulator 1214 is preferably formed using an insulating material having a function of inhibiting the passage of impurities such as water or hydrogen. For example, the insulator 1214 is preferably formed using silicon nitride or the like. This can suppress diffusion of impurities such as hydrogen and water to a layer positioned over the insulator 1214. Note that it is preferable that the insulator 1214 have a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Furthermore, in the following description, the same applies to an insulating material having a function of inhibiting the passage of impurities.

Furthermore, for the insulator 1214, an insulating material having a function of inhibiting the passage of oxygen (e.g., an oxygen atom or an oxygen molecule) is preferably used. With this material, oxygen contained in the insulator 1224 or the like can be inhibited from diffusing into lower layers.

Furthermore, with the structure in which the conductor 1310 is stacked over the conductor 1440, the insulator 1214 can be provided between the conductor 1440 and the conductor 1310. Here, even when a metal that is easily diffused, such as coper, is used as the conductor 1440b, silicon nitride or the like provided as the insulator 1214 can prevent diffusion of the metal to a layer positioned above the insulator 1214.

The insulator 1222 is preferably formed using an insulating material having a function of inhibiting the passage of impurities such as water or hydrogen and oxygen, and for example, is preferably formed using aluminum oxide or hafnium oxide. Accordingly, diffusion of impurities such as water or hydrogen from a layer under the insulator 1222 to a layer over the insulator 1222 can be inhibited. Furthermore, oxygen contained in the insulator 1224 or the like can be inhibited from diffusing into lower layers.

Furthermore, the concentration of impurities such as water, hydrogen, or nitrogen oxide in the insulator 1224 is preferably lowered. The amount of hydrogen released from the insulator 1224 that is converted into hydrogen molecules per unit area of the insulator 1224 is less than or equal to $2\times10^{15}$ molecules/cm$^2$, preferably less than or equal to $1\times10^{15}$ molecules/cm$^2$, further preferably $5\times10^{14}$ molecules/cm$^2$ in thermal desorption spectroscopy (TDS) analysis in the range from 50° C. to 500° C., for example. Moreover, the insulator 1224 is preferably formed using an insulator from which oxygen is released by heating.

The insulator 1412 can function as a first gate insulating film, and the insulator 1220, the insulator 1222, and the insulator 1224 can function as a second gate insulating film. Although the insulator 1220, the insulator 1222, and the insulator 1224 are stacked in the transistor 1200, the present invention is not limited to this structure. For example, any two of the insulators 1220, 1222, and 1224 may be stacked, or any one of the insulators may be used.

The metal oxide 1406 is preferably formed using a metal oxide functioning as an oxide semiconductor. The metal oxide preferably has an energy gap of 2 eV or more, preferably 2.5 eV or more. With the use of a metal oxide having such a wide energy gap, the off-state current of the transistor can be reduced.

A transistor formed using a metal oxide has an extremely low leakage current in an off state; thus, a semiconductor device with low power consumption can be provided. A metal oxide can be formed by a sputtering method or the like and thus can be used in a transistor included in a highly integrated semiconductor device.

The metal oxide 1406 preferably contains at least indium or zinc. In particular, indium and zinc are preferably contained. In addition, aluminum, gallium, yttrium, tin, or the like is preferably contained. Furthermore, one or more kinds of elements selected from boron, silicon, titanium, iron, nickel, germanium, zirconium, molybdenum, lanthanum, cerium, neodymium, hafnium, tantalum, tungsten, magnesium, or the like may be contained.

Here, a case where the metal oxide 1406 is an In-M-Zn oxide containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

Here, the atomic ratio of the element M to constituent elements in the metal oxide used as the metal oxide 1406a is preferably greater than that in the metal oxide used as the metal oxide 1406b. Moreover, the atomic ratio of the element M to In in the metal oxide used as the metal oxide 1406a is preferably greater than that in the metal oxide used as the oxide 1406b. Furthermore, the atomic ratio of In to the element M in the metal oxide used as the metal oxide 1406b is preferably greater than that in the metal oxide used as the metal oxide 1406a.

By using the above metal oxide as the metal oxide 1406a, it is preferable that the energy of the conduction band minimum of the metal oxide 1406a be higher than the energy of the conduction band minimum of a region of the metal oxide 1406b where the energy of the conduction band minimum is low. In other words, the electron affinity of the metal oxide 1406a is preferably smaller than the electron affinity of the region of the metal oxide 1406b where the energy of the conduction band minimum is low.

Here, the energy level of the conduction band minimum gradually changes in the metal oxides 1406a and 1406b. In other words, the energy level of the conduction band minimum continuously changes or is continuously connected. To obtain such an energy level, the density of defect states in a mixed layer formed at an interface between the metal oxides 1406a and 1406b is preferably made low.

Specifically, when the metal oxides 1406a and 1406b contain the same element (as a main component) in addition to oxygen, a mixed layer with a low density of defect states can be formed. For example, in the case where the metal oxide 1406b is an In—Ga—Zn oxide, it is preferable to use an In—Ga—Zn oxide, a Ga—Zn oxide, gallium oxide, or the like as the metal oxide 1406a.

At this time, a narrow-gap portion formed in the metal oxide 1406b serves as a main carrier path. Since the density of defect states at the interface between the metal oxides 1406a and 1406b can be made low, the influence of interface scattering on carrier conduction is small, and high on-state current can be obtained.

Furthermore, the metal oxide 1406 includes a region 1426a, a region 1426b, and a region 1426c. The region 1426a is sandwiched between the region 1426b and the region 1426c as illustrated in FIG. 30B. The region 1426b and the region 1426c are regions having reduced resistance owing to the formation of the insulator 1225 and thereby have higher conductivity than the region 1426a. An impurity element such as hydrogen or nitrogen included in the atmosphere for forming the insulator 1225 is added to the region 1426b and the region 1426c. Thus, owing to the added impurity element, oxygen vacancies are generated mainly in the regions of the metal oxide 1406b that overlap with the insulator 1225, and furthermore the impurity element enters the oxygen vacancies, which increases the carrier density and decreases the resistance.

Therefore, the region 1426b and the region 1426c preferably have a higher concentration of at least one of hydrogen and nitrogen than the region 1426a. The concentration of hydrogen or nitrogen can be measured by secondary ion mass spectrometry (SIMS) or the like. Here, the concentration of hydrogen or nitrogen in the middle of the region of the metal oxide 1406b that overlaps with the insulator 1412 (e.g., a portion in the metal oxide 1406b which is located equidistant from both side surfaces in the channel length direction of the insulator 1412) is measured as the concentration of hydrogen or nitrogen in the region 1426a.

Note that the resistance of the region 1426b and the region 1426c is reduced by addition of an element that generates oxygen vacancies or an element that is bonded to oxygen vacancies. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon. Thus, the region 1426b and the region 1426c include one or more of the above-described elements.

Furthermore, it is preferable in the metal oxide 1406a that the atomic ratio of In to the element M in the regions 1426b and 1426c be substantially the same as that in the metal oxide 1406b. In other words, in the metal oxide 1406a, the atomic ratio of In to the element M in the region 1426b and the region 1426c is preferably larger than that in the region 1426a. Here, when the indium content in the metal oxide 1406 is increased, the carrier density is increased and the resistance can be decreased. With this structure, even when the thickness of the metal oxide 1406b is small and electric resistance of the metal oxide 1406b is high in the manufacturing process of the transistor 1200, the region 1426b and the region 1426*c* in the metal oxide 1406 can function as a source region and a drain region owing to the sufficiently reduced resistance of the metal oxide 1406*a* in the region 1426*b* and the region 1426*c*.

Figure 31A:
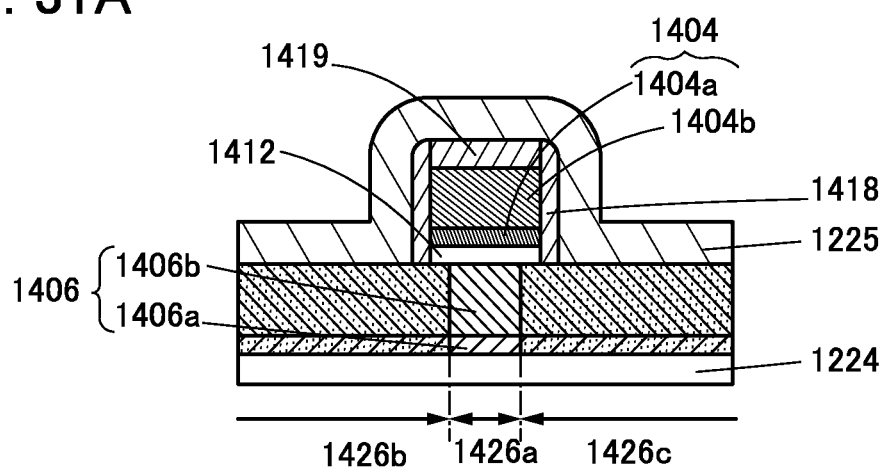
FIGS. 31A and 31B each illustrate a structure example of a transistor.

FIG. 31A is an enlarged view of the region 1426*a* and the vicinity in FIG. 30B. As illustrated in FIG. 31A, the region 1426*b* and the region 1426*c* are formed in at least the regions overlapping with the insulator 1225 in the metal oxide 1406. Here, one of the region 1426*b* and the region 1426*c* in the metal oxide 1406*b* can function as a source region, and the other can function as a drain region. Moreover, the region 1426*a* in the metal oxide 1406*b* can function as a channel formation region.

Although the regions 1426*a*, 1426*b*, and 1426*c* are formed in the metal oxides 1406*b* and 1406*a* in FIG. 30B and FIG. 31A, it is acceptable as long as these regions are formed in the metal oxide 1406*b*. Furthermore, although a boundary between the region 1426*a* and the region 1426*b* and a boundary between the region 1426*a* and the region 1426*c* are illustrated as being substantially perpendicular to the top surface of the metal oxide 1406 in FIG. 30B and the like, this embodiment is not limited to this structure. For example, in some cases, the region 1426*b* and the region 1426*c* project to the conductor 1404 side in the vicinity of the surface of the metal oxide 1406*b* and are recessed to the insulator 1225 side in the vicinity of a bottom surface of the metal oxide 1406*a*.

In the transistor 1200, as illustrated in FIG. 31A, the region 1426*b* and the region 1426*c* are formed in the regions where the metal oxide 1406 is in contact with the insulator 1225 and the regions overlapping with the vicinity of the both end portions of the insulators 1418 and 1412. At this time, portions of the regions 1426*b* and 1426*c* which overlap with the conductor 1404 function as what is called "overlap regions (Lov regions)." Because a high-resistance region is not formed between the channel formation region and the source or drain region of the metal oxide 1406 in the structure including the Lov region, the on-state current and the mobility of the transistor can be increased.

Figure 31B:
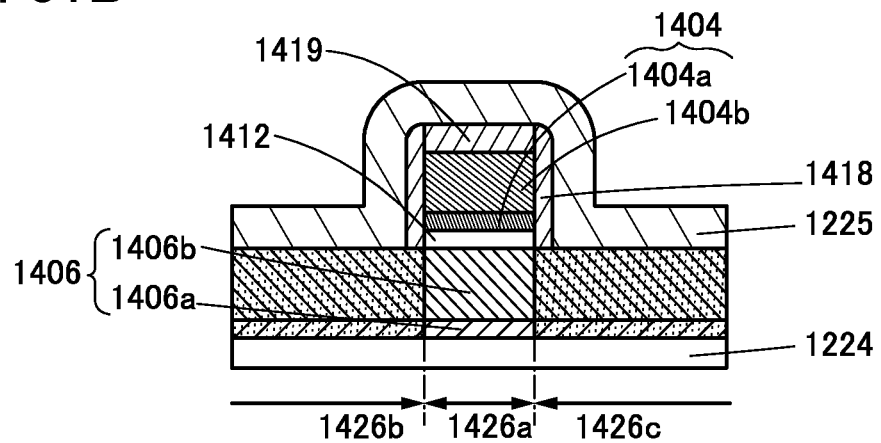

Note that the semiconductor device of this embodiment is not limited to this example. For example, as illustrated in FIG. 31B, the region 1426*b* and the region 1426*c* may be formed in regions where the metal oxide 1406 overlaps with the insulator 1225 and the insulator 1418. The structure illustrated in FIG. 31B can be rephrased as the structure in which the width of the conductor 1404 in the channel length direction is substantially the same as the width of the region 1426*a*. Because a high-resistance region is not formed between the channel formation region and the source and drain regions in the structure illustrated in FIG. 31B, the on-state current of the transistor can be increased. Since the gate does not overlap with the source and drain regions in the channel length direction in the structure illustrated in FIG. 31B, formation of unnecessary capacitance can be suppressed.

Thus, by appropriately selecting the areas of the region 1426*b* and the region 1426*c*, a transistor having electric characteristics necessary for the circuit design can be easily provided.

The insulator 1412 is preferably provided in contact with a top surface of the metal oxide 1406*b*. The insulator 1412 is preferably formed using an insulator from which oxygen is released by heating. When the insulator 1412 formed using the insulator is formed in contact with the top surface of the metal oxide 1406*b*, oxygen can be supplied to the metal oxide 1406*b* effectively. Furthermore, like the insulator 1224, the concentration of impurities such as water or hydrogen in the insulator 1412 is preferably lowered. The thickness of the insulator 1412 is preferably more than or equal to 1 nm and less than or equal to 20 nm, and may be approximately 1 nm, for example.

The insulator 1412 preferably includes oxygen. For example, the amount of released oxygen molecules per unit area of the insulator 1412 is more than or equal to $1 \times 10^{14}$ molecules/cm$^2$, preferably more than or equal to $2 \times 10^{14}$ molecules/cm$^2$, further preferably more than or equal to $4 \times 10^{14}$ molecules/cm$^2$ in thermal desorption spectroscopy (TDS) analysis in the range of a surface temperature from 100° C. to 700° C. or from 100° C. to 500° C.

The insulator 1412, the conductor 1404, and the insulator 1419 each include a region overlapping with the metal oxide 1406*b*. In addition, side surfaces of the insulator 1412, the conductor 1404*a*, the conductor 1404*b*, and the insulator 1419 are preferably aligned with each other.

As the conductor 1404*a*, a conductive oxide is preferably used. For example, the metal oxide that can be used as the metal oxide 1406*a* or the metal oxide 1406*b* can be used. In particular, an In—Ga—Zn-based oxide with an atomic ratio of In:Ga:Zn=4:2:3 to 4.1 or in the neighborhood thereof, which has high conductivity, is preferably used. When the conductor 1404*a* is formed using such a material, oxygen can be prevented from entering the conductor 1404*b*, and an increase in electric resistance value of the conductors 1404*b* due to oxidation can be prevented.

When such a conductive oxide is formed by a sputtering method, oxygen can be added to the insulator 1412, so that oxygen can be supplied to the metal oxide 1406*b*. Thus, oxygen vacancies in the region 1426*a* of the metal oxide 1406 can be reduced.

The conductor 1404*b* can be formed using a metal such as tungsten, for example. As the conductor 1404*b*, a conductor that can add impurities such as nitrogen to the conductor 1404*a* to improve the conductivity of the conductor 1404*a* may be used. For example, titanium nitride or the like is preferably used for the conductor 1404*b*. Furthermore, the conductor 1404*b* may have a structure in which a metal such as tungsten is stacked over a metal nitride such as titanium nitride.

Here, the conductor 1404 functioning as a gate electrode is provided to cover the top surface of the region 1426*a* and its periphery and the side surface, which is in the channel width direction, of the metal oxide 1406*b* with the insulator 1412 interposed therebetween. Thus, the electric field of the conductor 1404 functioning as a gate electrode can electrically surround the top surface of the region 1426*a* and its periphery and the side surface, which is in the channel width direction, of the metal oxide 1406*b*. The structure of the transistor in which the channel formation region is electrically surrounded by the electric field of the conductor 1404 is referred to as a surrounded channel (s-channel) structure. Thus, a channel can be formed in the top surface of the region 1426*a* and its periphery and the side surface, which is in the channel width direction, of the metal oxide 1406*b*; therefore, a large amount of current can flow between the source and the drain, and a current in an on state (on-state current) can be large. Moreover, since the top surface of the region 1426*a* and its periphery and the side surface, which is in the channel width direction, of the metal oxide 1406*b* are surrounded by the electric field of the conductor 1404, a leakage current in an off state (off-state current) can be small.

The insulator 1419 is preferably provided over the conductor 1404*b*. Side surfaces of the insulator 1419, the conductor 1404*a*, the conductor 1404*b*, and the insulator 1412 are preferably aligned with each other. The insulator 1419 is preferably formed by an atomic layer deposition (ALD) method, in which case the thickness of the insulator 1419 can be approximately more than or equal to 1 nm and less than or equal to 20 nm, preferably more than or equal to 5 nm and less than or equal to 510 nm. Here, like the insulator 1418, the insulator 1419 is preferably formed using an insulating material having a function of inhibiting the passage of impurities such as water or hydrogen and oxygen; aluminum oxide, hafnium oxide, or the like is preferably used, for example.

When the insulator 1419 is provided, the insulator 1419 and the insulator 1418 which have a function of inhibiting the passage of impurities such as water or hydrogen and oxygen can cover top and side surfaces of the conductor 1404. This can prevent entry of impurities such as water or hydrogen into the metal oxide 1406 through the conductor 1404. Thus, the insulator 1418 and the insulator 1419 have a function of a gate cap that protects the gate.

The insulator 1418 is provided in contact with the side surfaces of the insulator 1412, the conductor 1404, and the insulator 1419. Furthermore, the top surface of the insulator 1418 is preferably aligned with the top surface of the insulator 1419. The insulator 1418 is preferably formed by an ALD method, in which case the thickness of the insulator 1418 can be approximately more than or equal to 1 nm and less than or equal to 20 nm, preferably more than or equal to 1 nm and less than or equal to 3 nm, and for example 1 nm.

As described above, the region 1426b and the region 1426c of the metal oxide 1406 are formed by the impurity element added in the formation of the insulator 1225.

In the case where the transistor is miniaturized to have a channel length of approximately 10 nm to 30 nm, the impurity element contained in the source region or the drain region might be diffused to bring electrical connection between the source region and the drain region. In this embodiment, however, the insulator 1418 can increase the distance between regions of the metal oxide 1406 that are in contact with the insulator 1225; accordingly, electrical connection between the source region and the drain region can be prevented. Furthermore, by using an ALD method, the insulator 1418 can be formed to have a thickness that is as small as or smaller than the length of the miniaturized channel. Accordingly, an excessive increase of the distance between the source region and the drain region is not caused and thereby an increase in the resistance can be prevented.

Here, the insulator 1418 is preferably formed using an insulating material having a function of inhibiting the passage of impurities such as water or hydrogen and oxygen, and for example, is preferably formed using aluminum oxide or hafnium oxide. Accordingly, diffusion of oxygen from the insulator 1412 to the outside can be inhibited. Furthermore, entry of impurities such as hydrogen or water to the metal oxide 1406 from tan end portion or the like of the insulator 1412 can be prevented.

The insulator 1418 is preferably formed in the following manner: an insulating film is deposited by an ALD method and then subjected to anisotropic etching so as to remain in a portion in contact with the side surfaces of the insulator 1412, the conductor 1404, and the insulator 1419. Thus, an insulator having a small thickness as described above can be easily formed. At this time, even when the insulator 1419 provided over the conductor 1404 is partly removed by the anisotropic etching, portions of the insulator 1418 in contact with the insulator 1412 and the conductor 1404 can be left sufficiently.

The insulator 1225 is provided to cover the insulator 1419, the insulator 1418, the metal oxide 1406, and the insulator 1224. Here, the insulator 1225 is provided in contact with top surfaces of the insulators 1419 and the insulator 1418 and the side surface of the insulator 1418. As described above, impurities such as hydrogen or nitrogen are added from the insulator 1225 to the metal oxide 1406, so that the region 1426b and the region 1426c are formed. Thus, the insulator 1225 preferably includes at least one of hydrogen and nitrogen.

Furthermore, the insulator 1225 is preferably provided in contact with side surfaces of the metal oxides 1406b and 1406a as well as the top surface of the metal oxide 1406b. This enables a resistance reduction to the side surfaces of the metal oxides 1406b and 1406a in the region 1426b and the region 1426c.

Moreover, the insulator 1225 is preferably formed using an insulating material having a function of inhibiting the passage of impurities such as water or hydrogen and oxygen. For example, as the insulator 1225, silicon nitride, silicon nitride oxide, silicon oxynitride, aluminum nitride, aluminum nitride oxide, or the like is preferably used. Such an insulator 1225 can prevent oxygen from passing through the insulator 1225 and being supplied to oxygen vacancies in the region 1426b and the region 1426c, so that a reduction in carrier density can be prevented. Furthermore, impurities such as water or hydrogen can be prevented from passing through the insulator 1225 and excessively enlarging the region 1426b and the region 1426c to the region 1426a side.

The insulator 1280 is preferably provided over the insulator 1225. Furthermore, the concentration of impurities such as water or hydrogen in the insulator 1280 is preferably lowered as in the insulator 1224.

In openings formed in the insulator 1280 and the insulator 1225, a combination of a conductor 1450a and a conductor 1451a and a combination of a conductor 1450b and a conductor 1451b are provided. The combination of the conductor 1450a and the conductor 1451a and the combination of the conductor 1450b and the conductor 1451b are preferably provided with the conductor 1404 sandwiched therebetween.

Here, the conductor 1450a is formed in contact with an inner wall of the opening provided in the insulator 1280 and the insulator 1225, and the conductor 1451a is further provided inside the conductor 1450a. The region 1426b of the metal oxide 1406 is positioned in at least part of a bottom portion of the opening, and the conductor 1450a is in contact with the region 1426b. Similarly, the conductor 1450b is formed in contact with an inner wall of the opening provided in the insulator 1280 and the insulator 1225, and the conductor 1451b is further provided inside the conductor 1450b. The region 1426c of the metal oxide 1406 is positioned in at least part of a bottom portion of the opening, and the conductor 1450b is in contact with the region 1426c.

Figure 32A:
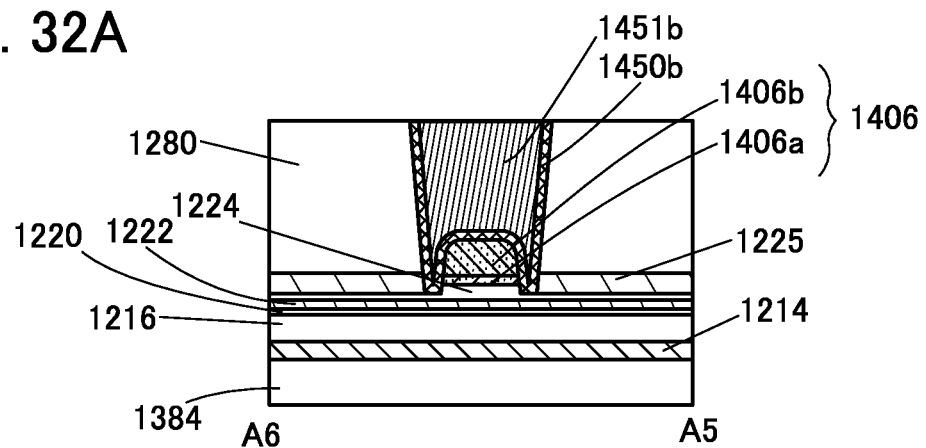
FIGS. 32A and 32B each illustrate a structure example of a transistor.

Here, FIG. 32A is a cross-sectional view of a portion indicated by a dashed-dotted line A5-A6 in FIG. 30A. Note that although the cross-sectional view of only the conductors 1450b and 1451b is illustrated in FIG. 32A, the conductors 1450a and 1451a have a similar structure.

As illustrated in FIG. 30B and FIG. 32A, the conductor 1450b is in contact with at least the top surface of the metal oxide 1406 and is preferably in contact with the side surface of the metal oxide 1406. Specifically, as illustrated in FIG. 32A, the conductor 1450b is preferably in contact with one or both of side surfaces (the side surfaces on the A5 side and the A6 side) of the metal oxide 1406 in the channel width direction. As illustrated in FIG. 30B, the conductor 1450b may be in contact with the side surface on the A2 side in the channel length direction of the metal oxide 1406. Thus, when the structure in which the conductor 1450*b* is in contact with the side surface of the metal oxide 1406 in addition to the top surface of the metal oxide 1406 is employed, the contact area between the conductor 1450*b* and the metal oxide 1406 can be increased without an increase in the area of the top surface of the contact portion, so that the contact resistance between the conductor 1450*b* and the metal oxide 1406 can be reduced. Accordingly, miniaturization of the source electrode and the drain electrode of the transistor can be achieved and, in addition, the on-state current can be increased. Note that the same applies to the conductor 1450*a* and the conductor 1451*a*.

Here, the conductor 1450*a* is in contact with the region 1426*b* functioning as one of a source region and a drain region of the transistor 1200, and the conductor 1450*b* is in contact with the region 1426*c* functioning as the other of the source region and the drain region of the transistor 1200. Therefore, the conductor 1450*a* and the conductor 1451*a* can function as one of a source electrode and a drain electrode, and the conductor 1450*b* and the conductor 1451*b* can function as the other of the source electrode and the drain electrode. Because the region 1426*b* and the region 1426*c* are reduced in resistance, the contact resistance between the conductor 1450*a* and the region 1426*b* and the contact resistance between the conductor 1450*b* and the region 1426*c* are reduced, leading to a large on-state current of the transistor 1200.

Here, the conductor 1450*a* and the conductor 1450*b* are preferably formed using a conductive material having a function of inhibiting the passage of impurities such as water or hydrogen, like the conductor 1310*a* or the like. For example, tantalum, tantalum nitride, titanium, titanium nitride, ruthenium, ruthenium oxide, or the like is preferably used, and a single layer or stacked layers may be used. This can prevent entry of impurities such as hydrogen or water from a layer positioned over the insulator 1280 to the metal oxide 1406 through the conductor 1451*a* and the conductor 1451*b*.

Furthermore, the conductor 1451*a* and the conductor 1451*b* are preferably formed using a conductive material including tungsten, copper, or aluminum as its main component. Although not shown, the conductor 1451*a* and the conductor 1451*b* may have a stacked layer structure, and for example, stacked layers of titanium, titanium nitride, and the above-described conductive material may be formed.

Note that although the conductor 1450*a* and the conductor 1450*b* are in contact with both the metal oxide 1406*a* and the metal oxide 1406*b* in FIG. 30B and FIG. 32A, the structure is not limited to this example. For example, the structure in which the conductor 1450*a* and the conductor 1450*b* are in contact with only the metal oxide 1406*b* may be employed. Furthermore, the heights of the top surfaces of the conductor 1450*a*, the conductor 1451*a*, the conductor 1450*b*, and the conductor 1451*b* can be substantially the same as each other. Furthermore, although the transistor 1200 in which the conductor 1450*a* and the conductor 1451*a* are stacked and the conductor 1450*b* and the conductor 1451*b* are stacked is described, the present invention is not limited to this example. For example, a structure in which only the conductor 1451*a* and the conductor 1451*b* are provided may be employed.

Figure 32B:
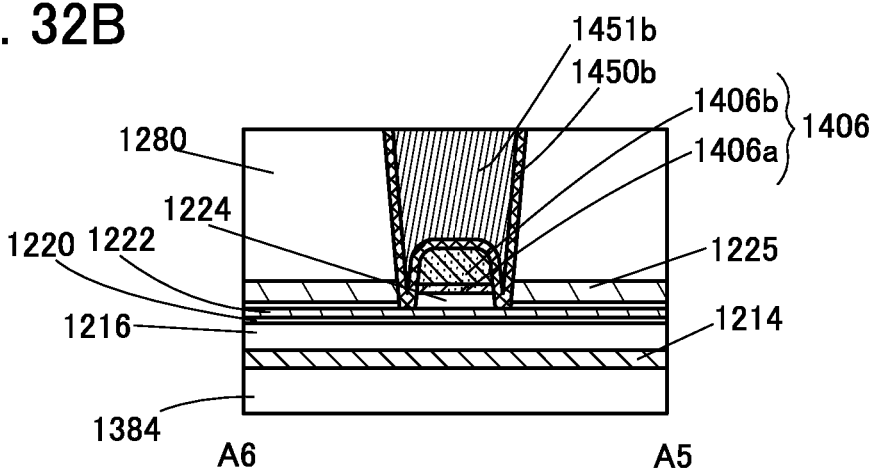

Moreover, although the insulator 1224 serves as the bottom portion of the opening in which the conductor 1450*a* and the conductor 1450*b* are provided in FIG. 32A, this embodiment is not limited to this structure. As illustrated in FIG. 32B, the insulator 1222 may serve as the bottom portion of the opening in which the conductor 1450*a* and the conductor 1450*b* are provided. In the structure illustrated in FIG. 32A, the conductor 1450*b* (the conductor 1450*a*) is in contact with the insulator 1224, the metal oxide 1406*a*, the metal oxide 1406*b*, the insulator 1225, and the insulator 1280. In the structure illustrated in FIG. 32B, the conductor 1450*b* (the conductor 1450*a*) is in contact with the insulator 1222, the insulator 1224, the metal oxide 1406*a*, the metal oxide 1406*b*, the insulator 1225, and the insulator 1280.

<Materials of Components>

Next, components of the transistor 1200 will be described.

[Substrate]

As a substrate over which the transistor 1200 is formed, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped. Alternatively, the substrate may have a property of not returning to its original shape. The substrate includes a region having a thickness of, for example, greater than or equal to 5 µm and less than or equal to 700 µm, preferably greater than or equal to 10 µm and less than or equal to 500 µm, and further preferably greater than or equal to 15 µm and less than or equal to 300 µm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate, which is caused by dropping or the like, can be reduced. That is, a durable semiconductor device can be provided.

For the substrate which is a flexible substrate, metal, an alloy, resin, glass, or fiber thereof can be used, for example.

The flexible substrate preferably has a lower coefficient of linear expansion because deformation due to an environment is suppressed. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

[Insulator]

The insulator can be an oxide, nitride, oxynitride, nitride oxide, metal oxide, metal oxynitride, metal nitride oxide, or the like having an insulating property.

Note that when the transistor is surrounded by an insulator that has a function of inhibiting the passage of oxygen and impurities such as hydrogen, the electrical characteristics of the transistor can be stabilized. For example, an insulator that has a function of inhibiting the passage of oxygen and impurities such as hydrogen is used as the insulator 1222 and the insulator 1214.

The insulator that has a function of inhibiting the passage of oxygen and impurities such as hydrogen can have, for example, a single-layer structure or a layered structure including an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulator 1222 and the insulator 1214 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulator 1222 and the insulator 1214 preferably include aluminum oxide, hafnium oxide, or the like.

The insulator 1384, the insulator 1216, the insulator 1220, the insulator 1224, and the insulator 1412 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 1384, the insulator 1216, the insulator 1220, the insulator 1224, and the insulator 1412 each preferable include silicon oxide, silicon oxynitride, or silicon nitride.

The insulator 1220, the insulator 1222, the insulator 1224, and/or the insulator 1412 preferably include an insulator with a high dielectric constant. For example, the insulator 1220, the insulator 1222, the insulator 1224, and/or the insulator 1412 each preferably include gallium oxide, hafnium oxide, zirconium oxide, oxide containing aluminum and hafnium, oxynitride containing aluminum and hafnium, oxide containing silicon and hafnium, oxynitride containing silicon and hafnium, nitride containing silicon and hafnium, or the like. Alternatively, the insulator 1220, the insulator 1222, the insulator 1224, and/or the insulator 1412 each preferably have a stacked-layer structure of silicon oxide or silicon oxynitride and an insulator with a high dielectric constant. Because silicon oxide and silicon oxynitride have thermal stability, a combination of silicon oxide or silicon oxynitride with an insulator with a high dielectric constant allows the stacked-layer structure to be thermally stable and have a high dielectric constant. For example, when aluminum oxide, gallium oxide, or hafnium oxide is positioned in contact with the metal oxide 1406 in each of the insulator 1224 and the insulator 1412, silicon included in silicon oxide or silicon oxynitride can be prevented from entering the metal oxide 1406. Furthermore, for example, when silicon oxide or silicon oxynitride is in contact with the metal oxide 1406 in each of the insulator 1224 and the insulator 1412, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 1384, the insulator 1216, and the insulator 1280 preferably include an insulator with a low dielectric constant. For example, the insulator 1384, the insulator 1216, and the insulator 1280 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 1384, the insulator 1216, and the insulator 1280 preferably have a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and silicon oxide having pores. When silicon oxide or silicon oxynitride, which is thermally stable, is combined with a resin, the stacked-layer structure can have thermal stability and low relative permittivity. Examples of the resin include polyester, polyolefin, polyamide (e.g., nylon or aramid), polyimide, polycarbonate, and acrylic.

As the insulator 1418 and the insulator 1419, an insulator having a function of suppressing the passage of impurities such as hydrogen and oxygen may be used. As the insulator 1418 and the insulator 1419, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; or silicon nitride may be used, for example.

[Conductor]

The conductor 1404a, the conductor 1404b, the conductor 1310a, the conductor 1310b, the conductor 1450a, the conductor 1450b, the conductor 1451a, and the conductor 1451b can be formed using a material including one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon including an impurity element such as phosphorus, or silicide such as nickel silicide may be used.

As the above-described conductors, especially as the conductor 1404a, the conductor 1310a, the conductor 1450a, and the conductor 1450b, a conductive material including oxygen and a metal element included in a metal oxide that can be used for the metal oxide 1406 may be used. A conductive material including the above-described metal element and nitrogen may be used. For example, a conductive material including nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. By using such a material, hydrogen contained in the metal oxide 1406 can be captured in some cases. Alternatively, hydrogen entering from an external insulator or the like can be captured in some cases.

A stack of a plurality of conductive layers formed using the above materials may be used. For example, a layered structure formed using a combination of a material including any of the metal elements listed above and a conductive material including oxygen may be used. Alternatively, a layered structure formed using a combination of a material including any of the metal elements listed above and a conductive material including nitrogen may be used. Alternatively, a layered structure formed using a combination of a material including any of the metal elements listed above, a conductive material including oxygen, and a conductive material including nitrogen may be used.

When oxide is used for the channel formation region of the transistor, a stacked-layer structure formed using a material containing the above-described metal element and a conductive material including oxygen is preferably used for the gate electrode. In this case, the conductive material including oxygen is preferably formed on the channel formation region side. When the conductive material including oxygen is formed on the channel formation region side, oxygen released from the conductive material is likely to be supplied to the channel formation region.

[Metal Oxide]

The metal oxide 1406 according to the present invention is described below. As the metal oxide 1406, a metal oxide functioning as an oxide semiconductor is preferably used.

The metal oxide 1406 preferably contains at least indium or zinc. In particular, indium and zinc are preferably contained. In addition, aluminum, gallium, yttrium, tin, or the like is preferably contained. Furthermore, one or more kinds of elements selected from boron, silicon, titanium, iron, nickel, germanium, zirconium, molybdenum, lanthanum, cerium, neodymium, hafnium, tantalum, tungsten, magnesium, or the like may be contained.

Here, the case where the metal oxide 1406 contains indium, the element M, and zinc is considered. The terms of the atomic ratio of indium to the element M and zinc contained in the metal oxide 1406 are denoted by [In], [M], and [Zn], respectively.

Preferred ranges of the atomic ratio of indium, the element M, and zinc contained in the metal oxide 1406 are described with reference to FIGS. 33A to 33C. Note that the proportion of oxygen atoms is not shown in FIGS. 33A to 33C. The terms of the atomic ratio of indium, the element M, and zinc contained in the metal oxide 1406 are denoted by [In], [M], and [Zn], respectively.

Figure 33A:
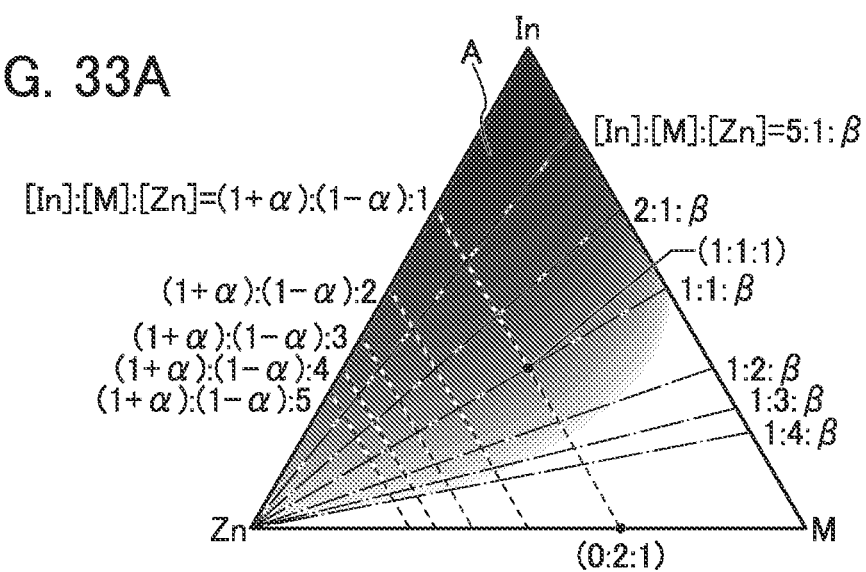
FIGS. 33A to 33C each illustrate an atomic ratio range of a metal oxide.
Figure 33B:
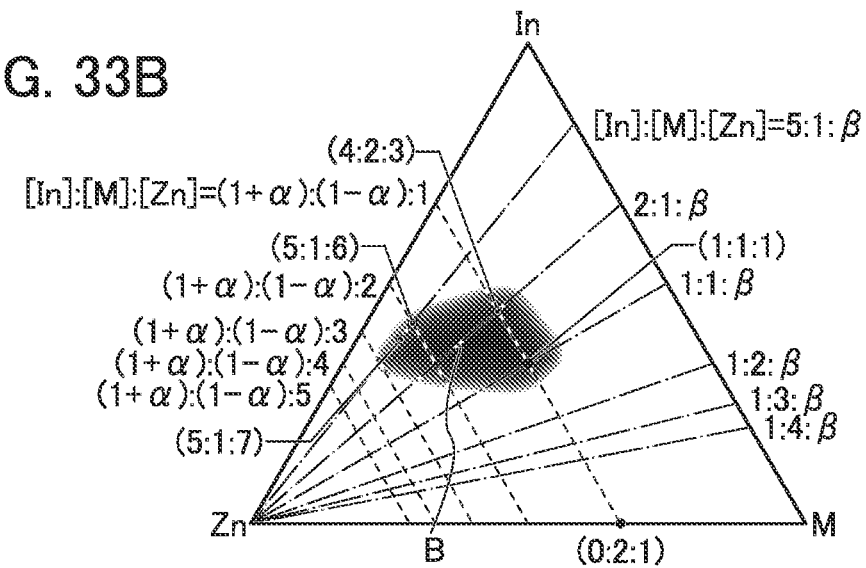
Figure 33C:
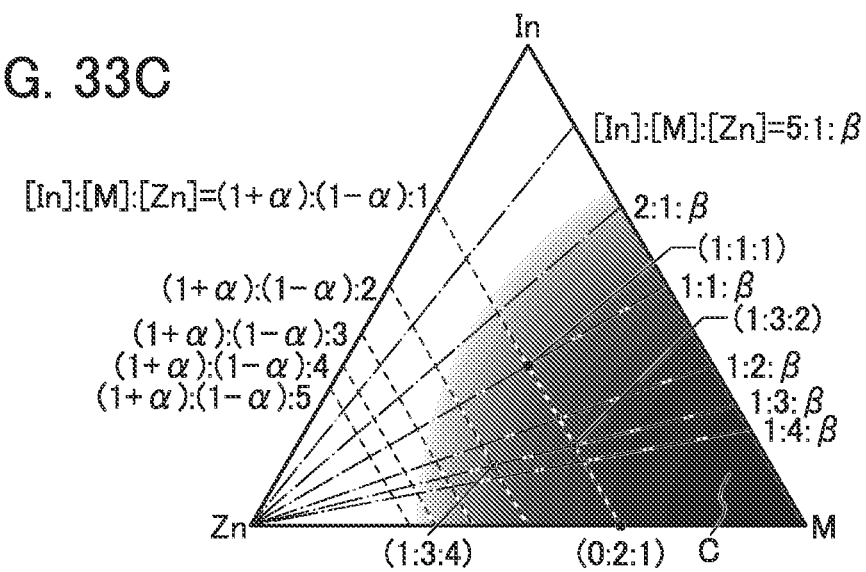

In FIGS. 33A to 33C, broken lines indicate a line where the atomic ratio [In]:[M]:[Zn] is $(1+\alpha):(1-\alpha):1$ $(-1 \le \alpha \le 1)$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Furthermore, dashed-dotted lines indicate a line where the atomic ratio [In]:[M]:[Zn] is $5:1:\beta$ $(\beta \ge 0)$, a line where the atomic ratio [In]:[M]:[Zn] is $2:1:\beta$ a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, a metal oxide with the atomic ratio of [In]:[M]:[Zn]=0:2:1 or a neighborhood thereof in FIGS. 33A to 33C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 33A represents an example of the preferred range of the atomic ratio of indium, the element M, and zinc contained in the metal oxide 1406.

In addition, the metal oxide having a higher content of indium can have higher carrier mobility (electron mobility). Thus, a metal oxide having a high content of indium has higher carrier mobility than a metal oxide having a low content of indium.

In contrast, when the indium content and the zinc content in a metal oxide become lower, carrier mobility becomes lower. Thus, with an atomic ratio of [In]:[M]:[Zn]=0:1:0 and the vicinity thereof (e.g., a region C in FIG. 33C), insulation performance becomes better.

For example, the metal oxide used as the metal oxide 1406b preferably has an atomic ratio represented by the region A in FIG. 33A. The metal oxide with the atomic ratio has high carrier mobility. The atomic ratio of In to Ga and Zn of the metal oxide used as the metal oxide 1406b may be 4:2:3 to 4:2:4.1 or in the neighborhood thereof, for example. In contrast, the metal oxide used as the metal oxide 1406a preferably has an atomic ratio represented by the region C in FIG. 33C. The metal oxide with the atomic ratio has relatively high insulating properties. The atomic ratio of In to Ga and Zn of the metal oxide used as the metal oxide 1406a may be approximately 1:3:4.

A metal oxide having an atomic ratio in the region A, particularly in a region B in FIG. 33B, has high carrier mobility and high reliability and is excellent.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

In the case where the metal oxide 1406 is formed of an In-M-Zn oxide, it is preferable to use a target including a polycrystalline In-M-Zn oxide as the sputtering target. Note that the atomic ratio of the formed metal oxide varies from the above atomic ratios of metal elements of the sputtering targets in a range of ±40%. For example, when a sputtering target with an atomic ratio of In:Ga:Zn=4:2:4.1 is used for forming the metal oxide 1406, the atomic ratio of In to Ga and Zn in the formed metal oxide may be 4:2:3 or in the neighborhood of 4:2:3. When a sputtering target with an atomic ratio of In:Ga:Zn=5:1:7 is used for forming the metal oxide 1406, the atomic ratio of In to Ga and Zn in the formed metal oxide may be 5:1:6 or in the neighborhood of 5:1:6.

Note that the property of a metal oxide is not uniquely determined by an atomic ratio. Even with the same atomic ratio, the property of a metal oxide might be different depending on a formation condition. For example, in the case where the metal oxide 1406 is deposited with a sputtering apparatus, a film having an atomic ratio deviated from the atomic ratio of the target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

Next, described is the composition of a cloud-aligned composite oxide semiconductor (CAC-OS) that can be used in an OS transistor.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, the CAC-OS or the CAC metal oxide can be called a matrix composite or a metal matrix composite.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of oxygen atom arrangement in an a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the metal oxide is used for a transistor will be described.

When the metal oxide is used in a transistor, the transistor can have high field-effect mobility. In addition, the transistor can have high reliability.

Moreover, the carrier density in the region 1426a of the metal oxide 1406b in the transistor is preferably low. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. For example, the region 1426a of the metal oxide 1406b has a carrier density lower than $8 \times 10^{11}/\text{cm}^3$, preferably lower than $1 \times 10^{11}/\text{cm}^3$, further preferably lower than $1 \times 10^{10}/\text{cm}^3$ and higher than or equal to $1 \times 10^{-9}/\text{cm}^3$.

The highly purified intrinsic or substantially highly purified intrinsic metal oxide has a low density of defect states and accordingly has a low density of trap states in some cases.

Charge trapped by the trap states in the metal oxide takes a long time to be released and may behave like fixed charge. Thus, the transistor whose channel region is formed in the oxide semiconductor having a high density of trap states has unstable electrical characteristics in some cases.

In order to obtain stable electrical characteristics of the transistor, it is effective to reduce the concentration of impurities in the region 1426a of the metal oxide 1406b. In addition, in order to reduce the concentration of impurities in the region 1426a of the metal oxide 1406b, the concentration of impurities in a film that is adjacent to the region 1426a is preferably reduced. As examples of the impurities, hydrogen, nitrogen, alkali metal, alkaline earth metal, iron, nickel, silicon, and the like are given.

[Impurity]

Here, the influence of impurities in the metal oxide is described.

When silicon or carbon that is one of Group 14 elements is contained in the metal oxide, defect states are formed. Thus, the concentration of silicon or carbon (the concentration is measured by SIMS) in the region 1426a of the metal oxide 1406b is set to be lower than or equal to $2 \times 10^{18}$ atoms/cm$^3$, preferably lower than or equal to $2 \times 10^{17}$ atoms/cm$^3$.

When the metal oxide contains an alkali metal or an alkaline earth metal, defect states are formed and carriers are generated, in some cases. Thus, a transistor including a metal oxide that contains an alkali metal or an alkaline earth metal is likely to be normally-on. Therefore, it is preferable to reduce the concentration of an alkali metal or an alkaline earth metal in the region 1426a of the metal oxide 1406b. Specifically, the concentration of alkali metal or alkaline earth metal in the region 1426a of the metal oxide 1406b, which is measured by SIMS, is lower than or equal to $1 \times 10^{18}$ atoms/cm$^3$, preferably lower than or equal to $2 \times 10^{16}$ atoms/cm$^3$.

When the metal oxide contains nitrogen, the metal oxide easily becomes n-type by generation of electrons serving as carriers and an increase of carrier density. Thus, the transistor including nitrogen in the region 1426a of the metal oxide 1406b tends to have normally-on characteristics. For this reason, nitrogen in the region 1426a of the metal oxide 1406b is preferably reduced as much as possible; for example, the concentration of nitrogen in the region 1426a of the metal oxide 1406b measured by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in a metal oxide reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, the transistor including much hydrogen in the region 1426a of the metal oxide 1406b tends to have normally-on characteristics. For this reason, hydrogen in the region 1426a of the metal oxide 1406b is preferably reduced as much as possible. Specifically, the hydrogen concentration of the metal oxide measured by SIMS is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

By reducing impurities in the region 1426a of the metal oxide 1406b to an enough level, the transistor can have stable electrical characteristics.

Structure Example 2 of Transistor

Next, the details of the transistor 1201 illustrated in FIG. 29 will be described.

Figure 34A:
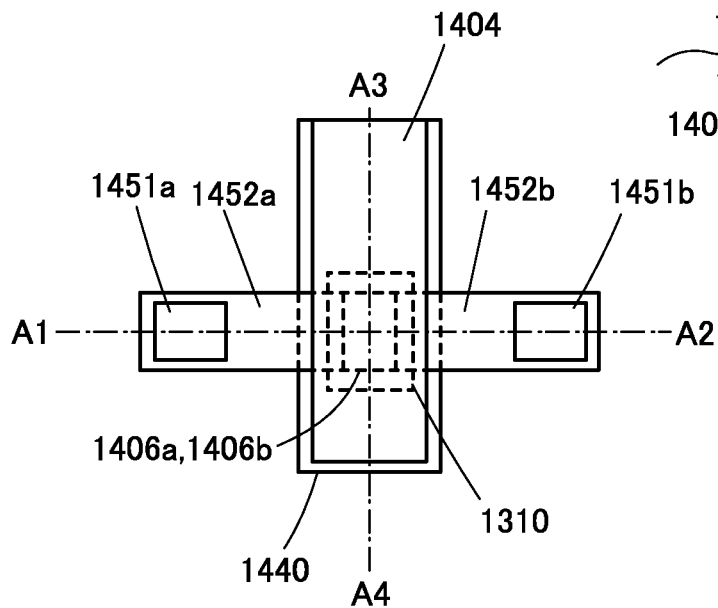
FIGS. 34A to 34C illustrate a structure example of a transistor.
Figure 34C:
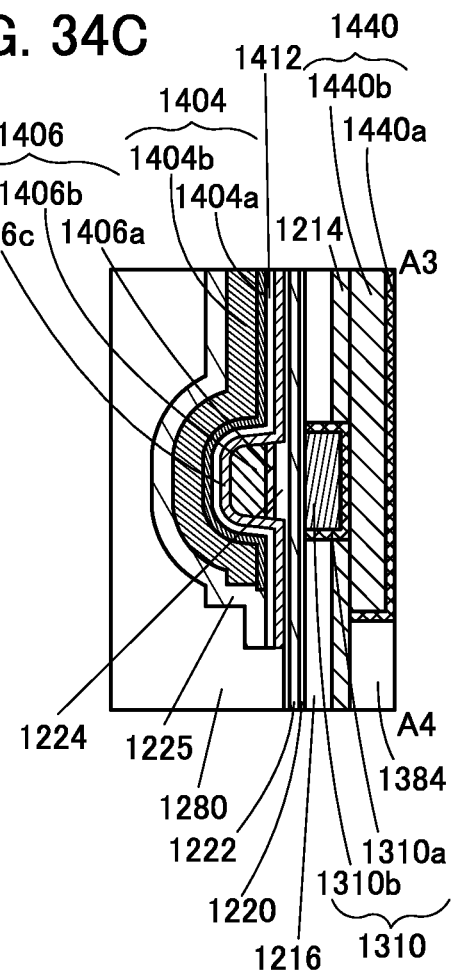
Figure 34B:
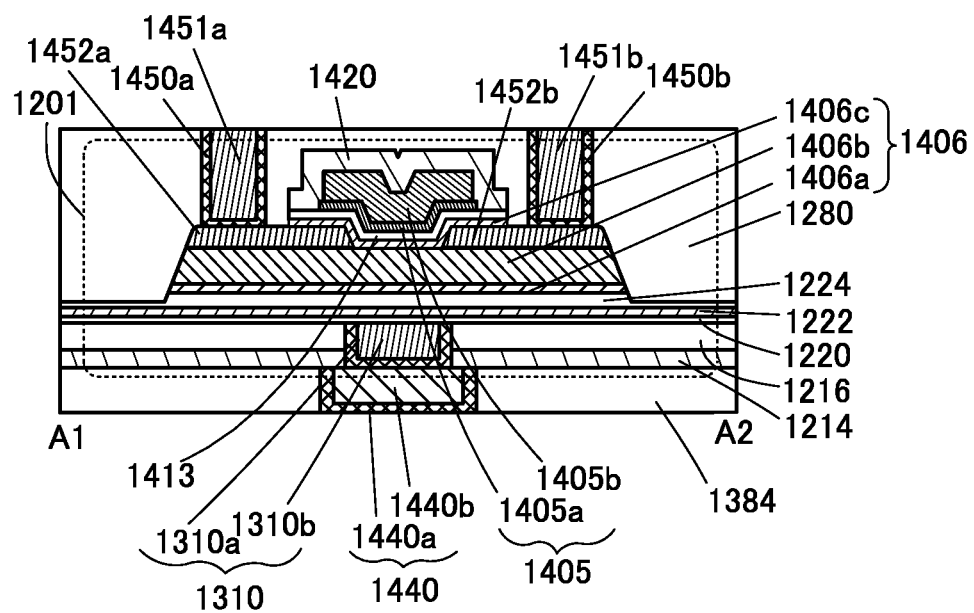

FIG. 34A is a plan view of a semiconductor device including the transistor 1201. FIG. 34B is a cross-sectional view of a portion indicated by a dashed-dotted line A1-A2 in FIG. 34A, illustrating a cross section of the transistor 1201 in a channel length direction. FIG. 34C is a cross-sectional view of a portion indicated by a dashed-dotted line A3-A4 in FIG. 34A, illustrating a cross section of the transistor 1201 in a channel width direction. In the top view of FIG. 34A, some components are not illustrated for simplification of the drawing. The components common to the transistors 1201 and 1200 are denoted by the same reference numerals.

As illustrated in FIGS. 34A to 34C, the transistor 1201 includes the insulator 1224 over a substrate (not illustrated), the metal oxide 1406a over the insulator 1224, the metal oxide 1406b in contact with at least part of a top surface of the metal oxide 1406a, a conductor 1452a and a conductor 1452b in contact with at least part of a top surface of the metal oxide 1406b, a metal oxide 1406c in contact with at least part of a top surface of the metal oxide 1406b and over the conductor 1452a and the conductor 1452b, an insulator 1413 over the metal oxide 1406c, a conductor 1405a over the insulator 1413, a conductor 1405b over the conductor 1405a, and an insulator 1420 over the conductor 1405b.

A conductor 1405 (the conductor 1405a and the conductor 1405b) can function as a top gate, and the conductor 1310 can function as a back gate. The potential of the back gate can be the same as the potential of the top gate, the ground potential, or an arbitrary potential. By changing the potential of the back gate independently of the potential of the top gate, the threshold voltage of the transistor can be changed.

The conductor 1405a can be formed using a material that can be used for the conductor 1404a illustrated in FIGS. 30A to 30C. The conductor 1405b can be formed using a material that can be used for the conductor 1404b illustrated in FIGS. 30A to 30C.

The conductor 1452a serves as one of a source electrode and a drain electrode, and the conductor 1452b serves as the other of the source electrode and the drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 1452a and 1452b. Although a single-layer structure is illustrated in the drawings, a stacked-layer structure of two or more layers may be used. Further, a transparent conductive material containing indium oxide, tin oxide, or zinc oxide may be used.

In the transistor 1201, a channel is preferably formed in the metal oxide 1406b. Therefore, the metal oxide 1406c is preferably formed using a material having a higher insulating property than the metal oxide 1406b. The metal oxide 1406c can be formed using a material that is similar to the material used for the metal oxide 1406a.

Providing the metal oxide 1406c enables the transistor 1201 to be a buried-channel transistor. Moreover, oxidation of end portions of the conductors 1452a and 1452b can be prevented. Furthermore, a leakage current between the conductor 1405 and the conductor 1452a (or between the conductor 1405 and the conductor 1452b) can be prevented. Note that the metal oxide 1406c may be omitted depending on the case.

The insulator 1420 is preferably formed using an insulating material having a function of inhibiting the passage of impurities such as water or hydrogen and oxygen. For example, the insulator 1420 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride.

Provision of the insulator 1420 in the transistor 1201 can prevent oxidation of the conductor 1405. Furthermore, impurities such as water or hydrogen can be prevented from entering the metal oxide 1406.

The transistor 1201 can have a larger contact area between the metal oxide 1406b and the electrode (the source electrode or the drain electrode) than the transistor 1200. Furthermore, a step for forming the region 1426b and the region 1426c illustrated in FIGS. 30A to 30C is not necessary. Thus, the transistor 1201 can have a larger on-state current than the transistor 1200. In addition, the manufacturing process can be simplified.

For the details of the other components of the transistor 1201, the description of the transistor 1200 can be referred to.

This embodiment can be combined with any of the other embodiments as appropriate.

Embodiment 9

In this embodiment, electronic devices in which the semiconductor device, the display device, the display system, or the display module according to one embodiment of the present invention can be used will be described.

The display device of one embodiment of the present invention can achieve high visibility regardless of the intensity of external light. Therefore, the display device of one embodiment of the present invention can be favorably used in portable electronic devices, wearable electronic devices (wearable devices), e-book readers, and the like. FIGS. 35A to 35D illustrate examples of an electronic device including the display device of one embodiment of the present invention.

Figure 35A:
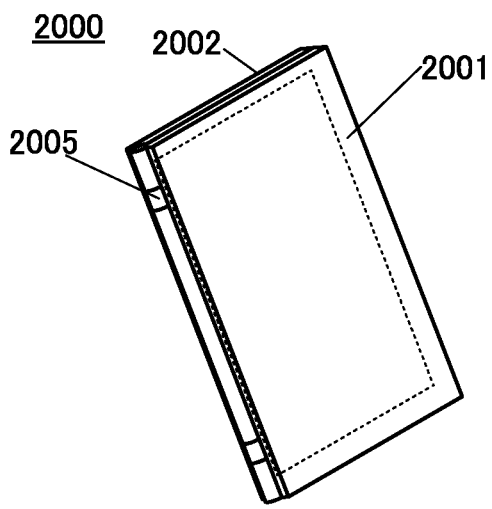
FIGS. 35A to 35D illustrate structure examples of an electronic device.
Figure 35B:
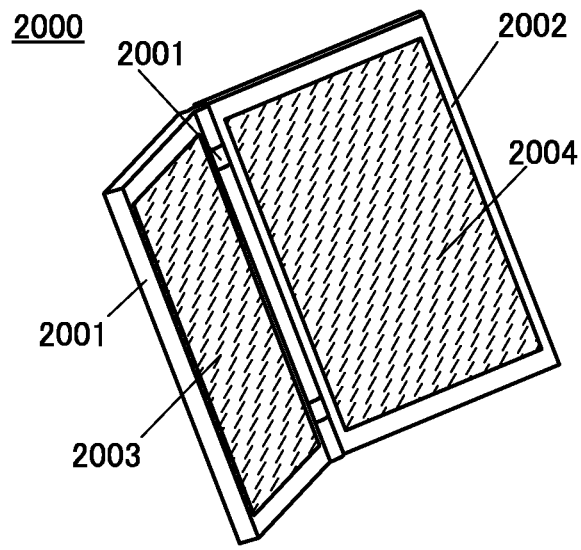

FIGS. 35A and 35B illustrate an example of a portable information terminal 2000. The portable information terminal 2000 includes a housing 2001, a housing 2002, a display portion 2003, a display portion 2004, a hinge portion 2005, and the like.

The housing 2001 and the housing 2002 are connected with the hinge portion 2005. The portable information terminal 2000 folded as in FIG. 35A can be changed into the state illustrated in FIG. 35B, in which the housing 2001 and the housing 2002 are opened.

For example, the portable information terminal 2000 can also be used as an e-book reader, in which the display portion 2003 and the display portion 2004 can each display text data. In addition, the display portion 2003 and the display portion 2004 can each display a still image or a moving image. Furthermore, the display portion 2003 may be provided with a touch panel.

In this manner, the portable information terminal 2000 has high versatility because it can be folded when carried.

Note that the housing 2001 and the housing 2002 may include a power switch, an operation button, an external connection port, a speaker, a microphone, and/or the like.

Note that the portable information terminal 2000 may have a function of identifying a character, a figure, or an image using a touch sensor provided in the display portion 2003. In that case, learning in the following mode becomes possible, for example: an answer is written with a finger, a stylus pen, or the like on an information terminal that displays a workbook or the like for studying mathematics or for learning language, and then, the portable information terminal 2000 determines whether the answer is correct or not. The portable information terminal 2000 may have a function of performing speech interpretation. In that case, for example, the portable information terminal 2000 can be used in learning a foreign language. Such a portable information terminal is suitable for use as a teaching material such as a textbook, a notebook, or the like.

Note that the touch information obtained by the touch sensor provided in the display portion 2003 can be used for prediction of the necessity of power supply by the semiconductor device of one embodiment of the present invention.

Figure 35C:
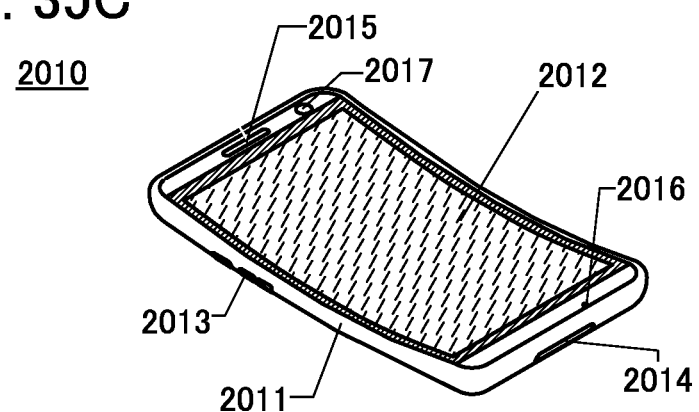

FIG. 35C illustrates an example of a portable information terminal. A portable information terminal 2010 illustrated in FIG. 35C includes a housing 2011, a display portion 2012, an operation button 2013, an external connection port 2014, a speaker 2015, a microphone 2016, a camera 2017, and the like.

The portable information terminal 2010 includes a touch sensor in the display portion 2012. Operations such as making a call and inputting a letter can be performed by touch on the display portion 2012 with a finger, a stylus, or the like.

With the operation button 2013, power on or off can be switched. In addition, types of images displayed on the display portion 2012 can be switched; for example, switching images from a mail creation screen to a main menu screen is performed.

When a sensing device such as a gyroscope sensor or an acceleration sensor is provided inside the portable information terminal 2010, the direction of display on the screen of the display portion 2012 can be automatically changed by determining the orientation of the portable information terminal 2010 (whether the portable information terminal 2010 is placed horizontally or vertically). Furthermore, the direction of display on the screen can be changed by touch on the display portion 2012, operation with the operation button 2013, sound input using the microphone 2016, or the like.

The portable information terminal 2010 functions as, for example, one or more of a telephone set, a notebook, and an information browsing system. For example, the portable information terminal 2010 can be used as a smartphone. The portable information terminal 2010 is capable of executing a variety of applications such as mobile phone calls, e-mailing, viewing and editing texts, reproducing music, reproducing a moving image, Internet communication, and computer games, for example.

Figure 35D:
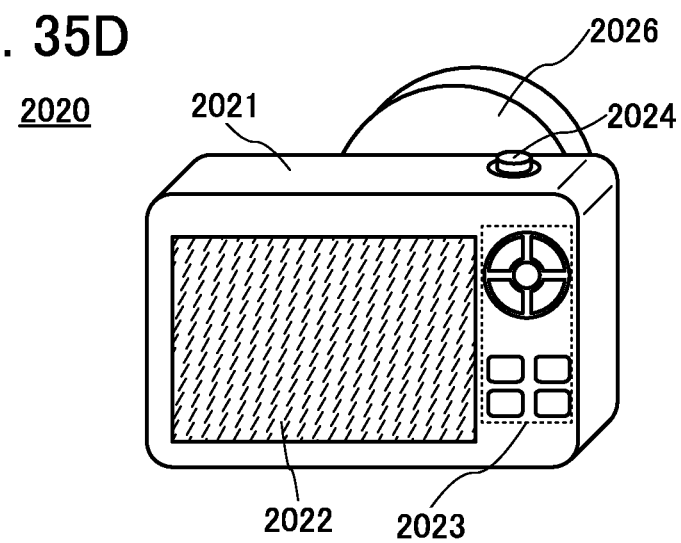

FIG. 35D illustrates an example of a camera. A camera 2020 includes a housing 2021, a display portion 2022, operation buttons 2023, a shutter button 2024, and the like. Furthermore, a detachable lens 2026 is attached to the camera 2020.

Although the lens 2026 of the camera 2020 here is detachable from the housing 2021 for replacement, the lens 2026 may be included in the housing.

Still and moving images can be taken with the camera 2020 at the press of the shutter button 2024. In addition, images can be taken at the touch of the display portion 2022 which serves as a touch panel.

Note that a stroboscope, a viewfinder, and the like can be additionally attached to the camera 2020. Alternatively, these components may be included in the housing 2021.

Note that the electronic devices illustrated in FIGS. 35A to 35D can incorporate a processor corresponding to the host 770 illustrated in FIG. 19.

This embodiment can be combined with any of the other embodiments as appropriate.

Example

In this example, examined characteristics of a configuration memory including an OS transistor will be described. Here, the radiation tolerance of a memory circuit including an OS transistor was evaluated with radiation irradiation.

<Measurement of Memory Circuit Including OS Transistor>

Figure 36A:
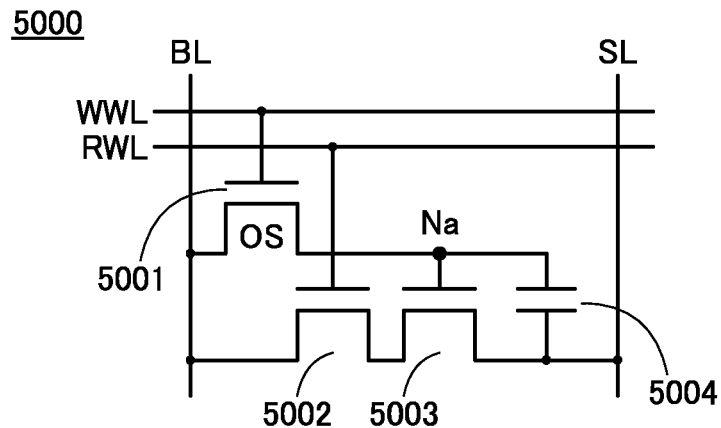
FIGS. 36A to 36C illustrate circuit structures.
Figure 36B:
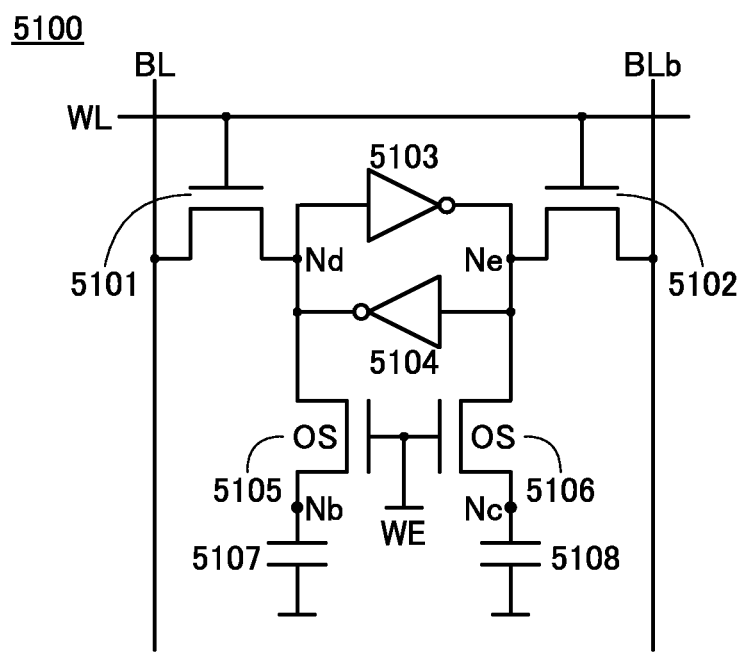
Figure 36C:
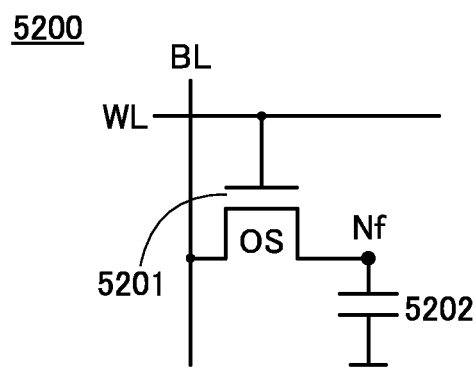

A memory circuit A including a circuit 5000 illustrated in FIG. 36A, a memory circuit B including a circuit 5100 illustrated in FIG. 36B, and a memory circuit C including a circuit 5200 illustrated in FIG. 36C were used for the measurement.

The circuit 5000 illustrated in FIG. 36A includes transistors 5001, 5002, and 5003 and a capacitor 5004. The circuit 5000 has a structure similar to that of the circuit 390 illustrated in FIG. 18C. Note that a node Na corresponds to a node where configuration data is held.

The circuit 5100 illustrated in FIG. 36B includes transistors 5101 and 5102, inverters 5103 and 5104, transistors 5105 and 5106, and capacitors 5107 and 5108. A volatile SRAM cell is formed by the transistors 5101 and 5102 and the inverters 5103 and 5104. Note that a node Nd and a node Ne correspond to nodes where configuration data is held.

The transistors 5105 and 5106 are OS transistors. The node Nd is connected to a node Nb through the transistor 5105. The node Ne is connected to a node Nc through the transistor 5106. Thus, the data retained in the SRAM cell can be stored in the node Nb and the node Nc. Furthermore, the stored data can be restored in the SRAM cell.

The transistors 5105 and 5106 are OS transistors and have an extremely low off-state current. Therefore, when the transistors 5105 and 5106 are in the off state, the potential of the node Nb and the potential of the node Nc can be retained for a long time. Therefore, by storing the data held in the nodes Nd and Ne into the nodes Nb and Nc immediately before power supply to the circuit 5100 is stopped, the data stored in the circuit 5100 can be retained even when the power supply to the circuit 5100 is stopped. After the power supply to the circuit 5100 is restarted, the data retained in the nodes Nb and Nc can be restored in the nodes Nd and Ne.

The circuit 5200 illustrated in FIG. 36C includes a transistor 5201 and a capacitor 5202. The circuit 5200 has a structure similar to that of the circuit 390 illustrated in FIG. 17B. Note that a node Nf corresponds to a node where configuration data is held.

Note that Si transistors using an SOI substrate were used as the transistors 5002 and 5003 illustrated in FIG. 36A and the transistors 5101 and 5102 illustrated in FIG. 36B.

The radiation tolerance was evaluated by measuring whether data stored in the memory circuits A to C varied by radiation. The measurement was performed in a radiating facility belonging to Research Center for Nuclear Physics, Osaka University. As the radiation, white neutrons with a neutron flux of $6.05 \times 10^5$ n/cm$^2$/s were used. The white neutrons were generated by irradiating a target with a proton beam with an energy of 400 MeV at a maximum beam current of 1.1 µA to cause a nuclear spallation reaction. Note that 65-nm-thick tungsten was used as the target. The memory circuits A to C were each irradiated with the radiation for 70 minutes, and then the number of bits (corresponding to the number of the circuits 5000, 5100, or 5200) where the retained data varied by the radiation was counted as the number of soft errors.

Two kinds of samples (samples 1 and 2) having different numbers of bits, different technology nodes, and different sizes of the memory circuits were prepared for each of the memory circuits A and B, and the measurement was performed. The sample 1 of the memory circuit B was measured in the state where data is held in the nodes Nd and Ne in FIG. 36B. The sample 2 of the memory circuit B was measured in the state where data is held in the nodes Nd and Ne and in the state where data is held in the nodes Nb and Nc in FIG. 36B.

The measurement results of the number of soft errors are shown in Table 1. Table 1 lists the number of bits (corresponding to the number of the circuits 5000, 5100, or 5200), the technology nodes of the OS and Si transistors, and the size of the memory circuit.

TABLE 1

| | Memory circuit | | | | |
|---|---|---|---|---|---|
| | A | | B | | C |
| | Sample | | | | |
| | 1 | 2 | 1 | 2 | — |
| Number of bits | 8192 | 2048 | 8192 | 4096 | 8192 |
| Technology node (OS transistor) | 0.8 µm | 0.18 µm | 0.8 µm | 60 nm | 0.8 µm |
| Technology node (Si transistor) | 0.5 µm | 0.18 µm | 0.5 µm | 0.18 µm | 0.5 µm |
| Size [µm$^2$/bit] | 29.24 | 33.02 | 176.64 | 98.6 | 41.72 |
| Number of soft errors | 0 | 0 | 0 (nodes Nd, Ne) | 0 (nodes Nd, Ne) 0 (nodes Nb, Nc) | 0 |

TABLE 1-continued

| | Memory circuit | | | | |
|---|---|---|---|---|---|
| | A | | B | | C |
| | Sample | | | | |
| | 1 | 2 | 1 | 2 | — |
| Soft error rate (SER) [FIT/Mbit] | 0 | 0 | 0 | 0 | 0 |

As shown in Table 1, soft errors were not caused in any of the memory circuits A to C. This indicates that the memory circuits formed using the circuits illustrated in FIGS. 36A to 36C have high radiation tolerance. Therefore, a highly reliable PLD can be obtained by using any of the circuits illustrated in FIGS. 36A to 36C in a configuration memory.

Comparative Example

Three kinds of memory circuits a to c which use commercially available SRAMs (using Si transistors) were also measured in a manner similar to the above. Note that the time of the exposure to radiation was set to five minutes. For the measurement, three kinds of samples were prepared for the memory circuit a, and four kinds of samples were prepared for the memory circuit b. The measurement results are shown in Table 2.

TABLE 2

| | Memory circuit | | | | | | | |
|---|---|---|---|---|---|---|---|---|
| | a | | | b | | | | c |
| | Sample | | | | | | | |
| | 1 | 2 | 3 | 1 | 2 | 3 | 4 | — |
| Number of bits | 4096k | 4096k | 4096k | 1024k | 4096k | 4096k | 16384k | 16384k |
| Technology node (Si transistor) | 0.18 µm | 0.15 µm | 0.11 µm | 0.25 µm | 0.13 µm | 90 nm | 65 nm | 65 nm |
| Size [µm²/bit] | 6.37 | 1.54 | 1.21 | 8.49 | 2.56 | 1.37 | 0.99 | 1.22 |
| Number of soft errors | 37 | 0 | 0 | 5 | 89 | 490 | 2 | 236 |
| Soft error rate (SER) [FIT/Mbit] | 602 | 0 | 0 | 326 | 1449 | 7975 | 8 | 960 |

The sample 2 and the sample 3 of the memory circuit a are memory circuits having structures with high radiation tolerance. The sample 4 of the memory circuit b is a memory circuit using an error correction code (ECC). Table 2 suggests the occurrence of soft errors in every memory circuit that does not have a structure with high radiation tolerance.

Figure 37:
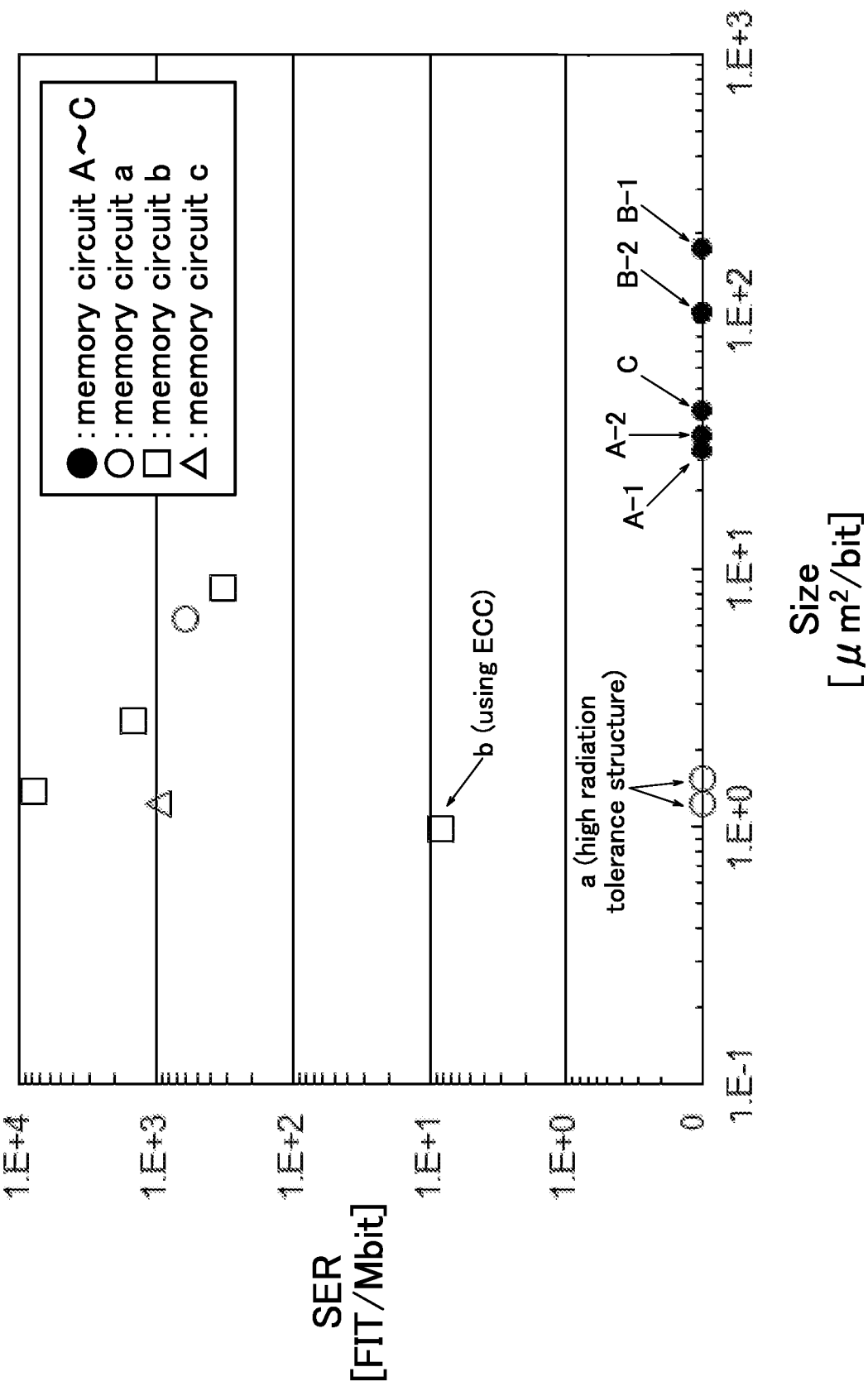
FIG. 37 shows a relationship between the circuit size and the soft error rate.

The relationship between the size [µm²/bit] of each memory circuit shown in Tables 1 and 2 and the soft error rate is illustrated in FIG. 37. FIG. 37 reveals that the memory circuits A, B, and C tend to have a lower soft error rate with respect to the size than the commercially available SRAMs, although the difference in technology node needs to be kept in mind. Even when a commercially available SRAM is used, the soft error rate can be decreased by using an ECC or employing a high radiation tolerance structure. However, without such a countermeasure, the memory circuits A, B, and C tend to have low soft error rates.

The above-described results have proved that a memory circuit including an OS transistor tends to have high radiation tolerance. Therefore, a highly reliable PLD can be obtained by using an OS transistor in a configuration memory.

This application is based on Japanese Patent Application Serial No. 2016-185876 filed with Japan Patent Office on Sep. 23, 2016 and Japanese Patent Application Serial No. 2016-223708 filed with Japan Patent Office on Nov. 17, 2016, the entire contents of which are hereby incorporated by reference.

What is claimed is:

1. A semiconductor device comprising:
    a programmable logic device comprising a programmable logic element and a plurality of contexts;
    a control circuit; and
    a detection circuit,
    wherein the control circuit is configured to control selection of the plurality of contexts,
    wherein the detection circuit is configured to output a signal corresponding to an amount of radiation, and
    wherein the control circuit is configured to switch to a mode in which the programmable logic device performs processing using a majority signal of a plurality of signals output from the logic element multiplexed by the plurality of contexts in accordance with the signal corresponding to the amount of radiation.

2. The semiconductor device according to claim 1, wherein each of the plurality of contexts forms the same circuit.

3. The semiconductor device according to claim 1,
    wherein the detection circuit comprises a memory device and an inspection circuit,
    wherein the memory device comprises a memory cell, and
    wherein the inspection circuit is configured to generate the signal corresponding to the amount of radiation in accordance with whether there is a variation in data stored in the memory device.

4. The semiconductor device according to claim 3,
    wherein the logic element comprises a memory circuit,
    wherein the memory circuit and the memory cell each comprise a transistor and a capacitor, wherein one of a source and a drain of the transistor is electrically connected to the capacitor, and
wherein the transistor comprises a metal oxide in a channel formation region.

5. The semiconductor device according to claim 1,
wherein the detection circuit comprises a memory device and an inspection circuit,
wherein the memory device comprises a memory cell configured to store multi-level data, and
wherein the inspection circuit is configured to generate the signal corresponding to the amount of radiation in accordance with whether there is a variation in the multi-level data stored in the memory cell.

6. A semiconductor device comprising:
a programmable logic device comprising a programmable logic element and a plurality of contexts;
a control circuit; and
a detection circuit,
wherein the control circuit is configured to control selection of the plurality of contexts,
wherein the detection circuit comprises a memory device,
wherein the memory device comprises memory cells,
wherein the detection circuit is configured to output a signal corresponding to a first number of memory cells in which stored data has varied, and
wherein the control circuit is configured to switch to a mode in which the programmable logic device performs processing using a majority signal of a plurality of signals output from the logic element multiplexed by the plurality of contexts in accordance with the signal.

7. The semiconductor device according to claim 6,
wherein each of the plurality of contexts forms the same circuit.

8. The semiconductor device according to claim 6,
wherein the memory cell is configured to store multi-level data.

9. The semiconductor device according to claim 6,
wherein the logic element comprises a memory circuit,
wherein the memory circuit and the memory cell each comprise a transistor and a capacitor,
wherein one of a source and a drain of the transistor is electrically connected to the capacitor, and
wherein the transistor comprises a metal oxide in a channel formation region.

10. A semiconductor device comprising:
a programmable logic device comprising a programmable logic element and a plurality of contexts;
a detection circuit; and
a control circuit configured to switch to a mode in which the programmable logic device performs processing using a majority signal of a plurality of signals output from the logic element multiplexed by the plurality of contexts in accordance with radiation,
wherein the detection circuit comprises a memory device and an inspection circuit, and
wherein the inspection circuit is configured to output a signal corresponding to an amount of radiation in accordance with whether there is a variation in data stored in the memory device.

* * * * *